United States Patent
Kishi

(10) Patent No.: US 9,711,092 B2
(45) Date of Patent: Jul. 18, 2017

(54) DISPLAY DEVICE AND METHOD FOR DRIVING SAME

(71) Applicant: Sharp Kabushiki Kaisha, Osaka-shi, Osaka (JP)

(72) Inventor: Noritaka Kishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 14/764,206

(22) PCT Filed: Mar. 5, 2014

(86) PCT No.: PCT/JP2014/055550
§ 371 (c)(1),
(2) Date: Jul. 29, 2015

(87) PCT Pub. No.: WO2014/141958
PCT Pub. Date: Sep. 18, 2014

(65) Prior Publication Data
US 2015/0379940 A1    Dec. 31, 2015

(30) Foreign Application Priority Data

Mar. 14, 2013    (JP) .................................. 2013-051293

(51) Int. Cl.
*G09G 3/32* (2016.01)
*G09G 3/34* (2006.01)
(Continued)

(52) U.S. Cl.
CPC ......... *G09G 3/3406* (2013.01); *G09G 3/3225* (2013.01); *G09G 3/3291* (2013.01);
(Continued)

(58) Field of Classification Search
CPC ....... G09G 2320/043; G09G 2320/045; G09G 2300/043
See application file for complete search history.

(56) References Cited

U.S. PATENT DOCUMENTS

2001/0024186 A1* 9/2001 Kane .................... G09G 3/3233
345/98
2004/0113873 A1    6/2004 Shirasaki et al.
(Continued)

FOREIGN PATENT DOCUMENTS

JP    2003195810 A    7/2003
JP    2005031630 A    2/2005
(Continued)

OTHER PUBLICATIONS

International Search Report PCT/ISA/210 for International Application No. PCT/JP2014/055550 dated Jun. 3, 2014.
(Continued)

*Primary Examiner* — Benjamin C Lee
*Assistant Examiner* — Dong Hui Liang
(74) *Attorney, Agent, or Firm* — Harness, Dickey & Pierce, P.L.C.

(57) ABSTRACT

Provided is a driving method whereby it is possible to simultaneously compensate for both degradation of a drive transistor and degradation of a light-emitting element without causing special light emission at the time of detecting characteristics in a display device. In a display device which includes a pixel circuit including an electro-optic element and a drive transistor, a driving method includes: a first characteristic detection step for detecting a characteristic of the drive transistor; a second characteristic detection step for detecting a characteristic of the electro-optic element; a correction data storage step for storing characteristic data obtained based on detection results in the first and second characteristic detection steps as correction data; and a video signal correction step for correcting the video signal based on the correction data. The second characteristic detection step is performed in a light emission period.

26 Claims, 41 Drawing Sheets

(51) Int. Cl.
*G09G 3/3225* (2016.01)
*G09G 3/3291* (2016.01)
*H01L 27/32* (2006.01)

(52) U.S. Cl.
CPC ............... *G09G 2300/043* (2013.01); *G09G 2300/0861* (2013.01); *G09G 2320/0276* (2013.01); *G09G 2320/041* (2013.01); *G09G 2320/045* (2013.01); *H01L 27/3241* (2013.01)

(56) References Cited

U.S. PATENT DOCUMENTS

| | | |
|---|---|---|
| 2005/0017934 A1 | 1/2005 | Chung et al. |
| 2006/0158402 A1 | 7/2006 | Nathan et al. |
| 2007/0200804 A1 | 8/2007 | Kwon |
| 2007/0290958 A1* | 12/2007 | Cok ............... G09G 3/3225 345/77 |
| 2008/0062070 A1* | 3/2008 | De Oto ............ H05B 33/0848 345/46 |
| 2008/0231562 A1* | 9/2008 | Kwon ............... G09G 3/3233 345/77 |
| 2010/0073265 A1* | 3/2010 | Hirai ............... G09G 3/3241 345/55 |
| 2010/0134468 A1* | 6/2010 | Ogura ............... G09G 3/3291 345/211 |
| 2010/0148678 A1* | 6/2010 | Simmers ............ H05B 33/0815 315/158 |
| 2010/0259527 A1 | 10/2010 | Odawara et al. |
| 2011/0074762 A1 | 3/2011 | Shirasaki et al. |
| 2014/0252317 A1* | 9/2014 | Gupta ................ H01L 51/5203 257/40 |

FOREIGN PATENT DOCUMENTS

| | | | |
|---|---|---|---|
| JP | 2007128103 A | | 5/2007 |
| JP | 2007233326 A | | 9/2007 |
| JP | 2008523448 A | | 7/2008 |
| JP | 2009042486 A | * | 2/2009 |
| JP | 2009042486 A | | 2/2009 |
| JP | 2010134169 A | | 6/2010 |
| JP | 2010160386 A | | 7/2010 |
| JP | 2011095720 A | | 5/2011 |
| WO | WO-2009087746 A1 | | 7/2009 |

OTHER PUBLICATIONS

Written Opinion of the International Searching Authority PCT/ISA/237 for International Application No. PCT/JP2014/055550 dated Jun. 3, 2014.

* cited by examiner

Fig.10

|  | CHARACTERISTIC DETECTING OPERATION | NORMAL OPERATION |
|---|---|---|
| (k+1)TH FRAME | 1ST ROW | 2ND TO nTH ROWS |
| (k+2)TH FRAME | 2ND ROW | 1ST ROW AND 3RD TO nTH ROWS |
| (k+3)TH FRAME | 3RD ROW | 1ST ROW, 2ND ROW, AND 4TH TO nTH ROWS |
| ⋮ | ⋮ | ⋮ |
| (k+n)TH FRAME | nTH ROW | 1ST TO (n-1)TH ROWS |

Fig.36

| | OLED CHARACTERISTIC DETECTING OPERATION | TFT CHARACTERISTIC DETECTING OPERATION | NORMAL OPERATION |
|---|---|---|---|
| (k+1)TH FRAME | 1ST ROW | | 2ND TO nTH ROWS |
| (k+2)TH FRAME | 2ND ROW | | 1ST ROW AND 3RD TO nTH ROWS |
| (k+3)TH FRAME | 3RD ROW | | 1ST ROW, 2ND ROW, AND 4TH TO nTH ROWS |
| ... | ... | | ... |
| (k+n)TH FRAME | nTH ROW | | 1ST TO (n−1)TH ROWS |
| (k+n+1)TH FRAME | | 1ST ROW | 2ND TO nTH ROWS |
| (k+n+2)TH FRAME | | 2ND ROW | 1ST ROW AND 3RD TO nTH ROWS |
| (k+n+3)TH FRAME | | 3RD ROW | 1ST ROW, 2ND ROW, AND 4TH TO nTH ROWS |
| ... | | ... | ... |
| (k+2n)TH FRAME | | nTH ROW | 1ST TO (n−1)TH ROWS |

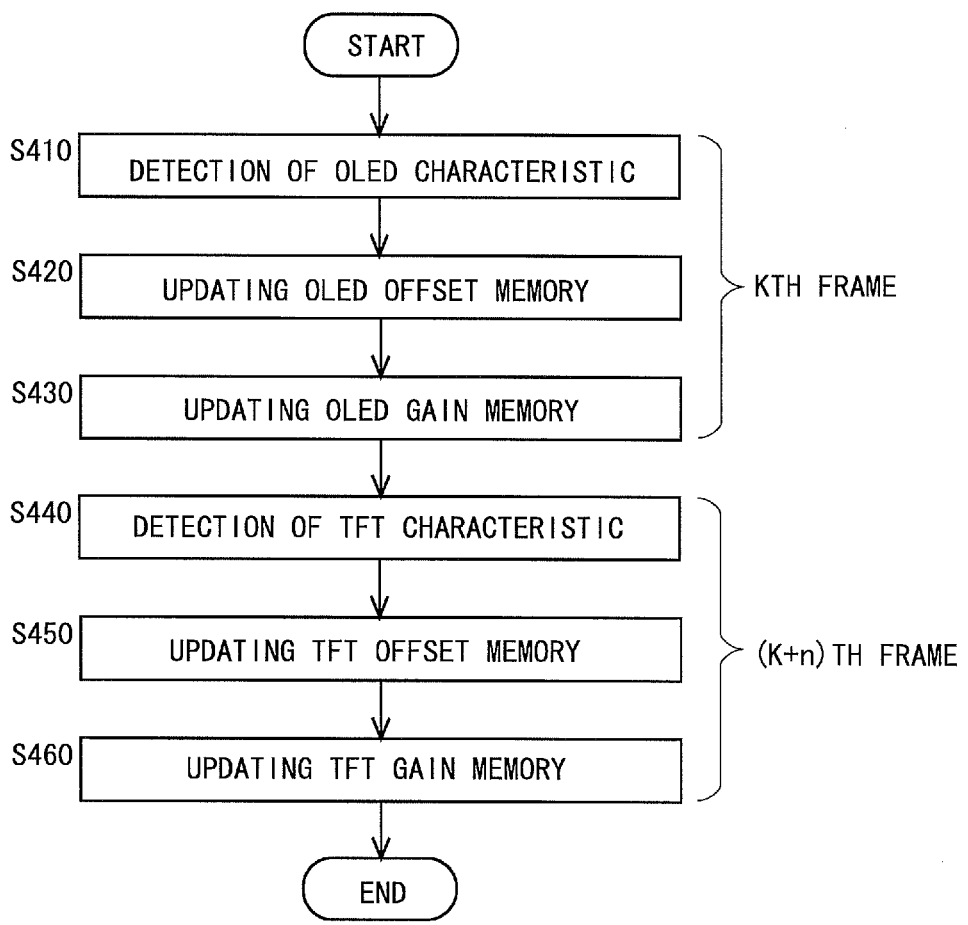

Fig.43

| | OLED CHARACTERISTIC DETECTING OPERATION | TFT CHARACTERISTIC DETECTING OPERATION | NORMAL OPERATION |
|---|---|---|---|
| (k+1)TH FRAME | 1ST ROW | | 2ND TO nTH ROWS |
| (k+2)TH FRAME | | 1ST ROW | 2ND TO nTH ROWS |
| (k+3)TH FRAME | 2ND ROW | | 1ST ROW AND 3RD TO nTH ROWS |
| (k+4)TH FRAME | | 2ND ROW | 1ST ROW AND 3RD TO nTH ROWS |
| (k+5)TH FRAME | 3RD ROW | | 1ST ROW, 2ND ROW, AND 4TH TO nTH ROWS |
| (k+6)TH FRAME | | 3RD ROW | 1ST ROW, 2ND ROW, AND 4TH TO nTH ROWS |
| ........ | ........ | ........ | ........ |
| (k+2n−1)TH FRAME | nTH ROW | | 1ST TO (n−1)TH ROWS |
| (k+2n)TH FRAME | | nTH ROW | 1ST TO (n−1)TH ROWS |

DISPLAY DEVICE AND METHOD FOR DRIVING SAME

TECHNICAL FIELD

The present invention relates to a display device and a method for driving the same, and more specifically to a display device provided with a pixel circuit including an electro-optic element such as an organic EL (Electra Luminescence) element, and a method for driving the same.

BACKGROUND ART

As a display element provided in a display device, there have hitherto been an electro-optic element whose luminance is controlled by an applied voltage, and an electro-optic element whose luminance is controlled by a flowing current. Examples of the electro-optic element whose luminance is controlled by an applied voltage include a liquid crystal display element. Meanwhile, examples of the electro-optic element whose luminance is controlled by a flowing current include an organic EL element. The organic EL element is also called an OLED (Organic Light-Emitting Diode). An organic EL display device that uses the organic EL element being a spontaneous electro-optic element can be easily reduced in thickness and power consumption and increased in luminance as compared to the liquid crystal display device that requires a backlight, a color filter and the like. Hence in recent years, development of the organic EL display device has been actively advanced.

As drive systems for the organic EL display device, a passive matrix system (also called simple matrix system) and an active matrix system are known. As for an organic EL display device employing the passive matrix system, its structure is simple, but a large size and high definition are difficult to achieve. In contrast, as for an organic EL display device employing the active matrix system (hereinafter referred to as an "active matrix-type organic EL display device"), a large size and high definition can be easily realized as compared to the organic EL display device employing the passive matrix system.

In the active matrix-type organic EL display device, a plurality of pixel circuits are formed in a matrix form. The pixel circuit of the active matrix-type organic EL display device typically includes an input transistor for selecting a pixel and a drive transistor for controlling supply of a current to the organic EL element. It is to be noted that in the following, a current that flows from the drive transistor to the organic EL element may be referred to as a "drive current".

FIG. 44 is a circuit diagram showing a configuration of a conventional general pixel circuit 91. This pixel circuit 91 is provided corresponding to each of intersections of a plurality of data lines S and a plurality of scanning lines G which are disposed in a display portion. As shown in FIG. 44, this pixel circuit 91 is provided with two transistors T1 and T2, one capacitor Cst, and one organic EL element OLED. The transistor T1 is an input transistor, and the transistor T2 is a drive transistor.

The transistor T1 is provided between the data line S and a gate terminal of the transistor T2. As for the transistor T1, a gate terminal is connected to the scanning line G, and a source terminal is connected to the data line S. The transistor T2 is provided in series with the organic EL element OLED. As for the transistor T2, a drain terminal is connected to a power supply line that supplies a high-level power supply voltage ELVDD, and a source terminal is connected to an anode terminal of the organic EL element OLED. It should be noted that, the power supply line that supplies the high-level power supply voltage ELVDD is referred to as a "high-level power supply line" in the following, and the high-level power supply line is added with the same symbol ELVDD as that of the high-level power supply voltage. As for the capacitor Cst, one end is connected to the gate terminal of the transistor T2, and the other end is connected to the source terminal of the transistor T2. A cathode terminal of the organic EL element OLED is connected to a power supply line that supplies a low-level power supply voltage ELVSS. It should be noted that, the power supply line that supplies the low-level power supply voltage ELVSS is referred to as a "low-level power supply line" in the following, and the low-level power supply line is added with the same symbol ELVSS as that of the low-level power supply voltage. Further, here, a contact point of the gate terminal of the transistor T2, the one end of the capacitor Cst, and the drain terminal of the transistor T1 is referred to as a "gate node VG" for the sake of convenience. It is to be noted that, although one having a higher potential between a drain and a source is generally called a drain, in descriptions of the present specification, one is defined as a drain and the other is defined as a source, and hence a source potential may become higher than a drain potential.

FIG. 45 is a timing chart for explaining an operation of the pixel circuit 91 shown in FIG. 44. Before time t1, the scanning line G is in a non-selected state. Therefore, before the time t1, the transistor T1 is in an off-state, and a potential of the gate node VG is held at an initialization level (e.g., a level in accordance with writing in the last frame). At the time t1, the scanning line G comes into a selected state and the transistor T1 is turned on. Thereby, a data voltage Vdata corresponding to a luminance of a pixel (sub-pixel) formed by this pixel circuit 91 is supplied to the gate node VG via the data line S and the transistor T1. Thereafter, in a period till time t2, the potential of the gate node VG changes in accordance with the data voltage Vdata. At this time, the capacitor Cst is charged with a gate-source voltage Vgs which is a difference between the potential of the gate node VG and a source potential of the transistor T2. At the time t2, the scanning line G comes into the non-selected state. Thereby, the transistor T1 is turned off and the gate-source voltage Vgs held by the capacitor Cst is determined. The transistor T2 supplies a drive current to the organic EL element OLED in accordance with the gate-source voltage Vgs held by the capacitor Cst. As a result, the organic EL element OLED emits light with a luminance in accordance with the drive current.

Incidentally, in the organic EL display device, a thin film transistor (TFT) is typically employed as the drive transistor. However, regarding the thin film transistor, variations in threshold voltage tend to occur. When variations in threshold voltage occur in the drive transistor provided in the display portion, variations in luminance occur, and the display quality thus deteriorates. Accordingly, a technique of suppressing deterioration in display quality in the organic EL display device has hitherto been proposed. For example, Japanese Patent Application Laid-Open No. 2005-31630 discloses a technique of compensating for variations in threshold voltage of a drive transistor. Further, Japanese Patent Application Laid-Open No. 2003-195810 and Japanese Patent Application Laid-Open No. 2007-128103 each discloses a technique of making constant a current flowing from a pixel circuit to an organic EL element OLED. Moreover, Japanese Patent Application Laid-Open No. 2007-233326 discloses a technique of displaying an image with a uniform luminance regardless of electron mobility and a threshold voltage of a drive transistor.

According to the foregoing prior arts, even when variations in threshold voltage occur in the drive transistor provided in the display portion, it is possible to supply a constant current to the organic EL element (light-emitting element) in accordance with a desired luminance (target luminance). However, as for the organic EL element, current efficiency decreases with the lapse of time. That is, even when a constant current is supplied to the organic EL element, the luminance gradually decreases with the lapse of time. This results in occurrence of burning.

Thus, unless compensation is performed on degradation of the drive transistor and degradation of the organic EL element, current decrease due to the degradation of the drive transistor occurs and luminance decrease due to the degradation of the organic EL element occurs as shown in FIG. 46. Further, even when compensation is performed on the degradation of the drive transistor, luminance decrease due to the degradation of the organic EL element occurs with the lapse of time as shown in FIG. 47. Accordingly, Japanese Translation of PCT International Application Publication No. 2008-523448 discloses a technique of correcting data based on a characteristic of the organic EL element OLED in addition to the technique of correcting data based on a characteristic of the drive transistor.

PRIOR ART DOCUMENTS

Patent Documents

[Patent Document 1] Japanese Patent Application Laid-Open No. 2005-31630
[Patent Document 2] Japanese Patent Application Laid-Open No. 2003-195810
[Patent Document 3] Japanese Patent Application Laid-Open No. 2007-128103
[Patent Document 4] Japanese Patent Application Laid-Open No. 2007-233326
[Patent Document 5] Japanese Translation of PCT International Application Publication No. 2008-523448

SUMMARY OF THE INVENTION

Problems to be Solved by the Invention

However, according to the technique disclosed in Japanese Translation of PCT International Application Publication No. 2008-523448, it is only possible to detect the characteristic of either the drive transistor or the organic EL element during a selection period. Hence it is not possible to simultaneously compensate for both the degradation of the drive transistor and the degradation of the organic EL element. Further, detecting the characteristics of both the drive transistor and the organic EL element requires the selection period to be made long. Concerning this, in the technique disclosed in Japanese Translation of PCT International Application Publication No. 2008-523448, when the selection period of a row on which the characteristic is detected is made long, the length of light emission time varies between the row on which the characteristic is detected and a row other than that row, and hence a desired luminance display is not made.

Accordingly, it is an object of the present invention to provide a driving method whereby it is possible to simultaneously compensate for both degradation of a drive transistor and degradation of a light-emitting element without causing special light emission at the time of detecting characteristics in a display device.

Means for Solving the Problems

A first aspect of the present invention is directed to a method for driving a display device having an n-row×m-column (n and m are integers not smaller than 2) pixel matrix including n×m pixel circuits each including an electro-optic element whose luminance is controlled by a current and a drive transistor configured to control a current to be supplied to the electro-optic element, the method comprising:

a first characteristic detection step of detecting a characteristic of the drive transistor;

a second characteristic detection step of detecting a characteristic of the electro-optic element;

a correction data storage step of storing, into a previously prepared correction data storage portion, characteristic data obtained based on a detection result in the first characteristic detection step and a detection result in the second characteristic detection step as correction data for correcting a video signal; and a video signal correction step of correcting the video signal based on the correction data stored in the correction data storage portion, to generate a data signal to be supplied to the n×m pixel circuits, wherein one frame period includes a selection period in which light emission of the electro-optic element is prepared and a light emission period in which light emission of the electro-optic element is performed, pieces of processing of one or both of the first characteristic detection step and the second characteristic detection step are performed only on one row of the pixel matrix in each one frame period, and the processing of the second characteristic detection step is performed in the light emission period.

According to a second aspect of the present invention, in the first aspect of the present invention, the pieces of processing of both the first characteristic detection step and the second characteristic detection step are performed only on one row of the pixel matrix in each one frame period, when a row on which the pieces of processing of both the first characteristic detection step and the second characteristic detection step are performed in each frame is defined as a monitor row and a row other than the monitor row is defined as a non-monitor row, a length of the selection period of the monitor row is longer than a length of the selection period of the non-monitor row, and the processing of the first characteristic detection step is performed in the selection period.

According to a third aspect of the present invention, in the first aspect of the present invention, the processing of one of the first characteristic detection step and the second characteristic detection step is performed on only one row of the pixel matrix in each one frame period, when attention is focused on one row of the pixel matrix, the processing of the first characteristic detection step and the processing of the second characteristic detection step are alternately performed, and the processing of the first characteristic detection step is performed in the light emission period.

According to a fourth aspect of the present invention, in the first aspect of the present invention, in the second characteristic detection step, a voltage of a positive electrode of the electro-optic element is measured in a state of a constant current being given to the electro-optic element, to detect the characteristic of the electro-optic element.

According to a fifth aspect of the present invention, in the fourth aspect of the present invention, in the second characteristic detection step, a length of the time for giving the constant current to the electro-optic element is adjusted in accordance with a target luminance.

According to a sixth aspect of the present invention, in the fourth aspect of the present invention, in the second characteristic detection step, the constant currents at a plurality of levels are given to the electro-optic element within a range where an integrated value of a light emission current in one frame period becomes a value corresponding to a target gradation, to detect a plurality of characteristics as the characteristics of the electro-optic element.

According to a seventh aspect of the present invention, in the first aspect of the present invention, in the second characteristic detection step, a current flowing in the electro-optic element is measured in a state of a constant voltage being given to the electro-optic element, to detect the characteristic of the electro-optic element.

According to an eighth aspect of the present invention, in the seventh aspect of the present invention, in the second characteristic detection step, a length of the time for giving the constant voltage to the electro-optic element is adjusted in accordance with a target luminance.

According to a ninth aspect of the present invention, in the seventh aspect of the present invention, in the second characteristic detection step, the constant voltages at a plurality of levels are given to the electro-optic element within a range where an integrated value of a light emission current in one frame period becomes a value corresponding to a target gradation, to detect a plurality of characteristics as the characteristics of the electro-optic element.

According to a tenth aspect of the present invention, in the first aspect of the present invention, in the first characteristic detection step, a current flowing between a drain and a source of the drive transistor is measured in a state of setting a gate-source voltage of the drive transistor to predetermined magnitude, to detect the characteristic of the drive transistor.

According to an eleventh aspect of the present invention, in the first aspect of the present invention, the correction data storage portion includes
an offset value storage portion configured to store an offset value as the correction data, and
a gain value storage portion configured to store a gain value as the correction data,
in the correction data storage step,
the sum of an offset value obtained based on the detection result in the first characteristic detection step and an offset value obtained based on the detection result in the second characteristic detection step is stored as a new offset value into the offset value storage portion, and
the product of a gain value obtained based on the detection result in the first characteristic detection step and a correction coefficient obtained based on the detection result in the second characteristic detection step is stored as a new gain value into the gain value storage portion.

According to a twelfth aspect of the present invention, in the eleventh aspect of the present invention, the display device further includes
a characteristic detection portion configured to detect the characteristic of the drive transistor and the characteristic of the electro-optic element, and
m monitor lines which are provided so as to correspond to respective columns of the pixel matrix and are configured so as to be made electrically connectable with the characteristic detection portion and the pixel circuits on the corresponding column,
the selection period includes a first period in which the processing of the first characteristic detection step is performed and a second period subsequent to the first period, and
when a value of a difference between the offset value stored in the offset value storage portion and the offset value obtained based on the detection result in the first characteristic detection step is defined as a first value and a value obtained based on the gain value stored in the gain value storage portion and the gain value obtained based on the detection result in the first characteristic detection step is defined as a second value, a voltage corresponding to the sum of the first value and the second value is applied to each monitor line in the second period.

According to a thirteenth aspect of the present invention, in the first aspect of the present invention, the correction data storage portion includes
a drive transistor offset value storage portion configured to store an offset value corresponding to the drive transistor as the correction data,
an electro-optic element offset value storage portion configured to store an offset value corresponding to the electro-optic element as the correction data,
a drive transistor gain value storage portion configured to store a gain value corresponding to the drive transistor as the correction data, and
an electro-optic element gain value storage portion configured to store a gain value corresponding to the electro-optic element as the correction data, and
in the correction data storage step,
an offset value obtained based on the detection result in the first characteristic detection step is stored as a new offset value into the drive transistor offset value storage portion,
a gain value obtained based on the detection result in the first characteristic detection step is stored as a new gain value into the drive transistor gain value storage portion,
an offset value obtained based on the detection result in the second characteristic detection step is stored as a new offset value into the electro-optic element offset value storage portion, and
a correction coefficient obtained based on the detection result in the second characteristic detection step is stored as a new gain value into the electro-optic element gain value storage portion.

According to a fourteenth aspect of the present invention, in the thirteenth aspect of the present invention, in the second characteristic detection step, a voltage of a positive electrode of the electro-optic element is measured in a state of a constant current being given to the electro-optic element, to detect the characteristic of the electro-optic element, and magnitude of the constant current is adjusted in accordance with the gain value stored in the electro-optic element gain value storage portion.

According to a fifteenth aspect of the present invention, in the thirteenth aspect of the present invention, in the second characteristic detection step, a current flowing in the electro-optic element is measured in a state of a constant voltage being given to the electro-optic element, to detect the characteristic of the electro-optic element, and magnitude of the constant voltage is adjusted in accordance with the gain value stored in the electro-optic element gain value storage portion.

According to a sixteenth aspect of the present invention, in the thirteenth aspect of the present invention, the display device further includes a characteristic detection portion configured to detect the characteristic of the drive transistor and the characteristic of the electro-optic element, and m monitor lines which are provided so as to correspond to respective columns of the pixel matrix and are configured so as to be made electrically connectable with the characteristic detection portion and the pixel circuits on the corresponding column, the selection period includes a first period in which the processing of the first characteristic detection step is performed and a second period subsequent to the first period, and in the second period, a voltage corresponding to the sum of the offset value stored in the electro-optic element offset value storage portion and a value obtained based on the gain value stored in the electro-optic element gain value storage portion is applied to each monitor line.

According to a seventeenth aspect of the present invention, in the first aspect of the present invention, the display device further includes a characteristic detection portion which includes at least a current measurement portion configured to measure a current and detects the characteristic of the drive transistor and the characteristic of the electro-optic element, and m monitor lines which are provided so as to correspond to respective columns of the pixel matrix and are configured so as to be made electrically connectable with the characteristic detection portion and the pixel circuits on the corresponding column, and in the first characteristic detection step, a current flowing between a drain and a source of the drive transistor is measured by the current measurement portion in a state of setting a gate-source voltage of the drive transistor to predetermined magnitude, in a state where the m monitor lines are electrically connected to the corresponding pixel circuits and the current measurement portion.

According to an eighteenth aspect of the present invention, in the seventeenth aspect of the present invention, the characteristic detection portion further includes a voltage measurement portion configured to measure a voltage, and in the second characteristic detection step, a voltage of a positive electrode of the electro-optic element is measured by the voltage measurement portion in a state of a constant current being given to the electro-optic element.

According to a nineteenth aspect of the present invention, in the seventeenth aspect of the present invention, in the second characteristic detection step, a current flowing in the electro-optic element is measured by the current measurement portion in a state of a constant voltage being given to the electro-optic element.

According to a twentieth aspect of the present invention, in the seventeenth aspect of the present invention, only one characteristic detection portion is provided for each K monitor lines (K is an integer not smaller than 2 and not larger than m), and in each frame, one of the K monitor lines is electrically connected to the characteristic detection portion, and the monitor line not electrically connected to the characteristic detection portion is put in a high impedance state.

According to a twenty-first aspect of the present invention, in the first aspect of the present invention, the processing of the second characteristic detection step is not performed as to a pixel at which a black display or an almost black display is performed out of the n-row×m-column pixel matrix.

According to a twenty-second aspect of the present invention, in the first aspect of the present invention, the method for driving a display device further comprises a monitor region storage step of storing information specifying a region where the pieces of processing of one or both of the first characteristic detection step and the second characteristic detection step are last performed into a previously prepared monitor region storage portion during power-off of the display device, wherein, after power-on of the display device, the pieces of processing of one or both of the first characteristic detection step and the second characteristic detection step are performed from a region in a vicinity of a region obtained based on the information stored in the monitor region storage portion.

According to a twenty-third aspect of the present invention, in the first aspect of the present invention, the method for driving a display device further comprises:

a temperature detection step of detecting a temperature; and a temperature change compensation step of correcting the characteristic data based on the temperature detected in the temperature detection step, wherein, in the correction data storage step, data obtained by the processing of the temperature change compensation step is stored as the correction data into the correction data storage portion.

According to a twenty-fourth aspect of the present invention, in the first aspect of the present invention, the drive transistor is a thin-film transistor with a channel layer formed of an oxide semiconductor.

According to a twenty-fifth aspect of the present invention, in the twenty-fourth aspect of the present invention, the oxide semiconductor is indium gallium zinc oxide mainly composed of indium (In), gallium (Ga), zinc (Zn), and oxygen (O).

A twenty-sixth aspect of the present invention is directed to a display device having an n-row×m-column (a and m are integers not smaller than 2) pixel matrix including n×m pixel circuits each including an electro-optic element whose luminance is controlled by a current and a drive transistor configured to control a current to be supplied to the electro-optic element, the display device comprising:

a pixel circuit drive portion configured to drive the n×m pixel circuits while performing a first characteristic detection processing for detecting a characteristic of the drive transistor and a second characteristic detection processing for detecting a characteristic of the electro-optic element;

a correction data storage portion configured to store characteristic data obtained based on a detection result in the first characteristic detection processing and a detection result in the second characteristic detection processing as correction data for correcting a video signal; and a video signal correction portion configured to correct the video signal based on the correction data stored in the correction data storage portion, to generate a data signal to be supplied to the n×m pixel circuits, wherein one frame period includes a selection period in which light emission of the electro-optic element is prepared and a light emission period in which light emission of the electro-optic element is performed, and the pixel circuit drive portion performs one or both of the first characteristic detection processing and the second characteristic detection processing for only one row of the pixel matrix in each one frame period, and performs the second characteristic detection processing in the light emission period.

Effects of the Invention

According to the first aspect of the present invention, in a display device including a pixel circuit that includes an electro-optic element (e.g., an organic EL element) whose luminance is controlled by a current and a drive transistor configured to control a current to be supplied to the electro-optic element, detection of a characteristic of the drive transistor and detection of a characteristic of the electro-optic element are performed. Then, a video signal is corrected by use of correction data obtained in consideration of detection results of both the drive transistor and the electro-optic element. Since a data signal based on the video signal corrected in this manner is supplied to the pixel circuit, a drive current with such magnitude as to compensate for the degradation of the drive transistor and the degradation of the electro-optic element is supplied to the electro-optic element. Here, detection of the characteristic of the electro-optic element is performed during a light emission period of the electro-optic element. This prevents the length of the light emission period from becoming shorter than the length of the conventional light emission period due to the detection of the characteristic of the drive transistor and the electro-optic element. Thus, it is possible to simultaneously compensate for both degradation of the drive transistor and degradation of the electro-optic element without causing special light emission at the time of detecting characteristics in a display device.

According to the second aspect of the present invention, the length of the selection period of a monitor row (row on which the characteristic is detected in each frame) is longer than the length of the selection period of a non-monitor row. Then, detection of the characteristic of the drive transistor is performed in that selection period. Hence a period for detecting the characteristic of the drive transistor is sufficiently ensured.

According to the third aspect of the present invention, both detection of the characteristic of the drive transistor and detection of the characteristic of the electro-optic element are performed during the light emission period of the electro-optic element. Therefore, differently from the configuration where detection of the characteristic is also performed during the selection period, the selection period of the monitor row is not required to be made long. This ensures the light emission period with a sufficient length. Further, this prevents occurrence of variations in length of the selection period depending on the row. As described above, in the display device, it is possible to simultaneously compensate for both the degradation of the drive transistor and the degradation of the electro-optic element without causing special light emission at the time of detecting characteristics, while sufficiently ensuring the light emission period without occurrence of variations in length of the selection period.

According to the fourth aspect of the present invention, a constant current is supplied to the electro-optic element which is subjected to detection of the characteristic. Therefore, by adjusting the time for supplying the constant current to the electro-optic element, it is possible to make the electro-optic element emit light with a desired luminance.

According to the fifth aspect of the present invention, it is possible to make the electro-optic element emit light with a desired luminance while detecting the characteristic of the electro-optic element.

According to the sixth aspect of the present invention, since a plurality of characteristics are detected as the characteristics of the electro-optic element, it is possible to more effectively compensate for the degradation of the drive transistor.

According to the seventh aspect of the present invention, it is possible to reduce the measurement time for detecting the characteristic of the electro-optic element.

According to the eighth aspect of the present invention, it is possible to make the electro-optic element emit light with a desired luminance while detecting the characteristic of the electro-optic element.

According to the ninth aspect of the present invention, since a plurality of characteristics are detected as the characteristics of the electro-optic element, it is possible to more effectively compensate for the degradation of the drive transistor.

According to the tenth aspect of the present invention, it is possible to exert a similar effect to that of the first aspect of the present invention in the mode of the display device being provided with constitutional elements for measuring a current.

According to the eleventh aspect of the present invention, correction data in consideration of both the characteristic of the drive transistor and the characteristic of the electro-optic element is stored into the offset value storage portion, and correction data in consideration of both the characteristic of the drive transistor and the characteristic of the electro-optic element is also stored into the gain value storage portion. Hence it is possible to facilitate correction of the video signal in consideration of both the characteristic of the drive transistor and the characteristic of the electro-optic element.

According to the twelfth aspect of the present invention, a voltage in accordance with the degree of degradation of the electro-optic element is applied to a monitor line before the light emission period, to reduce the length of the charging time in the light emission period.

According to the thirteenth aspect of the present invention, the storage portion configured to store an offset value and the storage portion configured to store a gain value are each separated into a storage portion used for compensating for the degradation of the drive transistor and a storage portion used for compensating for the degradation of the electro-optic element. Hence it is possible to adjust a current that is supplied to the electro-optic element in consideration only of the degradation of the electro-optic element. At that time, by increasing a current according to a degradation level of a pixel with the least degradation, it is possible to perform compensation on burning.

According to the fourteenth aspect of the present invention, concerning detection of the characteristic of the electro-optic element, the magnitude of the current that is supplied to the electro-optic element in the light emission period is adjusted in accordance with the gain value (correction coefficient) stored in the electro-optic element gain value storage portion. That is, the magnitude of the current is adjusted in accordance with the degree of degradation of the electro-optic element. This leads to compensation for deterioration in current efficiency.

According to the fifteenth aspect of the present invention, concerning detection of the characteristic of the electro-optic element, the magnitude of the voltage that is given to the electro-optic element in the light emission period is adjusted in accordance with the gain value (correction coefficient) stored in the electro-optic element gain value storage portion. Thereby, a voltage having magnitude in accordance with the degree of degradation of the electro-optic element is given to the electro-optic element in the light emission period.

According to the sixteenth aspect of the present invention, a voltage in accordance with the degree of degradation of the electro-optic element is applied to a monitor line before the light emission period, to reduce the length of the charging time in the light emission period.

According to the seventeenth aspect of the present invention, characteristics of both the drive transistor and the electro-optic element included in each column can be detected by one monitor line.

According to the eighteenth aspect of the present invention, the electro-optic element emits light so as to make a display with a gradation close to a desired gradation.

According to the nineteenth aspect of the present invention, it is possible to reduce the measurement time for detecting the characteristic of the electro-optic element.

According to the twentieth aspect of the present invention, one characteristic detection portion is shared by a plurality of monitor lines. Hence it is possible to simultaneously compensate for both degradation of the drive transistor and degradation of the electro-optic element without causing special light emission at the time of detecting characteristics, while suppressing an increase in circuit area.

According to the twenty-first aspect of the present invention, unnecessary light emission of the electro-optic element is prevented.

According to the twenty-second aspect of the present invention, a difference in number of times of detection of the characteristic of the drive transistor and the characteristic of the electro-optic element between, for example, an upper row and a lower row is prevented from being generated. Hence it is possible to uniformly compensate for the degradation of the drive transistor and the degradation of the electro-optic element throughout the screen, so as to effectively prevent occurrence of variations in luminance.

According to the twenty-third aspect of the present invention, a video signal is corrected by use of correction data in consideration of a temperature change. Therefore, in the display device, it is possible to simultaneously compensate for both the degradation of the drive transistor and the degradation of the electro-optic element without causing special light emission at the time of detecting characteristics regardless of a temperature change.

According to the twenty-fourth aspect of the present invention, a thin film transistor with a channel layer formed of an oxide semiconductor is used as the drive transistor provided in the pixel circuit. Hence it is possible to obtain the effects of high definition and low power consumption. Further, since an off-current becomes extremely small, it is possible to obtain the effect of being able to ensure a sufficient S/N ratio at the time of detecting a current.

According to the twenty-fifth aspect of the present invention, by use of indium gallium zinc oxide as the oxide semiconductor that forms the channel layer, it is possible to reliably achieve a similar effect to that of the twenty-fourth aspect of the present invention.

According to the twenty-sixth aspect of the present invention, it is possible to exert a similar effect to that of the first aspect of the present invention in the invention of a display device.

BRIEF DESCRIPTION OF THE DRAWINGS

FIG. 10 is a diagram for explaining shifting of an operation on each row in the first embodiment.

FIG. 36 is a diagram for explaining shifting of an operation on each row in the second embodiment.

FIG. 42 is a flowchart for explaining a procedure for updating an offset memory and a gain memory in the second embodiment.

FIG. 43 is a diagram for explaining shifting of an operation on each row in a modified example of the second embodiment.

MODE FOR CARRYING OUT THE INVENTION

Hereinafter, embodiments of the present invention will be described with reference to the attached drawings. In addition, it is assumed in the following that m and n are integers not smaller than 2, i is an integer not smaller than 1 and not larger than n, and j is an integer not smaller than 1 and not larger than m. Further, in the following, a characteristic of a drive transistor provided in a pixel circuit is referred to as a "TFT characteristic", and a characteristic of an organic EL element provided in the pixel circuit is referred to as an "OLED characteristic".

1. First Embodiment

<1.1 Whole Configuration>

Figure 2:
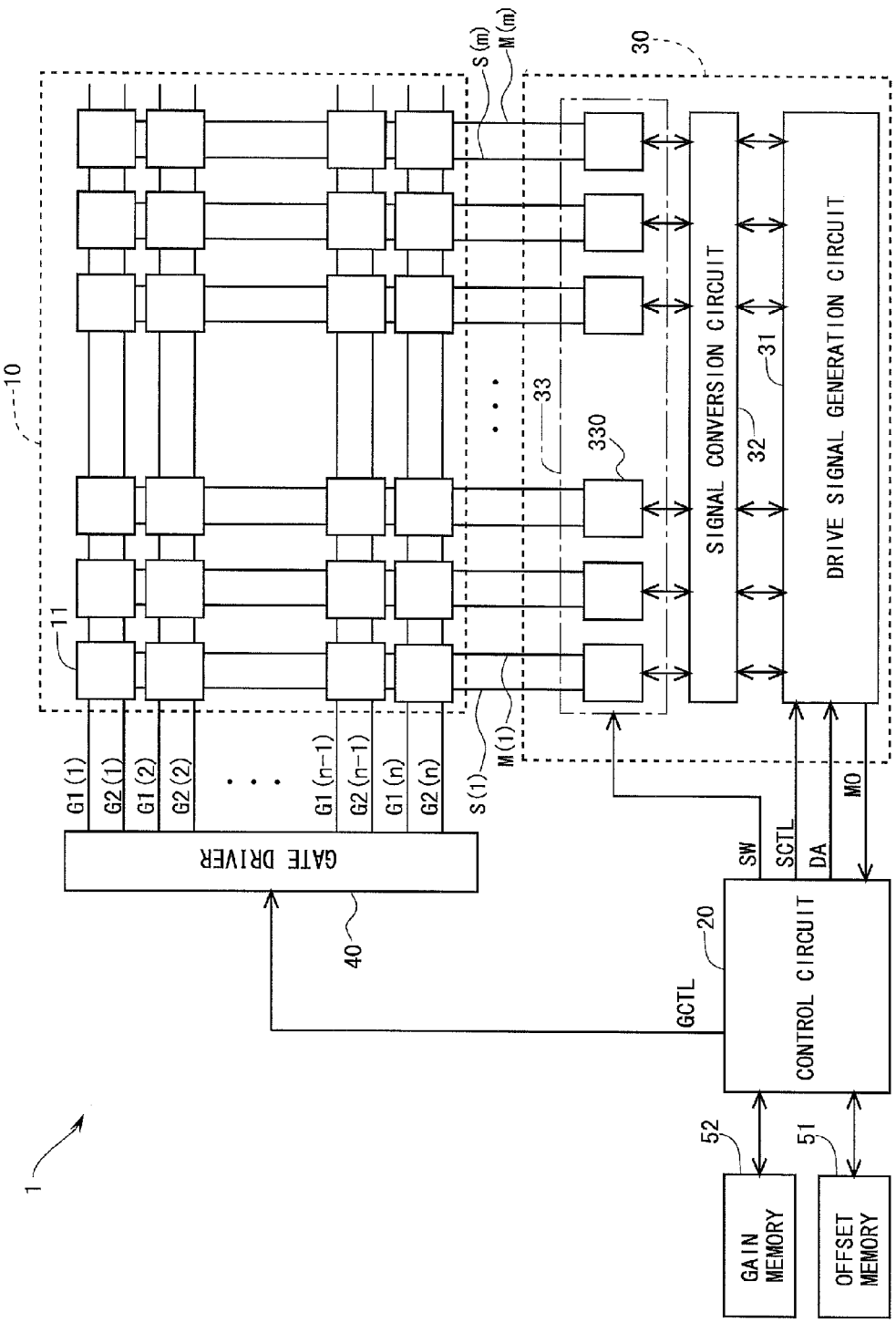
FIG. 2 is a block diagram showing a whole configuration of an organic EL display device in the first embodiment.

FIG. 2 is a block diagram showing a whole configuration of an active matrix-type organic EL display device 1 according to a first embodiment of the present invention. This organic EL display device 1 is provided with a display portion 10, a control circuit 20, a source driver (a data line drive circuit) 30, a gate driver (a scanning line drive circuit) 40, an offset memory 51, and a gain memory 52. It is to be noted that one or both of the source driver 30 and the gate driver 40 may be configured to be integrally formed with the display portion 10. Further, the offset memory 51 and the gain memory 52 may be physically formed of one memory.

It should be noted that the pixel circuit drive portion is realized by the source driver 30 and the gate driver 40, and the correction data storage portion is realized by the offset memory 51 and the gain memory 52, in the present embodiment.

The display portion 10 is provided with m data lines S(1) to S(m) and n scanning lines G1(1) to G1(n) orthogonal thereto. Hereinafter, an extending direction of the data line is referred to as a Y-direction, and an extending direction of the scanning line is referred to as an X-direction. A constitutional element along the Y-direction may be referred to as a "column", and a constitutional element along the X-direction may be referred to as a "row". Further, the display portion 10 is provided with m monitor lines M(1) to M(m) so as to correspond to the m data lines S(1) to S(m) one-to-one. The data lines S(1) to S(m) and the monitor lines M(1) to M(m) are parallel to each other. Moreover, the display portion 10 is provided with n monitor control lines G2(1) to G2(n) so as to correspond to the n scanning lines G1(1) to G1(n) one-to-one. The scanning lines G1(1) to G1(n) and the monitor control lines G2(1) to G2(n) are parallel to each other. Furthermore, the display portion 10 is provided with n×m pixel circuits 11 so as to correspond to intersections of the n scanning lines G1(1) to G1(n) and the m data lines S(1) to S(m). By the n×m pixel circuits 11 being provided in this manner, an n-row×m-column pixel matrix is formed on the display portion 10. Further, the display portion 10 is provided with a high-level power supply line for supplying a high-level power supply voltage, and a low-level power supply line for supplying a low-level power supply voltage.

It is to be noted that in the following, the data line is simply denoted by symbol S when the m data lines S(1) to S(m) are not required to be distinguished from each other. Similarly, the monitor line is simply denoted by symbol M when the m monitor lines M(1) to M(m) are not required to be distinguished from each other. The scanning line is simply denoted by symbol G1 when the n scanning lines G1(1) to G1(n) are not required to be distinguished from each other. The monitor control line is simply denoted by symbol G2 when the n monitor control lines G2(1) to G2(n) are not required to be distinguished from each other.

The control circuit 20 controls an operation of the source driver 30 by giving a data signal DA, a source control signal SCTL, and a switching control signal SW to the source driver 30, and controls an operation of the gate driver 40 by transmitting a gate control signal GCTL to the gate driver 40. The source control signal SCTL includes a source start pulse, a source clock, and a latch strobe signal, for example. The gate control signal GCTL includes a gate start pulse and a gate clock, for example. Further, the control circuit 20 receives monitor data MO given from the source driver 30, and updates the offset memory 51 and the gain memory 52. It should be noted that the monitor data MO is data measured for obtaining the TFT characteristic and the OLED characteristic.

Figure 3:
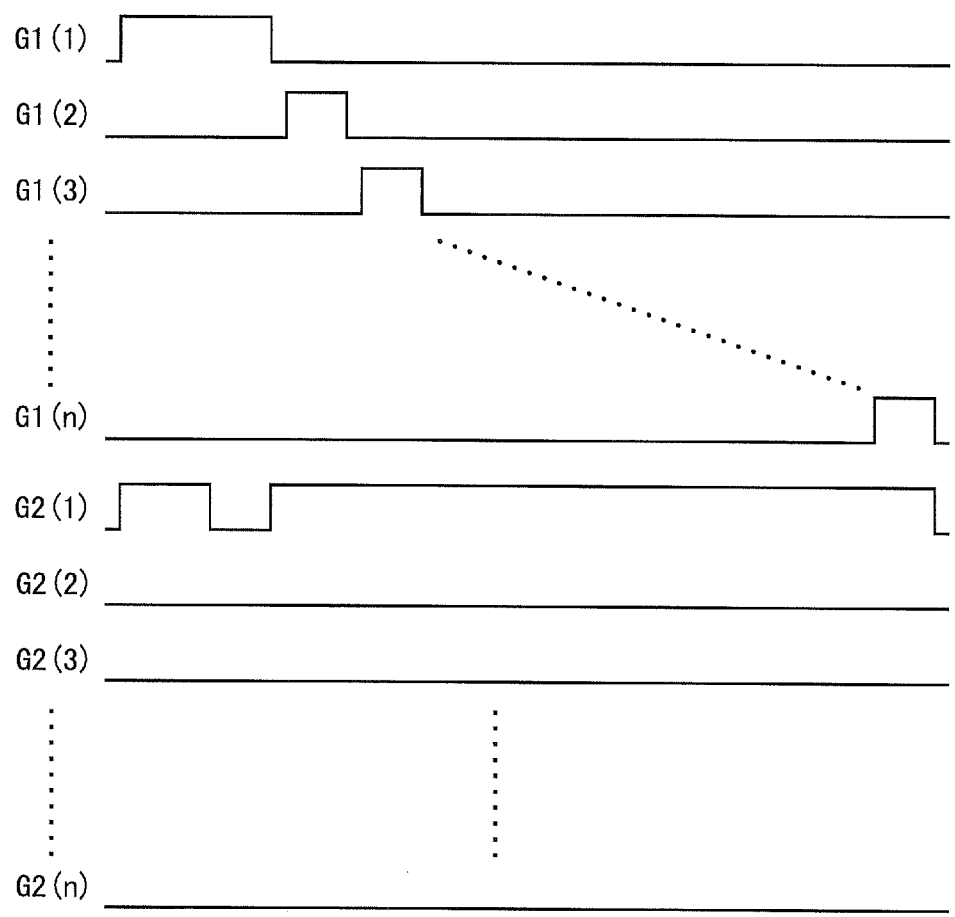
FIG. 3 is a timing chart for explaining an operation of a gate driver in the first embodiment.
Figure 4:
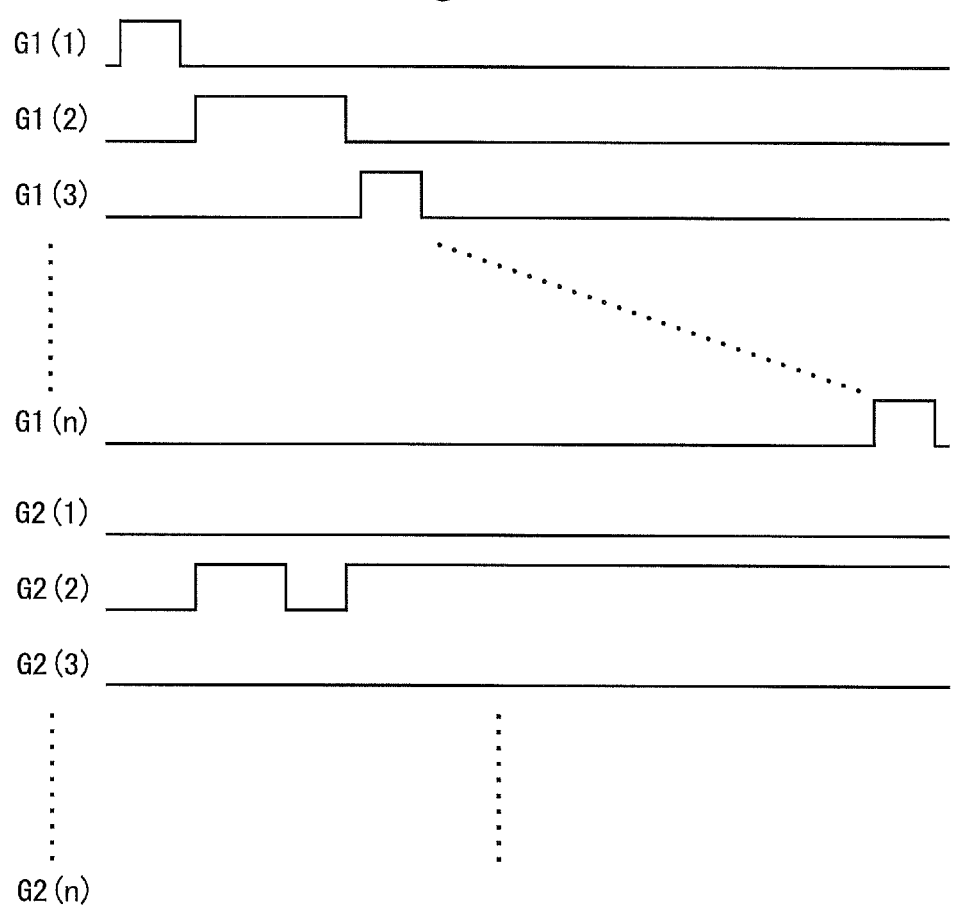
FIG. 4 is a timing chart for explaining the operation of the gate driver in the first embodiment.
Figure 5:
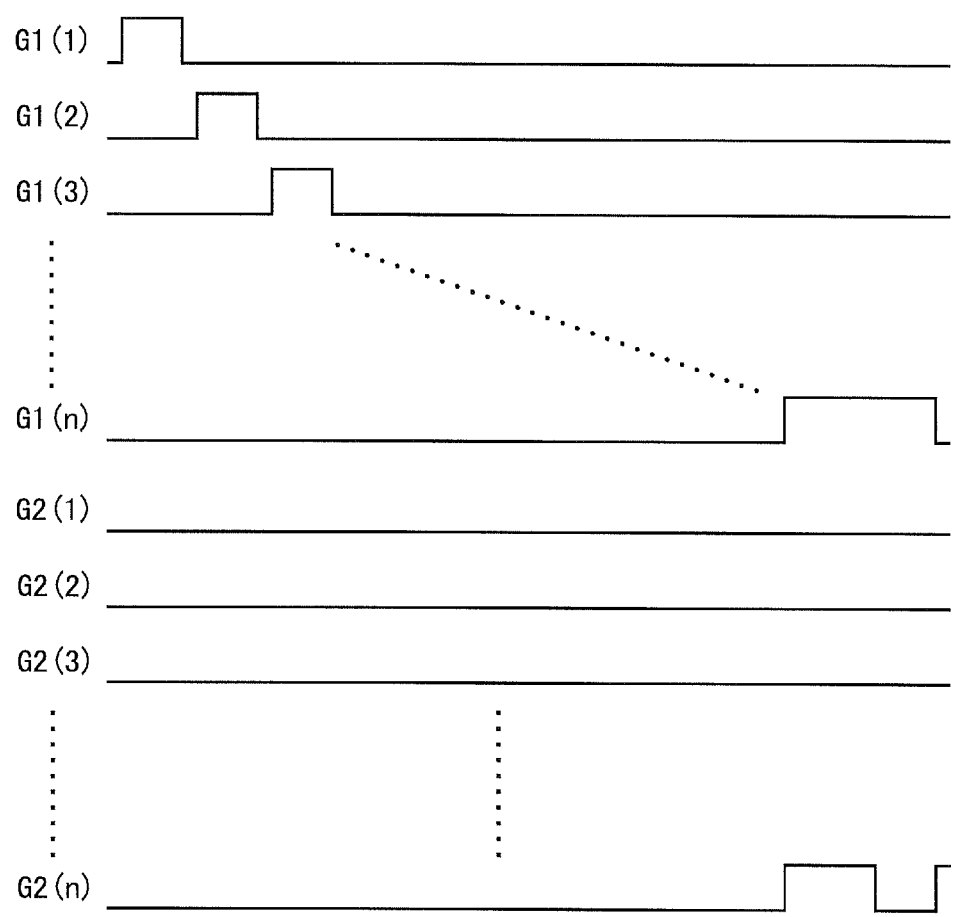
FIG. 5 is a timing chart for explaining the operation of the gate driver in the first embodiment.

The gate driver 40 is connected to the n scanning lines G1(1) to G1(n) and the n monitor control lines G2(1) to G2(n). The gate driver 40 is formed of a shift register, a logic circuit, and the like. Incidentally, in the organic EL display device 1 according to the present embodiment, a video signal transmitted from the outside (data to be an original of the data signal DA) is corrected based on the TFT characteristic and the OLED characteristic. Concerning this, detection of the TFT characteristic and the OLED characteristic for one row is performed in each frame. That is, when detection of the TFT characteristic and the OLED characteristic for the first row is performed in one frame, detection of the TFT characteristic and the OLED characteristic for the second row is performed in the next frame, and further, detection of the TFT characteristic and the OLED characteristic for the third row is performed in the further next frame. In this manner, detection of the TFT characteristic and the OLED characteristic for n rows is performed by taking n frame periods. Here, when the frame in which detection of the TFT characteristic and the OLED characteristic for the first row is performed is defined as a (k+1)th frame, the n scanning lines G1(1) to G1(n) and the n monitor control lines G2(1) to G2(n) are driven as shown in FIG. 3 in the (k+1)th frame. They are driven as shown in FIG. 4 in the (k+2)th frame, and driven as shown in FIG. 5 in the (k+n)th frame. It should be noted that, concerning FIGS. 3 to 5, a high-level state is an active state. Further, a period in which the scanning line G1 is in the active state is referred to as a "selection period". This selection period is a period for preparing light emission of the organic EL element provided in the pixel circuit 11. As grasped from FIGS. 3 to 5, only a scanning line corresponding to a row on which detection of the TFT characteristic and the OLED characteristic is performed is put in the active state for a longer period than the other scanning lines, in each frame. Hereinafter, the row on which detection of the TFT characteristic and the OLED characteristic is performed when attention is focused on any frame is referred to as a "monitor row", and a row other than the monitor row is referred to as a "non-monitor row". In each frame, the monitor control line G2 corresponding to the non-monitor row is held in a non-active state. The monitor control line G2 corresponding to the monitor row is put in the active state in a first predetermined period out of the selection period, and is put in the non-active state in the remaining period in the selection period. Thereafter, the monitor control line G2 is again put in the active state in a period till the time almost one frame period after the start point of the selection period. In the present embodiment, the gate driver 40 is configured such that the n scanning lines G1(1) to G1(n) and the n monitor control lines G2(1) to G2(n) are driven as described above.

The source driver 30 is connected to the m data lines S(1) to S(m) and the m monitor lines M(1) to M(m). The source driver 30 is formed of a drive signal generation circuit 31, a signal conversion circuit 32, and an output portion 33 including m output circuits 330. Each of the m output circuits 330 in the output portion 33 is connected to the corresponding data line S out of the m data lines S(1) to S(m) and the corresponding monitor line M out of the m monitor lines M(1) to M(m).

The drive signal generation circuit 31 includes a shift register, a sampling circuit, and a latch circuit. In the drive signal generation circuit 31, the shift register sequentially transmits the source start pulse from the input end to the output end in synchronization with the source clock. In accordance with this transmission of the source start pulse, a sampling pulse corresponding to each data line S is outputted from the shift register. The sampling circuit sequentially stores the data signal DA for one row in accordance with the timing of the sampling pulse. The latch circuit fetches and holds the data signal DA for one row stored in the sampling circuit in accordance with the latch strobe signal.

Figure 6:
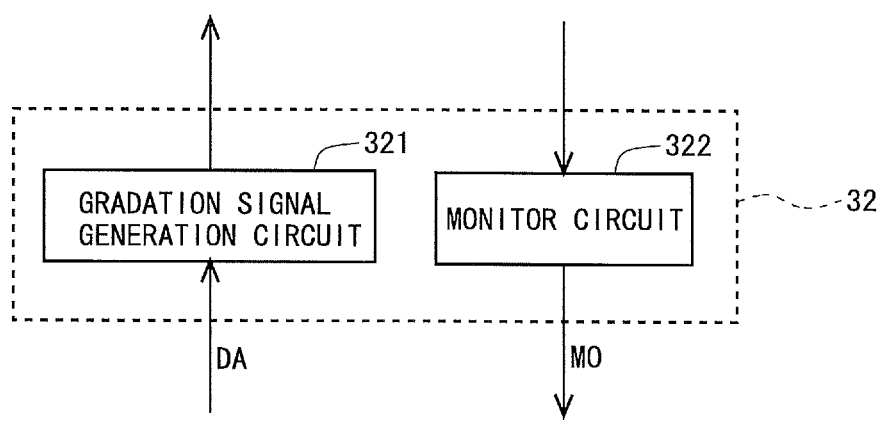
FIG. 6 is a block diagram showing a schematic configuration of a signal conversion circuit in the first embodiment.

FIG. 6 is a block diagram showing a schematic configuration of the signal conversion circuit 32. As shown in FIG. 6, the signal conversion circuit 32 is formed of a gradation signal generation circuit 321 and a monitor circuit 322. The gradation signal generation circuit 321 includes a D/A converter. The data signal DA for one row held in the latch circuit in the drive signal generation circuit 31 as described above is converted to an analog voltage by the D/A converter in the gradation signal generation circuit 321. The converted analog voltage is given to the output circuit 330 in the output portion 33. The monitor circuit 322 includes an A/D converter. In the A/D converter in the monitor circuit 322, an analog voltage, which appears on the monitor line M and represents the TFT characteristic and the OLED characteristic, is converted to the monitor data MO as a digital signal. The monitor data MO is given to the control circuit 20 via the drive signal generation circuit 31. It is to be noted that the monitor circuit 322 will be described in detail later.

The output circuit 330 in the output portion 33 applies the analog voltage, which is given from the gradation signal generation circuit 321 in the signal conversion circuit 32, as a data voltage to the data line S via a buffer. Further, the output circuit 330 in the output portion 33 switches connection destination of the monitor line M based on the switching control signal SW. It should be noted that this will be described in detail later.

The offset memory 51 and the gain memory 52 store correction data used for correcting the video signal transmitted from the outside. More specifically, the offset memory 51 stores an offset value as correction data, and the gain memory 52 stores a gain value as correction data. It should be noted that typically, the same number of offset values and gain values as the number of pixels in the display portion 10 are respectively stored into the offset memory 51 and the gain memory 52. Further, a buffer memory for temporarily holding an offset value (hereinafter referred to as an "offset value buffer") and a buffer memory for temporarily holding a gain value (hereinafter referred to as a "gain value buffer") are provided in the control circuit 20, for example. Based on the monitor data MO given from the source driver 30, the control circuit 20 updates the offset value in the offset memory 51 and the gain value in the gain memory 52. Further, the control circuit 20 reads the offset value stored in the offset memory 51 and the gain value stored in the gain memory 52, and corrects the video signal. Data obtained by the correction is transmitted as the data signal DA to the source driver 30.

<1.2 Configuration of Pixel Circuit and Monitor Circuit>

Figure 7:
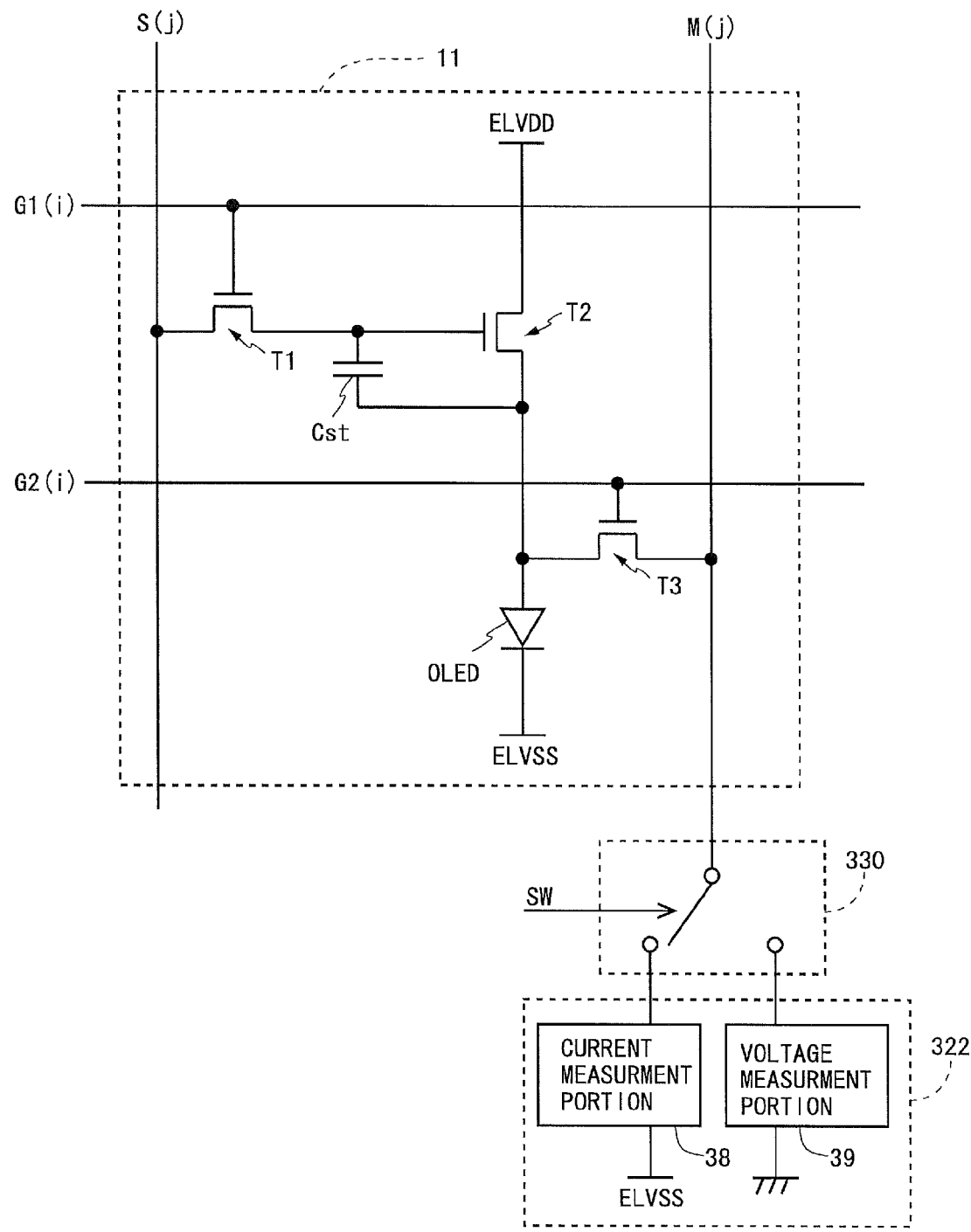
FIG. 7 is a diagram showing a configuration of a pixel circuit and a monitor circuit in the first embodiment.

FIG. 7 is a diagram showing configurations of the pixel circuit 11 and the monitor circuit 322. It is to be noted that the pixel circuit 11 shown in FIG. 7 is the pixel circuit 11 on the ith row and the jth column. This pixel circuit 11 is provided with one organic EL element OLED, three transistors T1 to T3, and one capacitor Cst. The transistor T1 functions as an input transistor for selecting a pixel, the transistor T2 functions as a drive transistor for controlling supply of a current to the organic EL element OLED, and the transistor T3 functions as a monitor control transistor for controlling whether or not to detect the TFT characteristic and the OLED characteristic.

The transistor T1 is provided between the data line S(j) and a gate terminal of the transistor T2. As for the transistor T1, a gate terminal is connected to the scanning line G1($i$), and a source terminal is connected to the data line S(j). The transistor T2 is provided in series with the organic EL element OLED. As for the transistor T2, a gate terminal is connected to the drain terminal of the transistor T1, a drain terminal is connected to a high-level power supply line ELVDD, and a source terminal is connected to an anode terminal of the organic EL element OLED. As for the transistor T3, a gate terminal is connected to the monitor control line G2($i$), a drain terminal is connected to the anode terminal of the organic EL element OLED, and a source terminal is connected to the monitor line M(j). As for the capacitor Cst, one end is connected to the gate terminal of the transistor T2, and the other end is connected to the source terminal of the transistor T2. A cathode terminal of the organic EL element OLED is connected to the low-level power supply line ELVSS.

In the present embodiment, the transistors T1 to T3 in the pixel circuit 11 are all n-channel transistors. Further, in the present embodiment, an oxide TFT (thin film transistor using an oxide semiconductor for a channel layer) is employed for each of the transistors T1 to T3. Specifically, there is employed an IGZO-TFT where a channel layer is formed of InGaZnOx (indium gallium zinc oxide) (hereinafter referred to as "IGZO"; "IGZO" is a registered trademark) which is an oxide semiconductor mainly composed of indium (In), gallium (Ga), zinc (Zn) and oxygen (O). It is to be noted that the oxide TFT such as the IGZO-TFT is effective especially in the case of being employed as the n-channel transistor included in the pixel circuit 11. However, the present invention does not exclude the use of a p-channel type oxide TFT. Further, it is also possible to employ a transistor using an oxide semiconductor other than IGZO for the channel layer. For example, a similar effect is obtained in the case of employing a transistor using an oxide semiconductor containing at least one of indium, gallium, zinc, copper (Cu), silicon (Si), tin (Sn), aluminum (Al), calcium (Ca), germanium (Ge), and lead (Pb) for the channel layer. Moreover, the present invention does not exclude the use of a transistor other than the transistor using the oxide semiconductor for the channel layer.

As shown in FIG. 7, the monitor circuit 322 includes a current measurement portion 38 and a voltage measurement portion 39. In the present embodiment, the characteristic detection portion is realized by this monitor circuit 322. Concerning the relationship among the current measurement portion 38, the voltage measurement portion 39, and the monitor line M(j), the monitor line M(j) is configured to connect to either the current measurement portion 38 or the voltage measurement portion 39 based on the switching control signal SW given from the control circuit 20 to the output circuit 330. It is to be noted that FIG. 7 shows only part of a configuration of the output circuit 330.

Figure 8:
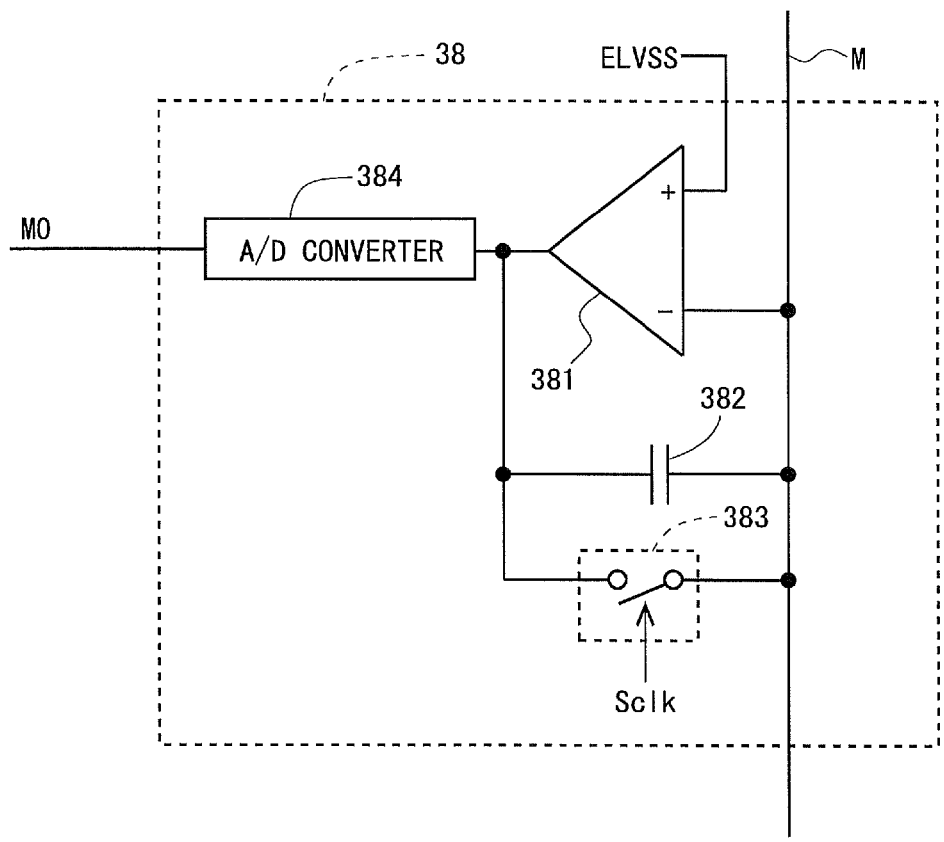
FIG. 8 is a diagram showing one constitutional example of a current measurement portion in the first embodiment.

FIG. 8 is a diagram showing one constitutional example of the current measurement portion 38. This current measurement portion 38 includes an operation amplifier 381, a capacitor 382, a switch 383, and an A/D converter 384. As for the operation amplifier 381, a non-inverting input terminal is connected to the low-level power supply line ELVSS, and an inverting input terminal is connected to the monitor line M. The capacitor 382 and the switch 383 are provided between an output terminal of the operation amplifier 381 and the monitor line M. As described above, this current measurement portion 38 is formed of an integration circuit. In such a configuration, first, the switch 383 is brought into an on-state by a control clock signal Sclk. This brings the state between the output terminal and the inverting input terminal of the operation amplifier 381 into a short-circuited state, and potentials of the output terminal of the operation amplifier 381 and the monitor line M become equal to a potential of the low-level power supply line ELVSS. At the time of detecting a current, the switch 383 is brought into an off-state by the control clock signal Sclk. Thereby, due to the existence of the capacitor 382, the potential of the output terminal of the operation amplifier 381 changes in accordance with magnitude of a current flowing in the monitor line M. That change in potential is reflected to a digital signal outputted from the A/D converter 384. The digital signal is then outputted as the monitor data MO from the current measurement portion 38.

Figure 9:
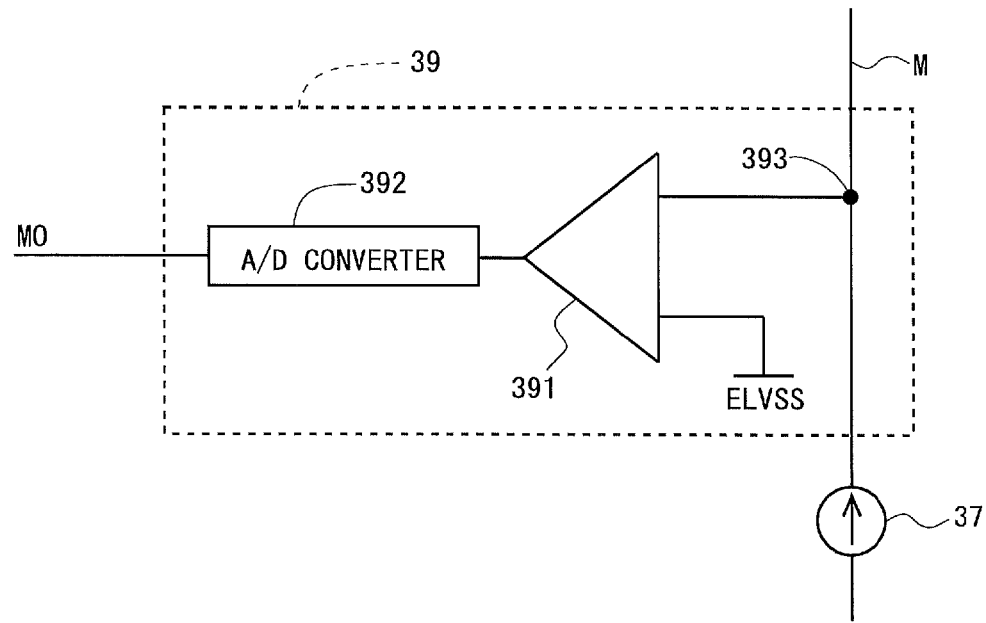
FIG. 9 is a diagram showing one constitutional example of a voltage measurement portion in the first embodiment.

FIG. 9 is a diagram showing one constitutional example of the voltage measurement portion 39. This voltage measurement portion 39 includes an amplifier 391 and an A/D converter 392. In such a configuration, with a constant current being allowed to flow in the monitor line M by a constant current source 37, a voltage between a node 393 and the low-level power supply line ELVSS is amplified by the amplifier 391. Then, a voltage after the amplification is converted to a digital signal by the A/D converter 392. The digital signal is then outputted as the monitor data MO from the voltage measurement portion 39.

<1.3 Drive Method>

Next, a driving method in the present embodiment will be described. As described above, in the present embodiment, detection of the TFT characteristic and the OLED characteristic for one row is performed in each frame. In each frame, an operation for detecting the TFT characteristic and the OLED characteristic (hereinafter referred to as a "characteristic detecting operation") is performed on the monitor row, and a normal operation is performed on the non-monitor row. That is, when a frame in which detection of the TFT characteristic and the OLED characteristic for the first row is performed is defined as a (k+1)th frame, an operation on each row is shifted as shown in FIG. 10. Further, when detection of the TFT characteristic and the OLED characteristic is performed, the offset memory 51 and the gain memory 52 are updated by use of detection results thereof. The video signal is then corrected by use of the correction data stored in the offset memory 51 and the gain memory 52.

<1.3.1 Operation of Pixel Circuit>
<1.3.1.1 Normal Operation>

Figure 11:
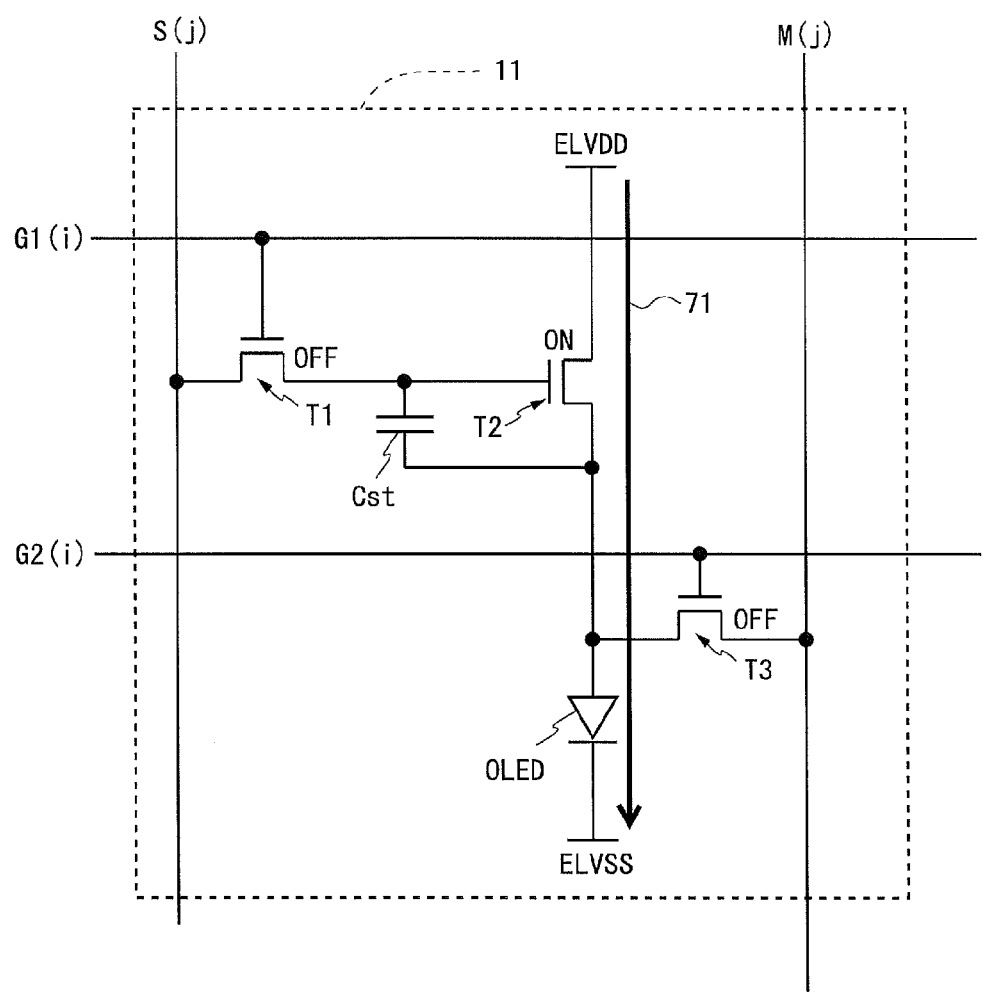
FIG. 11 is a diagram for explaining a flow of a current at the time of a normal operation being performed in the first embodiment.

In each frame, the normal operation is performed on the non-monitor row. In the pixel circuit 11 included in the non-monitor row, after writing based on a data voltage corresponding to a target luminance is performed in the selection period, the transistor T1 is held in the off-state. The transistor T2 comes into the on-state by the writing based on the data voltage. The transistor T3 is held in the off-state. Thus, a drive current is supplied to the organic EL element OLED via the transistor T2 as indicated by an arrow denoted by reference numeral 71 in FIG. 11. Thereby, the organic EL element OLED emits light with a luminance in accordance with the drive current.

<1.3.1.2 Characteristic Detecting Operation>

Figure 12:
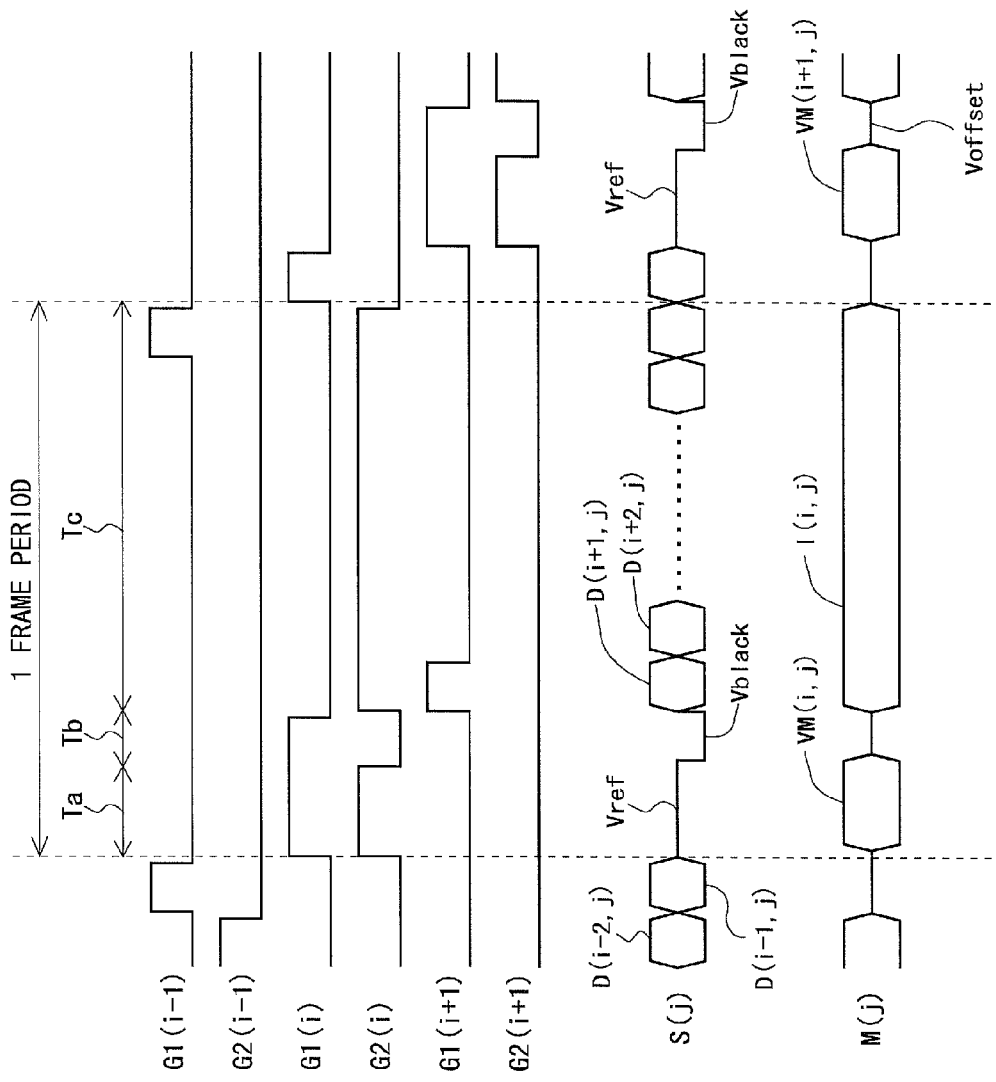
FIG. 12 is a timing chart for explaining an operation of a pixel circuit (a pixel circuit on the ith row and the jth column) included in a monitor row in the first embodiment.

In each frame, the characteristic detecting operation is performed on the monitor row. FIG. 12 is a timing chart for explaining an operation of the pixel circuit 11 (assumed to be the pixel circuit 11 on the ith row and the jth column) included in the monitor row. It should be noted that FIG. 12 shows "one frame period", taking as a reference the start point of the selection period of the ith row in the frame in which the ith row is the monitor row. As for the monitor row, as shown in FIG. 12, one frame period includes: a period Ta for detecting the TFT characteristic (hereinafter such a period will be referred to as a "TFT characteristic detection period"); a period Tb for writing data corresponding to a black display (hereinafter such a period will be referred to as a "black writing period"); and a period Tc for making the organic EL element OLED emit light (hereinafter such a period will be referred to as a "light emission period"). A first predetermined period out of the selection period is the TFT characteristic detection period Ta, and a period other than the TFT characteristic detection period Ta out of the selection period is the black writing period Tb. It is to be noted that the first period is realized by the TFT characteristic detection period Ta and the second period is realized by the black writing period Tb in the present embodiment.

Figure 13:
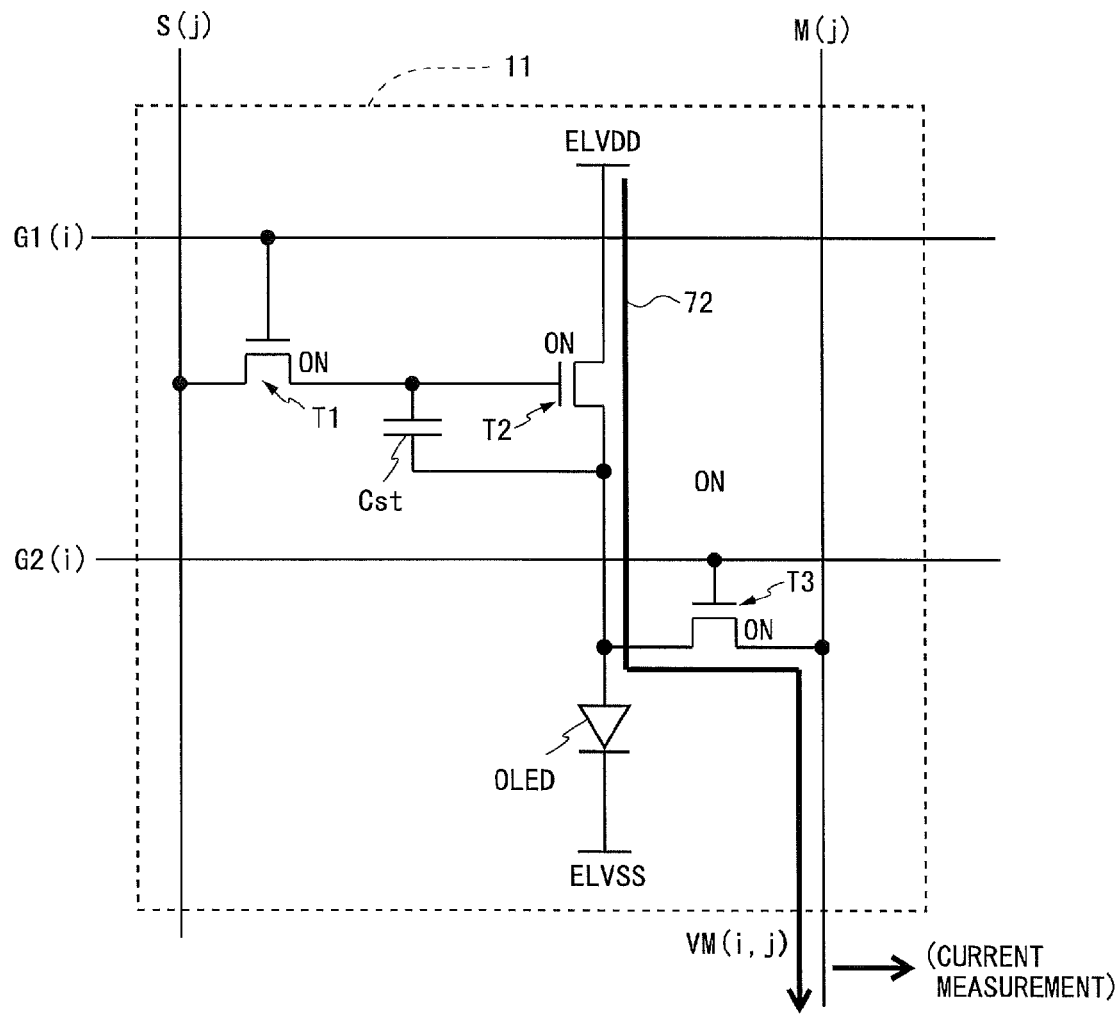
FIG. 13 is a diagram for explaining a flow of a current in a TFT characteristic detection period in the first embodiment.

In the TFT characteristic detection period Ta, the scanning line G1(i) and the monitor control line G2(i) are put in the active state. This brings the transistor T1 and the transistor T3 into the on-state. Further, in the TFT characteristic detection period T1, a reference voltage Vref for detecting the TFT characteristic is applied to the data line S(j). Thereby, the reference voltage Vref is written and the transistor T2 also comes into the on-state. As a result, a current flowing in the transistor T2 is outputted to the monitor line M(j) via the transistor T3 as indicated by an arrow denoted by reference numeral 72 in FIG. 13. Further, in the TFT characteristic detection period Ta, the monitor line M(j) is connected to the current measurement portion 38 by the switching control signal SW. Thereby, the current (sink current) outputted to the monitor line M(j) is measured by the current measurement portion 38. In such a manner as above, the magnitude of the current flowing between the drain and the source of the transistor T2 is measured in the state of setting a gate-source voltage of the transistor T2 to predetermined magnitude (magnitude of the reference voltage Vref), and the TFT characteristic is detected.

Figure 14:
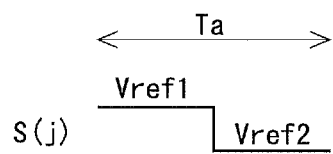
FIG. 14 is a diagram for explaining application of a reference voltage to a data line in the TFT characteristic detection period in the first embodiment.

Incidentally, in the present embodiment, as shown in FIG. 14, two kinds of reference voltages (first reference voltage Vref1 and second reference voltage Vref2) are applied as the reference voltage Vref to the data line S(j) in the TFT characteristic detection period Ta. Accordingly a TFT characteristic based on the first reference voltage Vref1 and a TFT characteristic based on the second reference voltage Vref2 are detected.

In the black writing period Tb, the scanning line G1(i) is held in the active state, and the monitor control line G2(i) is put in the non-active state. Thereby, the transistor T1 is held in the on-state and the transistor T3 comes into the off-state. Further, in the black writing period Tb, a voltage Vblack corresponding to a black display is applied to the data line S(j), and hence the transistor T2 comes into the off-state. Thus, a current does not flow in the transistor T2. It is to be noted that the monitor line M(j) is applied with a voltage being the sum of "a difference between the offset value stored in the offset memory 51 and the offset value obtained in the TFT characteristic detection period Ta" (first value) and "a voltage corresponding to a light emission voltage calculated from the gain value stored in the gain memory 52 and the gain value obtained in the TFT characteristic detection period Ta" (second value) in the black writing period Tb. Thereby, a voltage in accordance with the degree of degradation of the organic EL element OLED is applied to the monitor line M(j) before the light emission period Tc, and the length of the charging time in the light emission period Tc is reduced.

Figure 15:
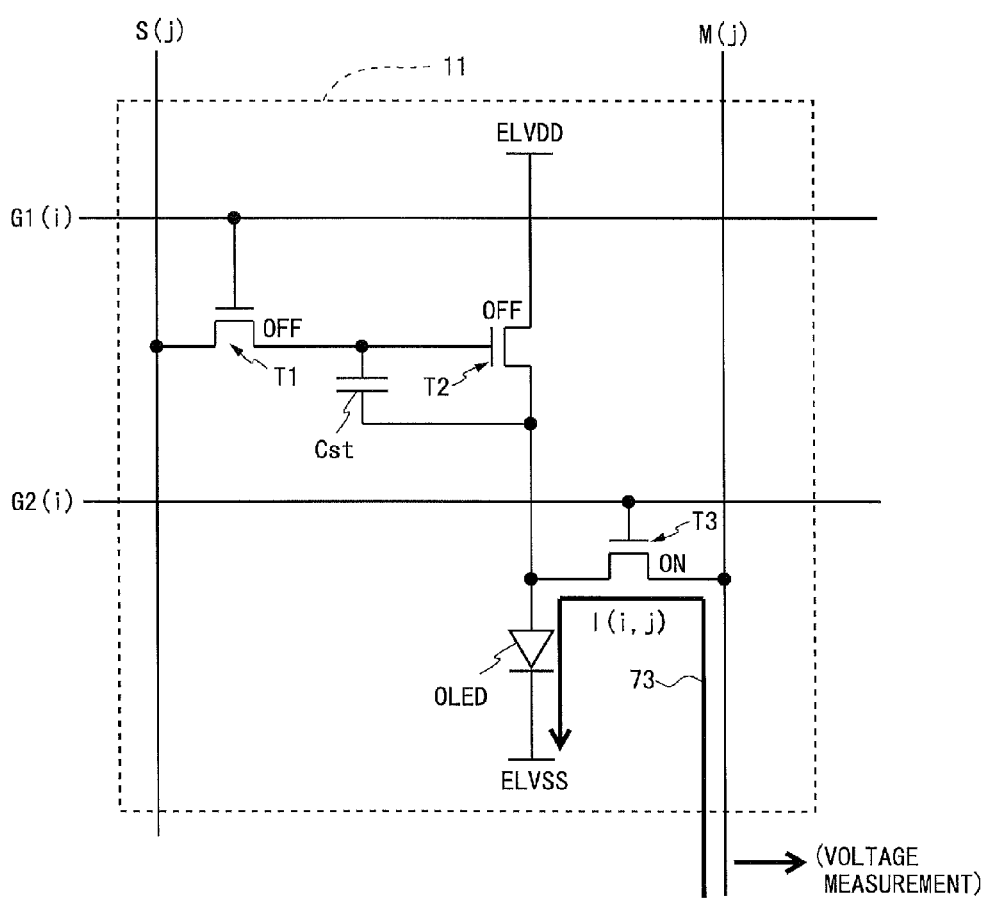
FIG. 15 is a diagram for explaining a flow of a current in a light emission period in the first embodiment.

In the light emission period Tc, the scanning line G1(i) is put in the non-active state, and the monitor control line G2(i) is put in the active state. Here, since writing based on the voltage Vblack corresponding to a black display is performed in the black writing period Tb before the light emission period Tc, the transistor T2 is in the off-state. Further, in the period for detecting the OLED characteristic out of the light emission period Tc, the monitor line M(j) is connected to the voltage measurement portion 39, and the constant current is supplied to the monitor line M(j). Thereby, a data current as the constant current is supplied from the monitor line M(j) to the organic EL element OLED as indicated by an arrow denoted by reference numeral 73 in FIG. 15. In this state, a light emission voltage of the organic EL element OLED is measured by the voltage measurement portion 39. As described above, the OLED characteristic is detected by measuring the voltage of the positive electrode of the organic EL element OLED in the state where the constant current is being given to the organic EL element OLED.

Figure 16:
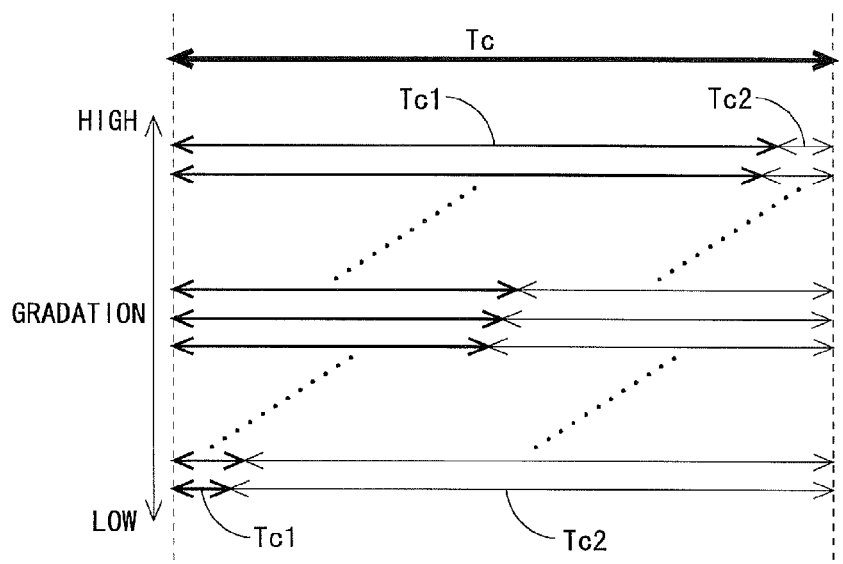
FIG. 16 is a diagram for explaining adjustment of light emission time of the organic EL element in the first embodiment.

Incidentally, the data current that is supplied to the organic EL element OLED in the light emission period Tc is the constant current. For this reason, in the present embodiment, the length of the time for light emitting of the organic EL element OLED is adjusted in order to make a display with a desired gradation. For example, the constant current is set to be a current corresponding to a white display, and the higher the gradation is, the longer the light emission time is made, while the lower the gradation is, the shorter the light emission time is made. To realize this, for example, the higher the gradation is, the longer the period Tc1 in which the monitor line M is connected to the voltage measurement portion 39 is made, and the lower the gradation is, the longer the period Tc2 in which the monitor line M is connected to the current measurement portion 38 is made, as shown in FIG. 16. At that time, the lengths of the periods Tc1 and Tc2 are adjusted based on a degradation correction coefficient obtained from a difference between the gain value stored in the gain memory 52 and the gain value obtained in the TFT characteristic detection period Ta. As described above, the length of the time for light emitting of the organic EL element OLED is adjusted such that an integrated value of the light emission current in one frame period becomes a value corresponding to a desired gradation. In other words, the length of the time for giving the constant current to the organic EL element OLED is adjusted in accordance with a target luminance. It should be noted that, when the integrated value of the light emission current in one frame period becomes a value corresponding to a desired gradation, the current value may be changed during the light emission period Tc, to measure the characteristic (current-voltage characteristic) at a plurality of operation points. Further, the configuration may be such that the length of the time for light emitting of the organic EL element OLED is made uniform and the current value is changed in accordance with a gradation. In this case, the magnitude of the current that is supplied to the monitor line M may be obtained based on a degradation correction coefficient obtained from a difference between the gain value stored in the gain memory 52 and the gain value obtained in the TFT characteristic detection period Ta. It should be noted that, since the gain value in consideration of both the TFT characteristic and the OLED characteristic has been stored in the gain memory 52, the difference between the gain value stored in the gain memory 52 and the gain value obtained in the TFT characteristic detection period Ta becomes a value representing the OLED characteristic.

Figure 17:
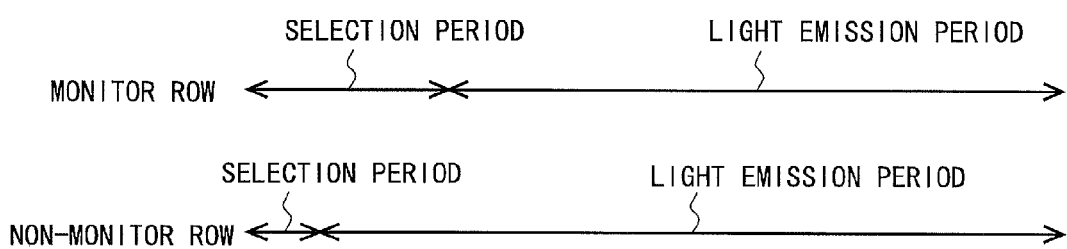
FIG. 17 is a diagram for explaining a difference in length of the light emission period between a monitor row and a non-monitor row in the first embodiment.

Further, in the present embodiment, the length of the selection period of the monitor row is longer than that of the non-monitor row as shown in FIG. 17. Hence there is a difference in length of the light emission period between the monitor row and the non-monitor row. Then, the data current is adjusted such that the integrated value of the light emission current in one frame period becomes a value corresponding to a desired gradation.

It should be noted that, when a gradation as a target is a gradation corresponding to a black display or a gradation close thereto, it is preferable not to detect the OLED characteristic. That is, it is preferable not to detect the OLED characteristic at a pixel where a black display or an almost black display is made out of the n-row×m-column pixel matrix. This enables prevention of unnecessary light emission. The organic EL element OLED is not degraded when it does not emit light, and hence there is no need for detecting its characteristic.

<1.3.2 Updating of Offset Memory and Gain Memory>

Figure 18:
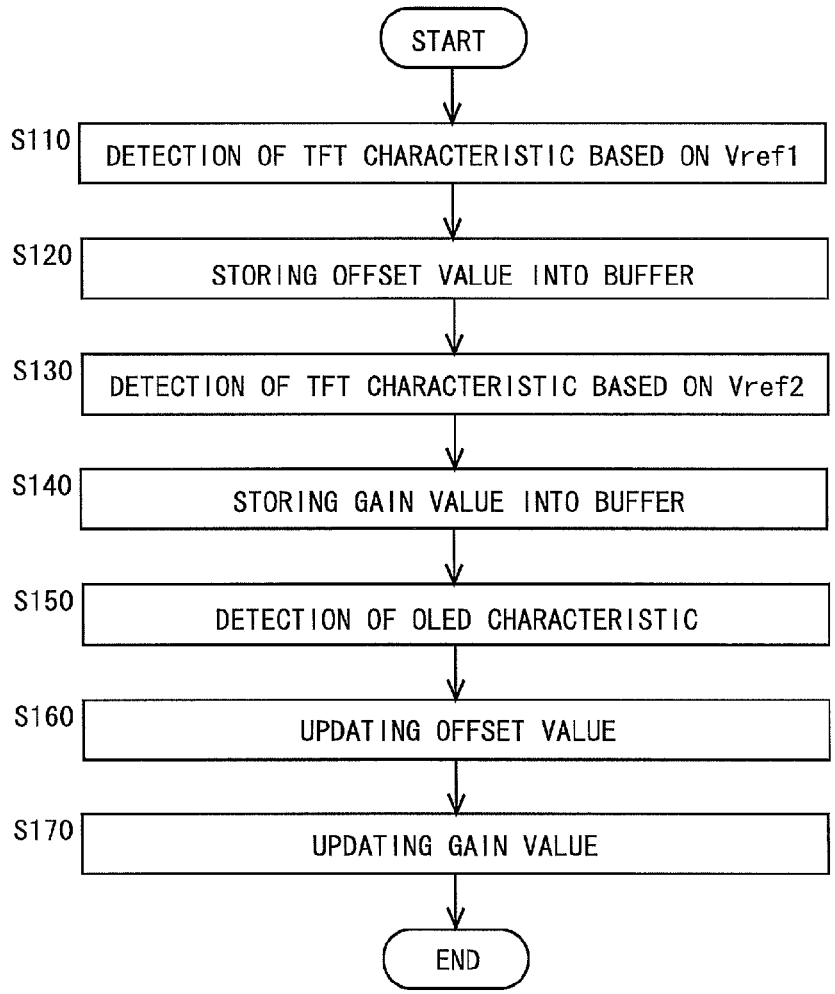
FIG. 18 is a flowchart for explaining a procedure for updating an offset memory and a gain memory in the first embodiment.

Next, a description will be given to how the offset value stored in the offset memory 51 and the gain value stored in the gain memory 52 are updated. FIG. 18 is a flowchart for explaining a procedure for updating the offset memory 51 and the gain memory 52. It is to be noted that here, attention is focused on an offset value and a gain value each corresponding to one pixel.

First, in the first half of the TFT characteristic detection period Ta, the TFT characteristic based on the first reference voltage Vref1 is detected (step S110). By this step S110, an offset value for correcting the video signal is obtained. The offset value obtained in step S110 is stored into the offset value buffer (step S120). In the last half of the TFT characteristic detection period Ta, the TFT characteristic based on the second reference voltage Vref2 is detected (step S130). By this step S130, a gain value for correcting the video signal is obtained. The gain value obtained in step S130 is stored into the gain value buffer (step S140).

Thereafter, in the light emission period Tc, the OLED characteristic is detected (step S150). By this step S150, a degradation correction coefficient and an offset value for correcting the video signal are obtained. Then, the sum of the offset value stored in the offset value buffer and the offset value obtained in step S150 is stored as a new offset value into the offset memory 51 (step S160). Further, the product of the gain value stored in the gain value buffer and the degradation correction coefficient obtained in step S150 is stored as a new gain value into the gain memory 52 (step S170).

In such a manner as above, the offset value and the gain value each corresponding to one pixel are updated. In the present embodiment, since detection of the TFT characteristic and the OLED characteristic for one row is performed in each frame, m offset values in the offset memory 51 and m gain values in the gain memory 52 are updated in each one frame.

It is to be noted that the characteristic data is realized by data (offset value, gain value, degradation correction coefficient) obtained based on detection results in steps S110, S130 and S150 in the present embodiment.

Incidentally, as described above, the light emission voltage of the organic EL element OLED is measured in the light emission period Tc. The larger the detected voltage as a measurement result thereof is, the larger the degree of degradation of the organic EL element OLED is. Therefore, the offset memory 51 and the gain memory 52 are updated such that the larger the detected voltage is the larger the offset value and the gain value become.

<1.3.3 Correction of Video Signal>

In the present embodiment, in order to compensate for the degradation of the drive transistor and the degradation of the organic EL element OLED, the video signal transmitted from the outside is corrected by use of the correction data stored in the offset memory 51 and the gain memory 52. Hereinafter, this correction of the video signal will be described.

Figure 19:
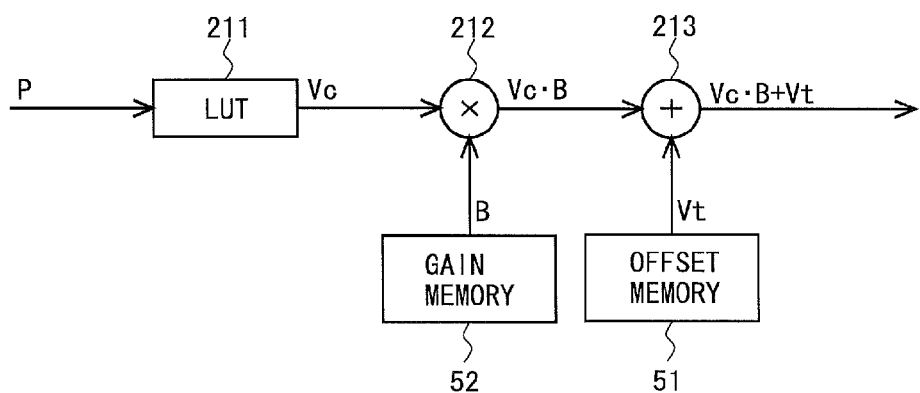
FIG. 19 is a diagram showing a configuration of a video signal correction portion in the first embodiment.

Correction of the video signal transmitted from the outside is performed in a video signal correction portion (not shown) in the control circuit 20. FIG. 19 is a diagram showing a configuration of the video signal correction portion. The video signal correction portion is provided with an LUT 211, a multiplication portion 212, and an addition portion 213. In such a configuration, a value of the video signal corresponding to each pixel is corrected as follows.

First, the video signal transmitted from the outside is subjected to gamma correction by use of the LUT 211. That is, a gradation P indicated by the video signal is converted to a control voltage Vc by the gamma correction. The multiplication portion 212 receives the control voltage Vc and a gain value B read from the gain memory 52, and outputs a value "Vc·B" obtained by multiplying the control voltage Vc and the gain value B. The addition portion 213 receives the value "Vc·B" outputted from the multiplication portion 212 and an offset value Vt read from the offset memory 51, and outputs a value "Vc·B+Vt" obtained by adding the value "Vc·B" and the offset value Vt. The value "Vc·B+Vt" obtained as described above is transmitted as the data signal DA from the control circuit 20 to the source driver 30.

<1.3.4 Summary of Driving Method>

Figure 1:
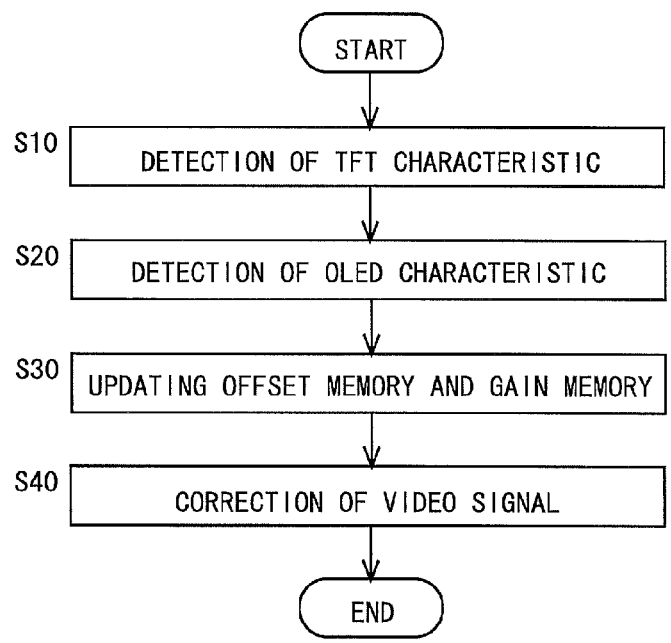
FIG. 1 is a flowchart for explaining an outline of an operation related to detection of a TFT characteristic and an OLED characteristic in a first embodiment of the present invention.

FIG. 1 is a flowchart for explaining an outline of an operation related to detection of the TFT characteristic and the OLED characteristic. First, on the monitor row, detection of the TFT characteristic is performed in the TFT characteristic detection period Ta (step S10). Next, on the monitor row, detection of the OLED characteristic is performed in the light emission period Tc (step S20). Thereafter, updating of the offset memory 51 and the gain memory 52 is performed by use of detection results in the steps S10 and S20. Then, correction of the video signal transmitted from the outside is performed by use of the correction data stored in the offset memory 51 and the gain memory 52 (step S40).

It is to be noted that the first characteristic detection step is realized by step S10, the second characteristic detection step is realized by step S20, the correction data storage step is realized by step S30, and the video signal correction step is realized by step S40, in the present embodiment. Further, the first characteristic detection processing is realized by the processing of step S10, and the second characteristic detection processing is realized by the processing of step S20.

<1.4 Effects>

Figure 20:
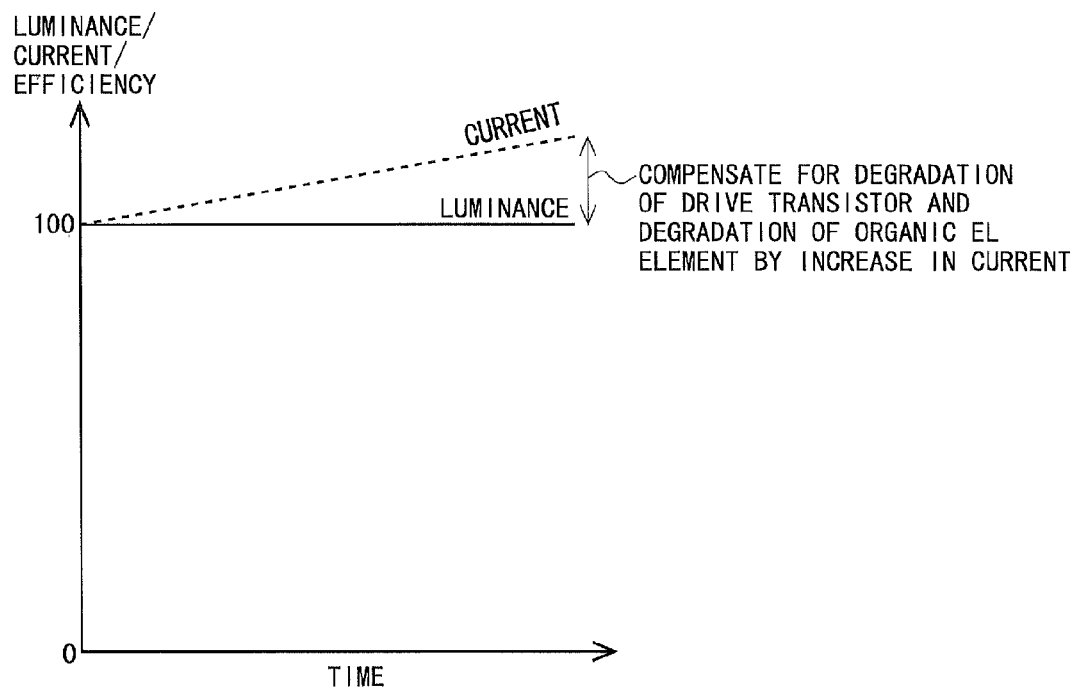
FIG. 20 is a diagram for explaining an effect in the first embodiment.

According to the present embodiment, detection of the TFT characteristic and the OLED characteristic for one row is performed in each frame. When attention is focused on the monitor row, in one frame period, the TFT characteristic is detected in a certain period (TFT characteristic detection period Ta) during the selection period, and the OLED characteristic is detected during the light emission period. Then, the video signal transmitted from the outside is corrected by use of correction data (offset value and gain value) obtained in consideration of both a detection result of the TFT characteristic and a detection result of the OLED characteristic. Since a data voltage based on the video signal (the data signal DA) corrected in this manner is applied to the data line S, a drive current with such magnitude as to compensate for the degradation of the drive transistor and the degradation of the organic EL element OLED is supplied to the organic EL element OLED, at the time of making the organic EL element OLED in each pixel circuit 11 emit light (see FIG. 20). Here, detection of the OLED characteristic is performed during the light emission period as described above. This prevents the length of the light emission period from becoming shorter than that of the conventional light emission period due to detection of the TFT characteristic and the OLED characteristic. As described above, according to the present embodiment, it is possible to simultaneously compensate for both the degradation of the drive transistor and the degradation of the organic EL element OLED without causing special light emission at the time of detecting characteristics in the organic EL display device.

Further, in the present embodiment, since an oxide TFT (specifically, IGZO-TFT) is employed for each of the transistors T1 to T3 in the pixel circuit 11, it is possible to obtain the effect of being able to ensure a sufficient S/N ratio. This will be described below. When the IGZO-TFT is compared with an LTPS (Low Temperature Poly Silicon)-TFT, off-current is extremely smaller in the IGZO-TFT than in the LTPS-TFT. For example, when the LTPS-TFT is employed for the transistor T3 in the pixel circuit 11, the off-current becomes approximately 1 pA at the maximum. In contrast, when the IGZO-TFT is employed for the transistor T3 in the pixel circuit 11, the off-current becomes approximately 10 fA at the maximum. Hence, for example, the off-current for 1000 rows becomes approximately 1 nA at the maximum when the LTPS-TFT is employed, and it becomes approximately 10 pA at the maximum when the IGZO-TFT is employed. A detected current is approximately from 10 to 100 nA when either TFT is employed. Incidentally, the monitor line M is connected to the pixel circuit 11 on the non-monitor row as well as to the pixel circuit 11 on the monitor row. Therefore, the S/N ratio of the monitor line M depends on the sum of leak currents of the transistors T3 on the non-monitor rows. Specifically, the S/N ratio of the monitor line M is represented by "detected current/(leak current×number of non-monitor rows)". Thus, for example in the organic EL display device having the display portion 10 of "Landscape FHD", the S/N ratio becomes approximately 10 when the LTPS-TFT is employed, whereas the S/N ratio becomes approximately 1000 when the IGZO-TFT is employed. In this manner, in the present embodiment, it is possible to ensure a sufficient S/N ratio at the time of detecting a current.

<1.5 Modified Example>

Hereinafter, modified examples of the first embodiment will be described. It should be noted that in the following, only aspects different from the first embodiment will be described in detail, and descriptions of similar aspects to the first embodiment will be omitted.

<1.5.1 First Modified Example>

Figure 21:
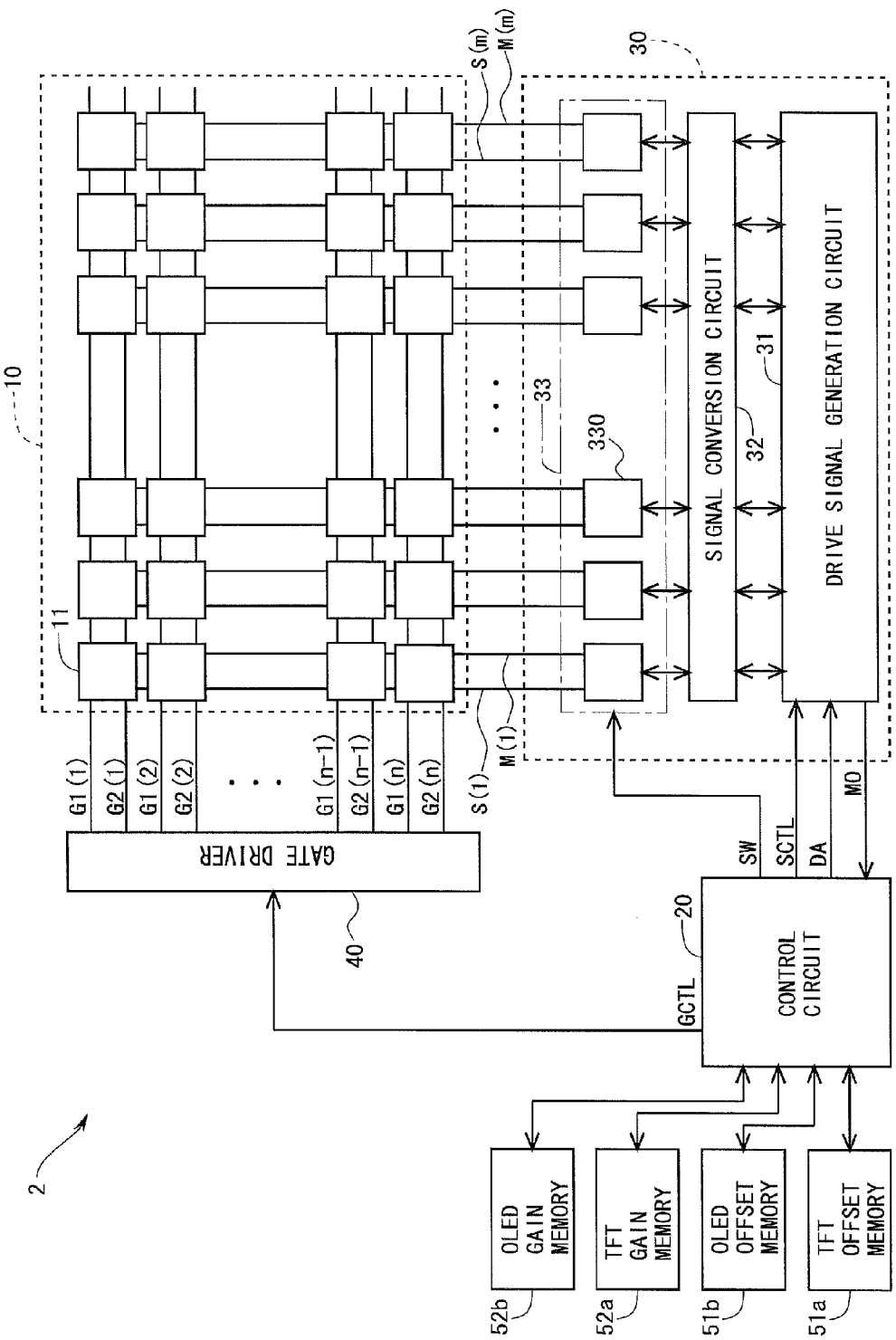
FIG. 21 is a block diagram showing a whole configuration of an organic EL display device in a first modified example of the first embodiment.

FIG. 21 is a block diagram showing a whole configuration of an active matrix-type organic EL display device 2 according to a first modified example of the first embodiment. In the present modified example, in place of the offset memory 51 and the gain memory 52 in the first embodiment, a TFT offset memory 51a, an OLED offset memory 51b, a TFT gain memory 52a, and an OLED gain memory 52b are provided. That is, in the present modified example, each of the offset memory and the gain memory is divided into a memory used for compensating for the degradation of the drive transistor and a memory used for compensating for the degradation of the organic EL element OLED.

The TFT offset memory 51a stores an offset value based on the detection result of the TFT characteristic. The OLED offset memory 51b stores an offset value based on the detection result of the OLED characteristic. The TFT gain memory 52a stores a gain value based on the detection result of the TFT characteristic. The OLED gain memory 52b stores a degradation correction coefficient based on the detection result of the OLED characteristic.

Concerning the characteristic detecting operation (FIG. 12), in the present modified example, the monitor line M is applied with a voltage being the sum of "the offset value stored in the OLED offset memory 51b" and "a voltage corresponding to a light emission voltage calculated from the degradation correction coefficient stored in the OLED gain memory 52b" in the black writing period Tb. Further, the length of the light emission time of the organic EL element OLED is adjusted based on the degradation correction coefficient stored in the OLED gain memory 52b. In the case of employing the configuration where the length of the light emission time of the organic EL element OLED is made constant and a current value is changed in accordance with a gradation, the magnitude of the current that is supplied to the monitor line M may be obtained based on the degradation correction coefficient stored in the OLED gain memory 52b.

Figure 22:
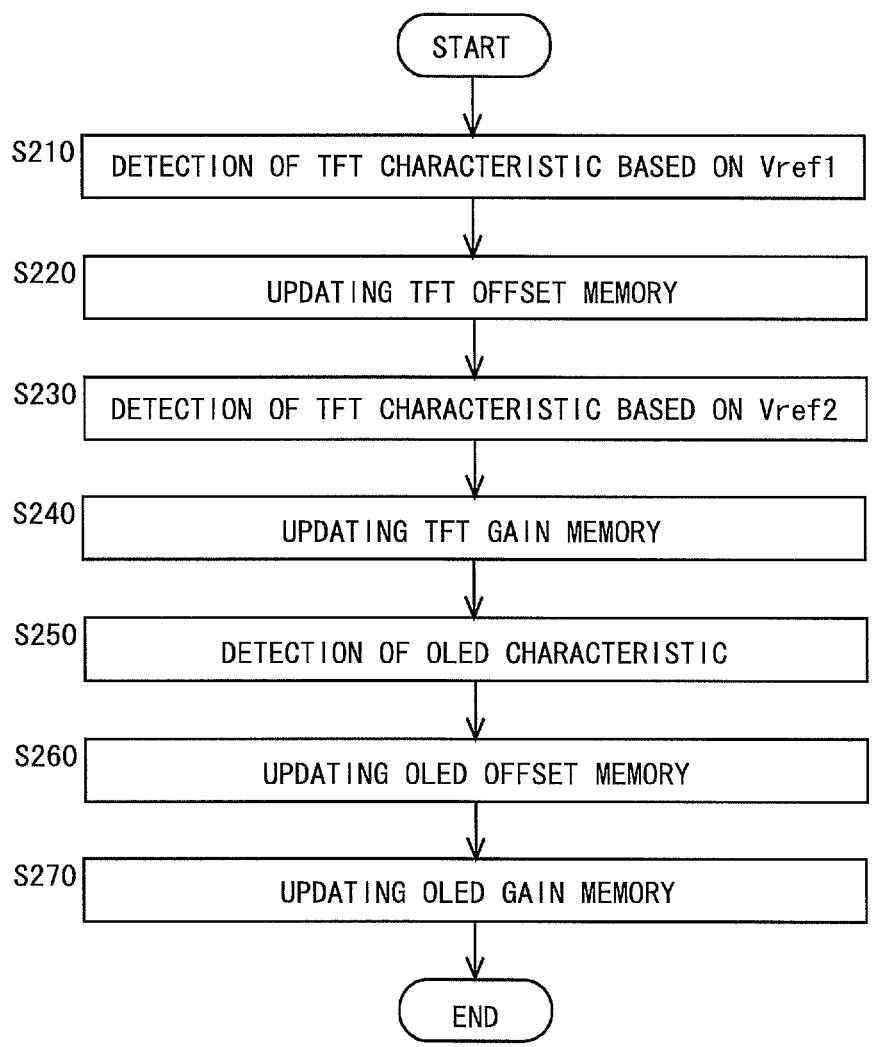
FIG. 22 is a flowchart for explaining a procedure for updating a TFT offset memory, an OLED offset memory, a TFT gain memory, and an OLED gain memory in the first modified example of the first embodiment.

Next, updating of the offset memory and the gain memory in the present modified example will be described. FIG. 22 is a flowchart for explaining a procedure for updating the TFT offset memory 51a, the OLED offset memory 51b, the TFT gain memory 52a, and the OLED gain memory 52b. It is to be noted that here, attention is focused on an offset value and a gain value each corresponding to one pixel.

First, in the first half of the TFT characteristic detection period Ta, the TFT characteristic is detected based on the first reference voltage Vref1 (step S210). By this step S210, an offset value for correcting the video signal is obtained. Then, the offset value obtained in step S210 is stored as a new offset value into the TFT offset memory 51a (step S220). In the last half of the TFT characteristic detection period Ta, the TFT characteristic is detected based on the second reference voltage Vref2 (step S230). By this step S230, a gain value for correcting the video signal is obtained. Then, the gain value obtained in step S230 is stored as a new gain value into the TFT gain memory 52a (step S240). Thereafter, in the light emission period Tc, the OLED characteristic is detected (step S250). By this step S250, a degradation correction coefficient and an offset value for correcting the video signal are obtained. Then, the offset value obtained in step S250 is stored as a new offset value into the OLED offset memory 51b (step S260). Further, the degradation correction coefficient obtained in step S250 is stored as a new degradation correction coefficient into the OLED gain memory 52b (step S270). In the present modified example, as described above, the offset memory and the gain memory are updated.

Next, the effect of the present modified example will be described. Concerning the characteristic detecting operation (FIG. 12), assuming that the potential of the monitor line M is made equal to the potential of the low-level power supply line ELVSS in the black writing period Tb, a delay may occur depending on a capacity of the monitor line M at the time of writing in the light emission period Tc. Time t_charge required for charging is represented by the following formula (1) when a difference between the light emission voltage of the organic EL element and the potential of the monitor line M immediately before writing is Vd; the magnitude of the current that is written into the monitor line M is i_L; and a load of the monitor line M is Cmp.

$$t\_charge = Cmp \cdot Vd / i\_L \quad (1)$$

Here, when Vd is 3V, i_L is 10 nA, and Cmp is 30 pF, the time t_charge required for charging is 9 milliseconds. When a drive frequency is 60 Hz, the length of one frame period is about 16 milliseconds, and hence a period not shorter than a half of one frame period is spent for charging. In this respect, in the present modified example, the monitor line M is applied with the voltage being the sum of "the offset value stored in the OLED offset memory 51b" and "the voltage corresponding to the light emission voltage calculated from the degradation correction coefficient stored in the OLED gain memory 52b" in the black writing period Tb. That is, before the light emission period Tc, the monitor line M is previously charged such that the potential of the monitor line M becomes a potential close to a light emission threshold of the organic EL element OLED. Thereby, Vd in the formula (1) decreases, leading to reduction in time required for charging.

Further, according to the present modified example, at the time of the characteristic detecting operation on the monitor row, the current that is supplied from the monitor line M to the organic EL element OLED in the light emission period To is adjusted based on the degradation correction coefficient stored in the OLED gain memory 52b. That is, the current is adjusted in accordance with the degree of degradation of the organic EL element OLED, thereby leading to compensation for deterioration in current efficiency. It should be noted that, at the time of the normal operation on the non-monitor row, compensation in consideration of both the degradation of the drive transistor and the degradation of the organic EL element OLED is performed.

Figure 23:
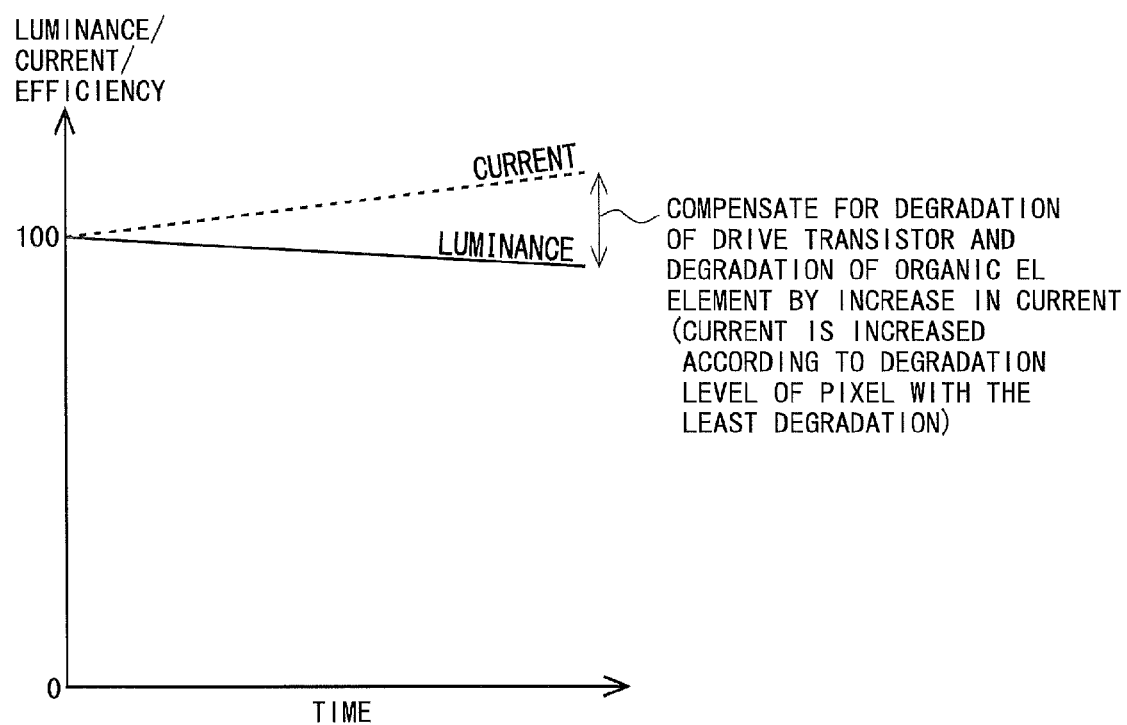
FIG. 23 is a diagram for explaining an effect in the first modified example of the first embodiment.

Moreover, in the present modified example, each of the offset memory and the gain memory is divided into the memory used for compensating for the degradation of the drive transistor and the memory used for compensating for the degradation of the organic EL element OLED. Hence it is possible to adjust the current that is supplied to the organic EL element in consideration only of the degradation of the organic EL element OLED. At that time, by increasing the current according to a degradation level of a pixel with the least degradation as shown in FIG. 23, it is possible to perform compensation on burning.

<1.5.2 Second Modified Example>

In the first embodiment, the monitor line M is configured to connect to either the current measurement portion 38 or the voltage measurement portion 39 as shown in FIG. 7. However, the present invention is not restricted to this, and it is also possible to employ a configuration where the monitor line M can be brought into the high impedance state (configuration of the present modified example).

Figure 24:
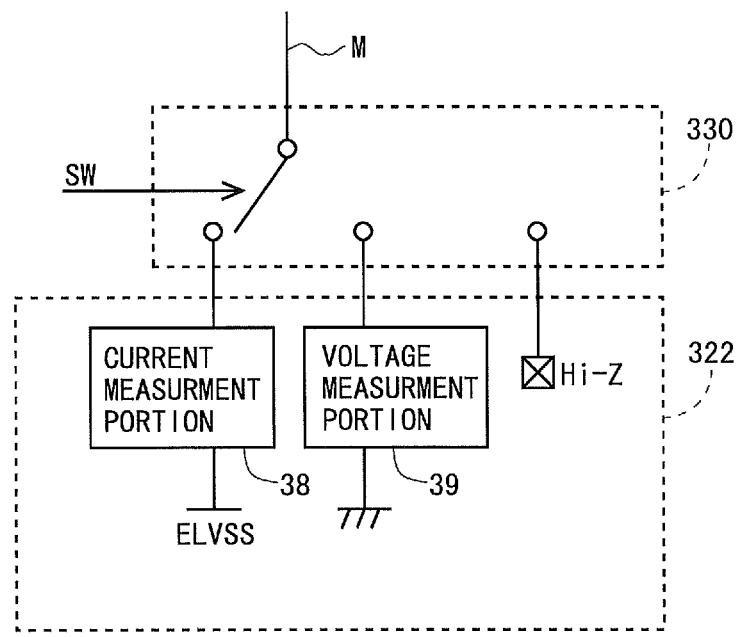
FIG. 24 is a diagram showing a configuration in the vicinity of one end of a monitor line in a second modified example of the first embodiment.

FIG. 24 is a diagram showing a configuration in the vicinity of one end of the monitor line M in the present modified example. As grasped from FIG. 24, the monitor line M is brought into any of the state of being connected to the current measurement portion 38, the state of being connected to the voltage measurement portion 39 and the high impedance state by the switching control signal SW, in the present modified example.

Incidentally, in the first embodiment, concerning adjustment of the length of the light emission time of the organic EL element OLED in the light emission period Tc (see FIG. 12), the higher the gradation is, the longer the period Tc1 in which the monitor line M is connected to the voltage measurement portion 39 is made, and the lower the gradation is, the longer the period Tc2 in which the monitor line M is connected to the current measurement portion 38 is made, as shown in FIG. 16. In contrast, according to the present modified example, the monitor line M can be brought into the high impedance state instead of being connected to the current measurement portion 38.

<1.5.3 Third Modified Example>

In the first embodiment, the description has been given on the premise that one monitor circuit 322 including the current measurement portion 38 and the voltage measurement portion 39 is provided for one column. However, the present invention is not restricted to this, and it is also possible to employ a configuration where one monitor circuit 322 is shared by a plurality of columns (configuration of the present modified example).

Figure 25:
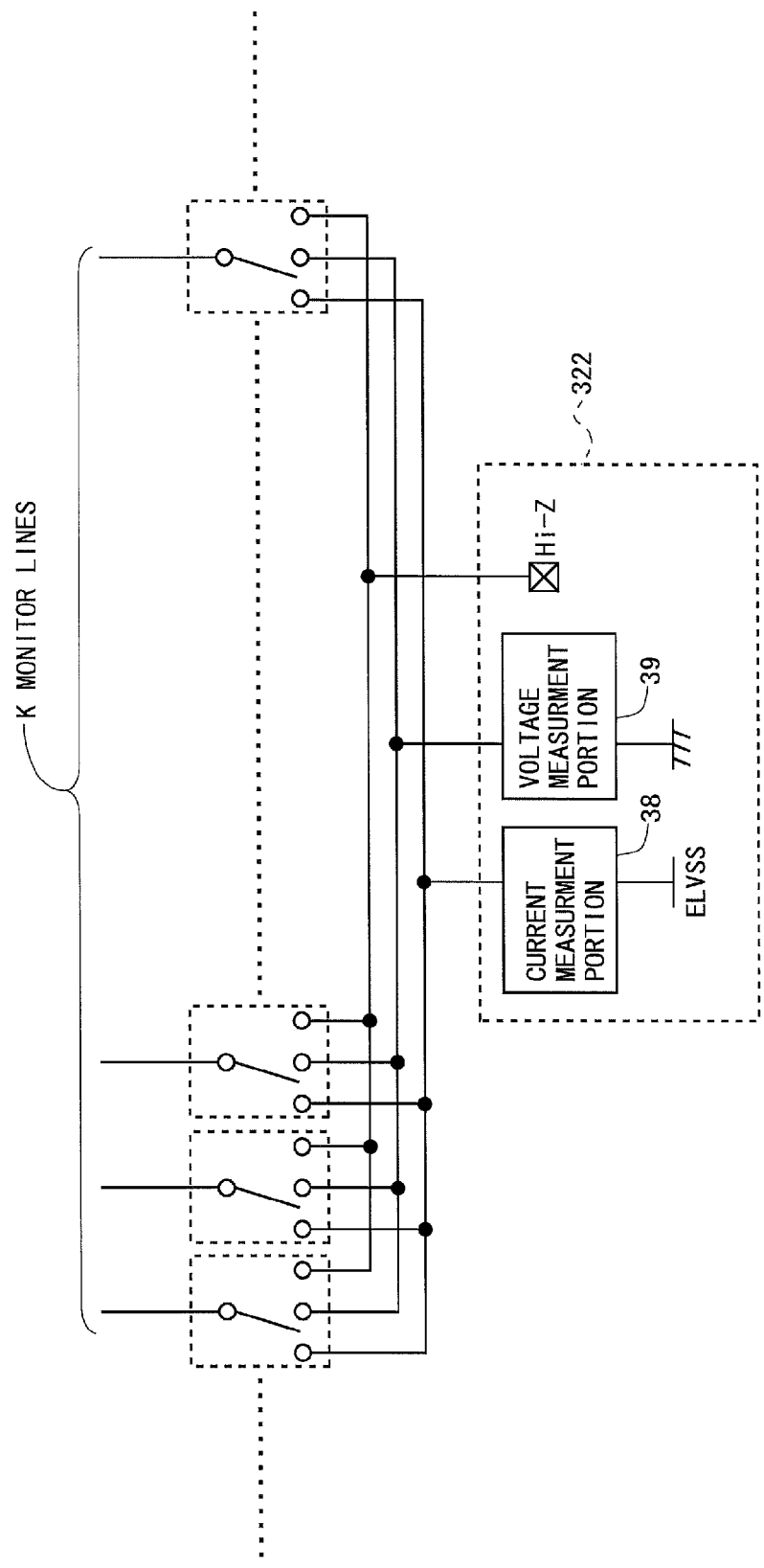
FIG. 25 is a diagram showing a configuration in the vicinity of one end of a monitor line in a third modified example of the first embodiment.

In the present modified example, similarly to the second modified example (see FIG. 24), the monitor line M is brought into any of the state of being connected to the current measurement portion 38, the state of being connected to the voltage measurement portion 39, and the high impedance state. Further, in the present modified example, the vicinity of one end of the monitor line M has a configuration shown in FIG. 25. That is, one monitor circuit 322 is provided for each K monitor lines M.

In such a configuration as above, in each frame, only one column out of K columns corresponding to the K monitor lines M is taken as a column on which detection of the TFT characteristic and the OLED characteristic is performed (hereinafter referred to as a "characteristic detection object column). At the time of the characteristic detecting operation on the monitor row, the monitor lines M on the columns other than the characteristic detection object column are held in the high impedance state. Further, at the time of the characteristic detecting operation on the monitor row, not the reference voltage Vref but a normal data voltage (voltage corresponding to a target luminance) is applied to a data line D on the columns other than the characteristic detection object column. During the light emission period Tc, the transistor T3 is in the on-state on the monitor row, but the monitor line M is in the high impedance state on the columns other than the characteristic detection object column. For this reason, on each of the columns other than the characteristic detection object column, a current does not flow in the monitor line M but flows in the organic EL element OLED, and the organic EL element OLED emits light as in the normal operation. On the characteristic detection object column out of the monitor row, the foregoing characteristic detecting operation is performed.

For example, in the organic EL display device having the display portion 10 of "Landscape FHD" and a drive frequency of 60 Hz, the time required for monitoring (detection of the TFT characteristic and the OLED characteristic) for one column is 18 seconds (=1080/60). Here, in order to make an offset value and a gain value each corresponding to each pixel updated, for example, every 30 minutes (1800 seconds), the configuration may be such that one monitor circuit 322 is provided for each 100 monitor lines M.

Thus, according to the present modified example, it is possible to simultaneously compensate for both the degradation of the drive transistor and the degradation of the organic EL element OLED without causing special light emission at the time of detecting characteristics, while suppressing an increase in circuit area, in the organic EL display device.

<1.5.4 Fourth Modified Example>

Figure 26:
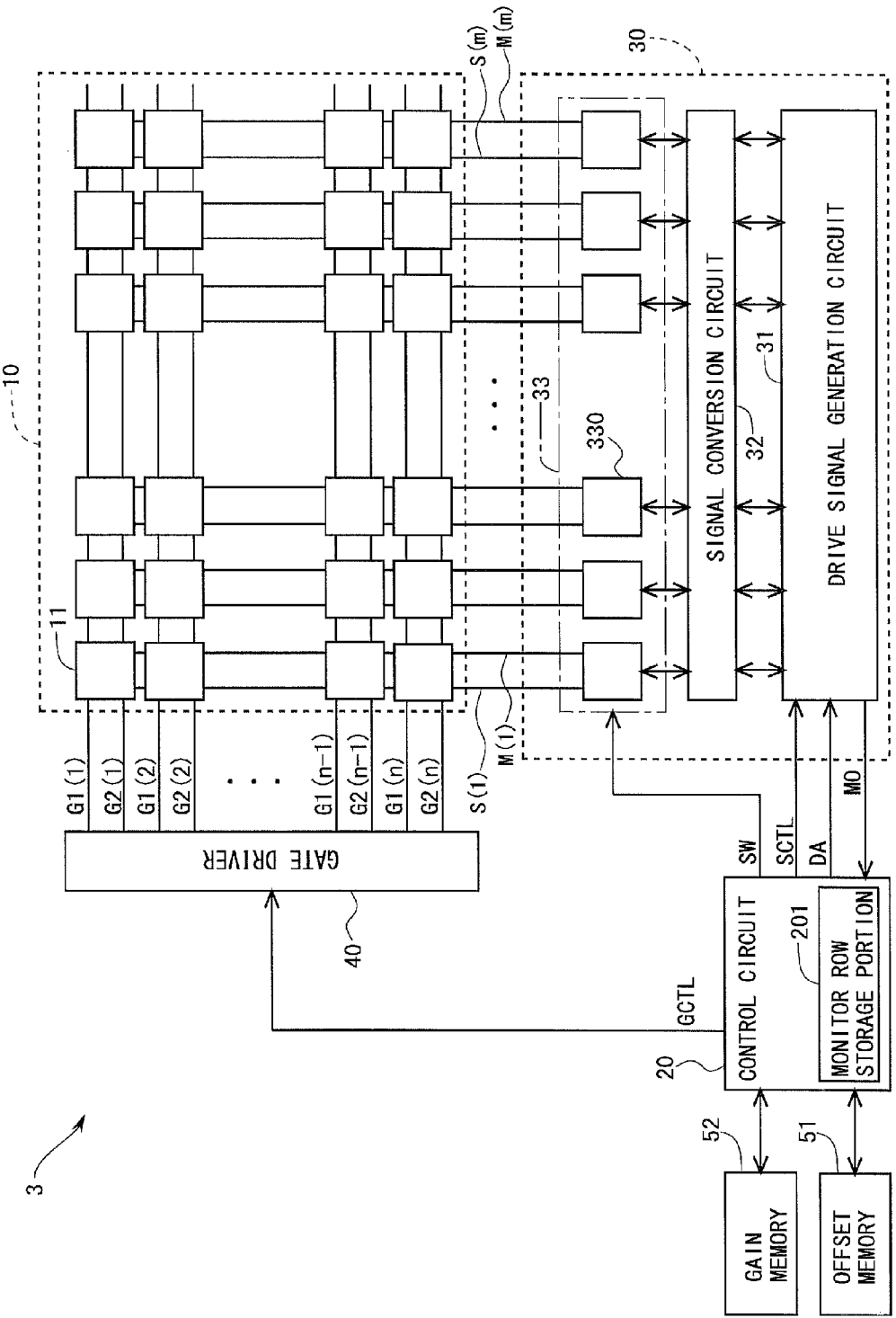
FIG. 26 is a block diagram showing a whole configuration of an organic EL display device of a fourth modified example of the first embodiment.

According to the first embodiment, when a short-time operation of the organic EL display device 1 is repeated, there is generated a large difference in number of times of detection of the TFT characteristic and the OLED characteristic between an upper row of the display portion 10 and a lower row of the display portion 10. Then, in an organic EL display device 3 according to the present modified example, a monitor row storage portion 201 for storing a monitor row is provided in the control circuit 20 as shown in FIG. 26. In such a configuration, at the time of power-off, information specifying a row on which the TFT characteristic and the OLED characteristic have been last detected is stored into the monitor row storage portion 201. The monitor region storage step is realized by this processing. After power-on, the TFT characteristic and the OLED characteristic are detected from a row next to the row specified based on the information stored in the monitor row storage portion 201. It should be noted that the monitor region storage portion is realized by the monitor row storage portion 201 in the present embodiment.

Thus, according to the present modified example, a difference in number of times of detection of the TFT characteristic and the OLED characteristic between the upper row of the display portion 10 and the lower row of the display portion 10 is prevented from being generated. Hence it is possible to uniformly compensate for the degradation of the drive transistor and the degradation of the organic EL element OLED throughout the screen, so as to effectively prevent occurrence of variations in luminance.

It is to be noted that the row on which the TFT characteristic and the OLED characteristic are first detected after the power-on is not restricted to the row next to the row specified based on the information stored in the monitor row storage portion 201. It may be a row in the vicinity of the row specified based on the information stored in the monitor row storage portion 201. For example, there may exist a row on which the characteristic detecting operation is performed twice immediately before the power-off and immediately after the power-on.

Further, information specifying a column on which the TFT characteristic and the OLED characteristic have been last detected may be stored, or information specifying both the row and the column on which the TFT characteristic and the OLED characteristic have been last detected may be stored.

<1.5.5 Fifth Modified Example>

Figure 27:
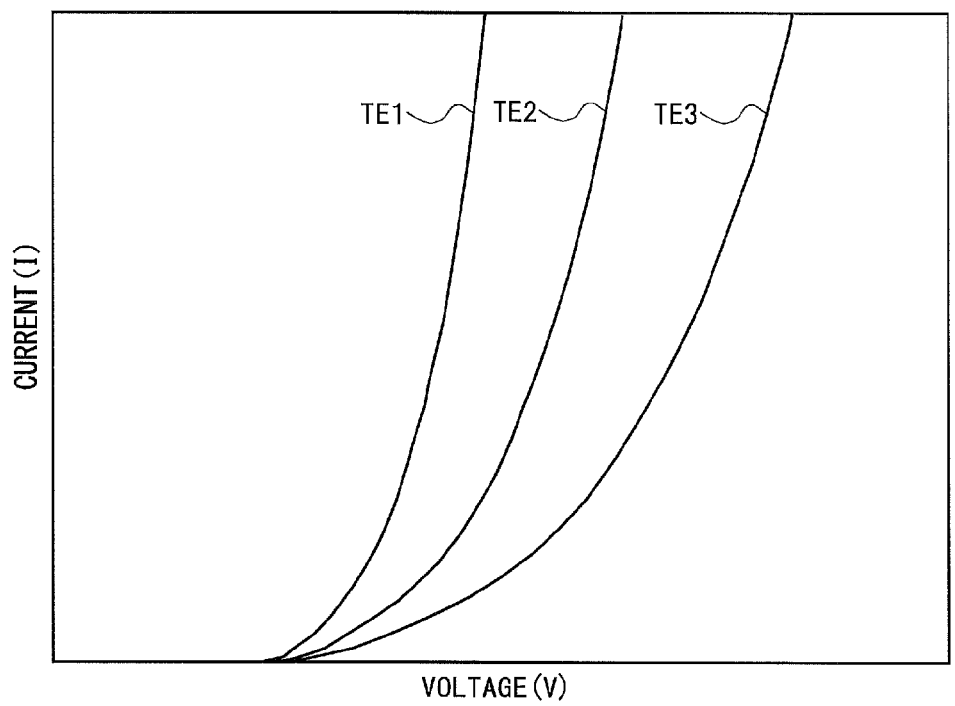
FIG. 27 is a diagram for explaining temperature dependency of a current-voltage characteristic of an organic EL element.

FIG. 27 is a diagram for explaining temperature dependency of a current-voltage characteristic of the organic EL element. FIG. 27 shows a current-voltage characteristic of the organic EL element at a temperature TE1, a current-voltage characteristic of the organic EL element at a temperature TE2, and a current-voltage characteristic of the organic EL element at a temperature TE3. It is to be noted: "TE1>TE2>TE3" is satisfied. As grasped from FIG. 27, in order to supply a predetermined current to the organic EL element, the lower temperature is, the higher the voltage is required to be made. As thus described, the current-voltage characteristic of the organic EL element depends greatly on the temperature. Hence it is preferable to employ a configuration capable of compensating for a temperature change (configuration of the present modified example).

Figure 28:
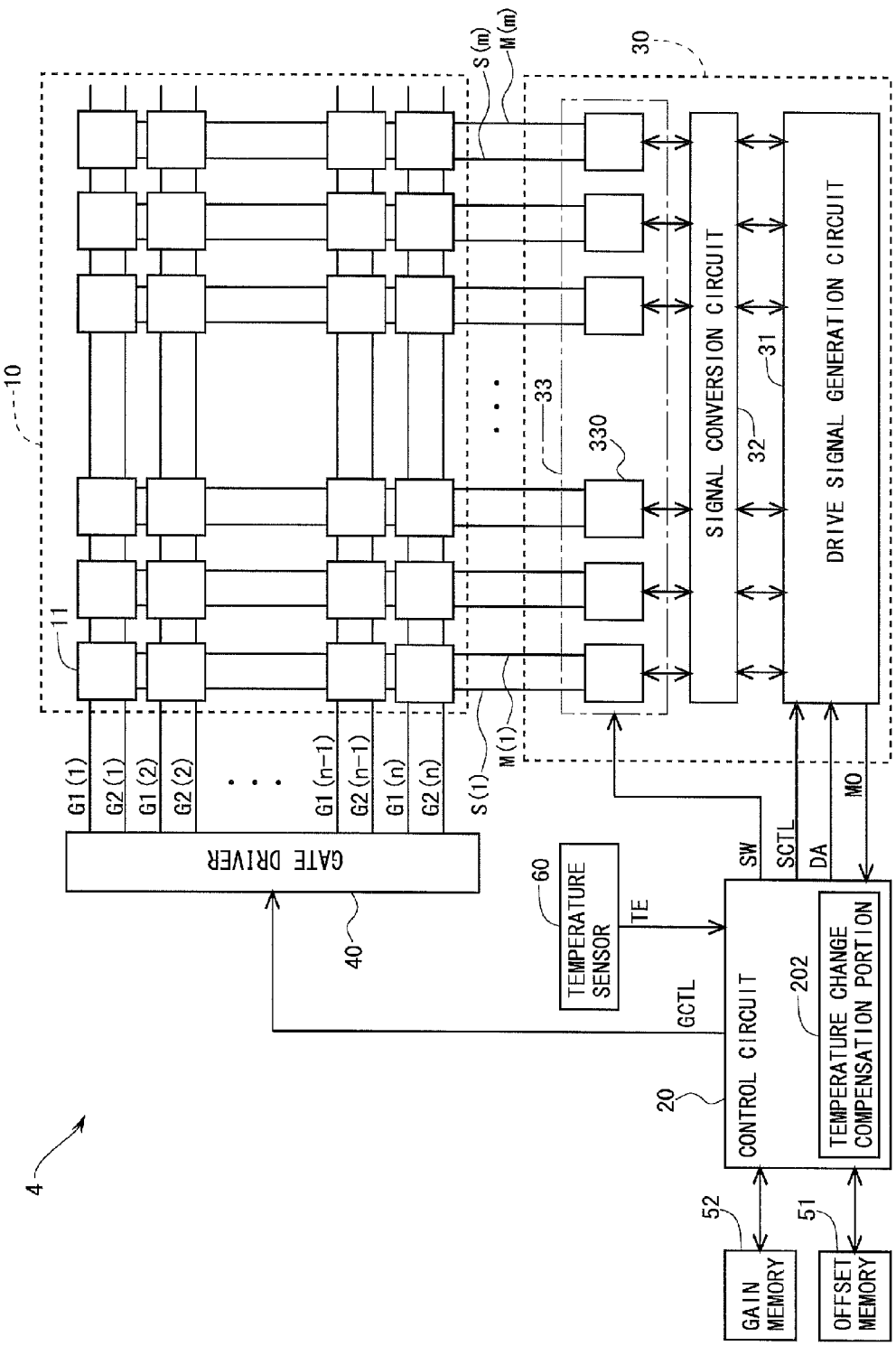
FIG. 28 is a block diagram showing a whole configuration of an organic EL display device in a fifth modified example of the first embodiment.

FIG. 28 is a block diagram showing a whole configuration of an organic EL display device 4 in the present modified example. In the present modified example, a temperature sensor 60 is provided in addition to the constitutional elements in the first embodiment. Further, the control circuit 20 is provided with a temperature change compensation portion 202. The temperature sensor 60 gives temperature information TE as a result of measurement of a temperature to the control circuit 20 as needed. The temperature change compensation portion 202 makes correction on the monitor data MO given from the source driver 30 based on the temperature information TE. Specifically, the temperature change compensation portion 202 converts a value of the monitor data MO corresponding to a temperature at the time of detection to a value corresponding to a certain standard temperature, and updates the offset value in the offset memory 51 and the gain value in the gain memory 52 based on the value obtained by the conversion.

It is to be noted that the temperature detection step is realized by the processing of the temperature sensor 60, and the temperature change compensation step is realized by the processing of the temperature change compensation portion 202.

Figure 29:
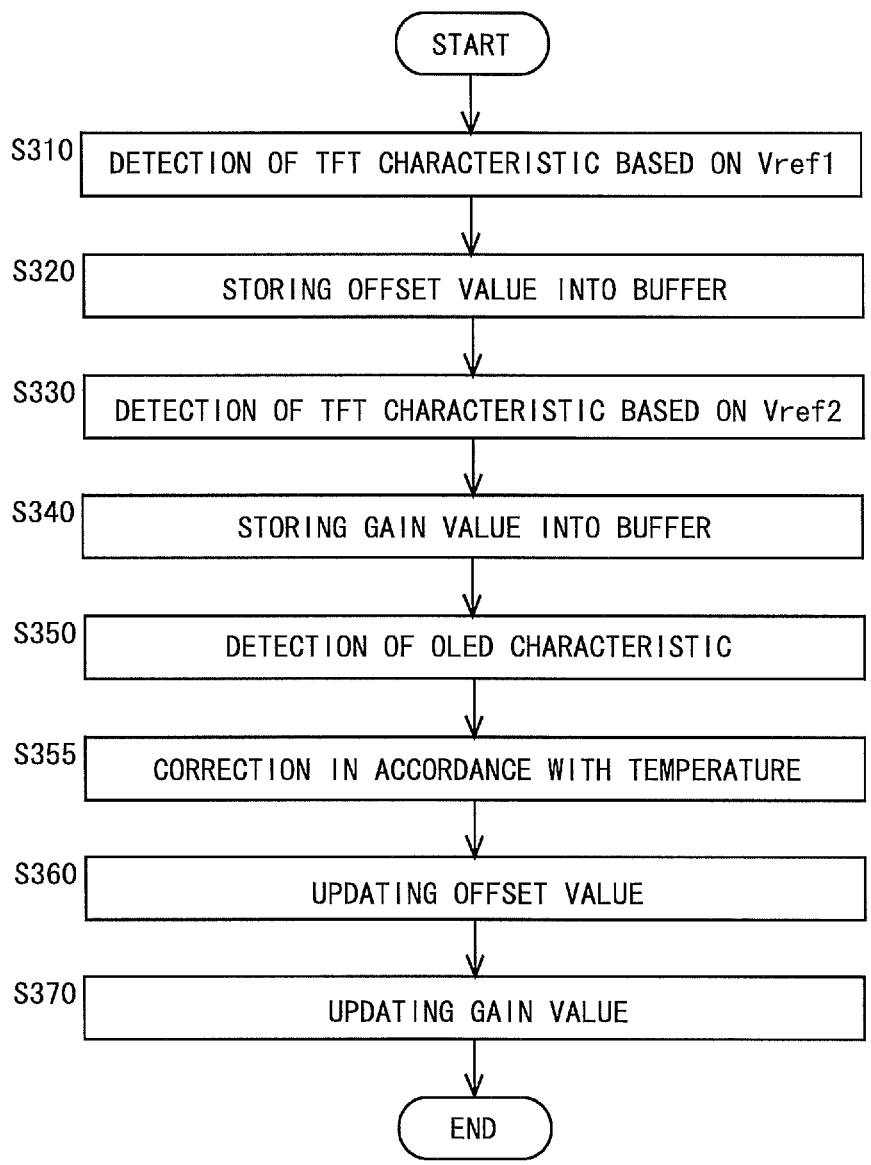
FIG. 29 is a flowchart for explaining a procedure for updating an offset memory and a gain memory in the fifth modified example of the first embodiment.

FIG. 29 is a flowchart for explaining a procedure for updating the offset memory 51 and the gain memory 52 in the present modified example. It is to be noted that the pieces of processing in steps S310 to S350 in the present modified example (FIG. 29) are the same as those in steps S110 to S150 in the first embodiment (FIG. 18), and the pieces of processing in steps S360 to S370 in the present modified example (FIG. 29) are the same as those in steps S160 and S170 in the first embodiment (FIG. 18). In the present modified example, the offset value and the gain value are corrected based on the temperature information TE given by the temperature sensor 60 after the OLED characteristic has been detected and before the offset value and the gain value are updated (step S355).

Thus, according to the present modified example, the video signal transmitted from the outside is corrected by correction data (offset value and gain value) in consideration of the temperature change. Therefore, it is possible to simultaneously compensate for both the degradation of the drive transistor and the degradation of the organic EL element OLED regardless of the temperature change, in the organic EL display device.

<1.5.6 Sixth Modified Example>

In the first embodiment, detection of the OLED characteristic is performed by measuring the voltage of the positive electrode of the organic EL element OLED in the state where the constant current is given to the organic EL element OLED. However, the present invention is not restricted to this. The configuration may be such that detection of the OLED characteristic is performed by measuring a current flowing in the organic EL element OLED in the state of a constant voltage being given to the organic EL element OLED (configuration of the present modified example).

Figure 30:
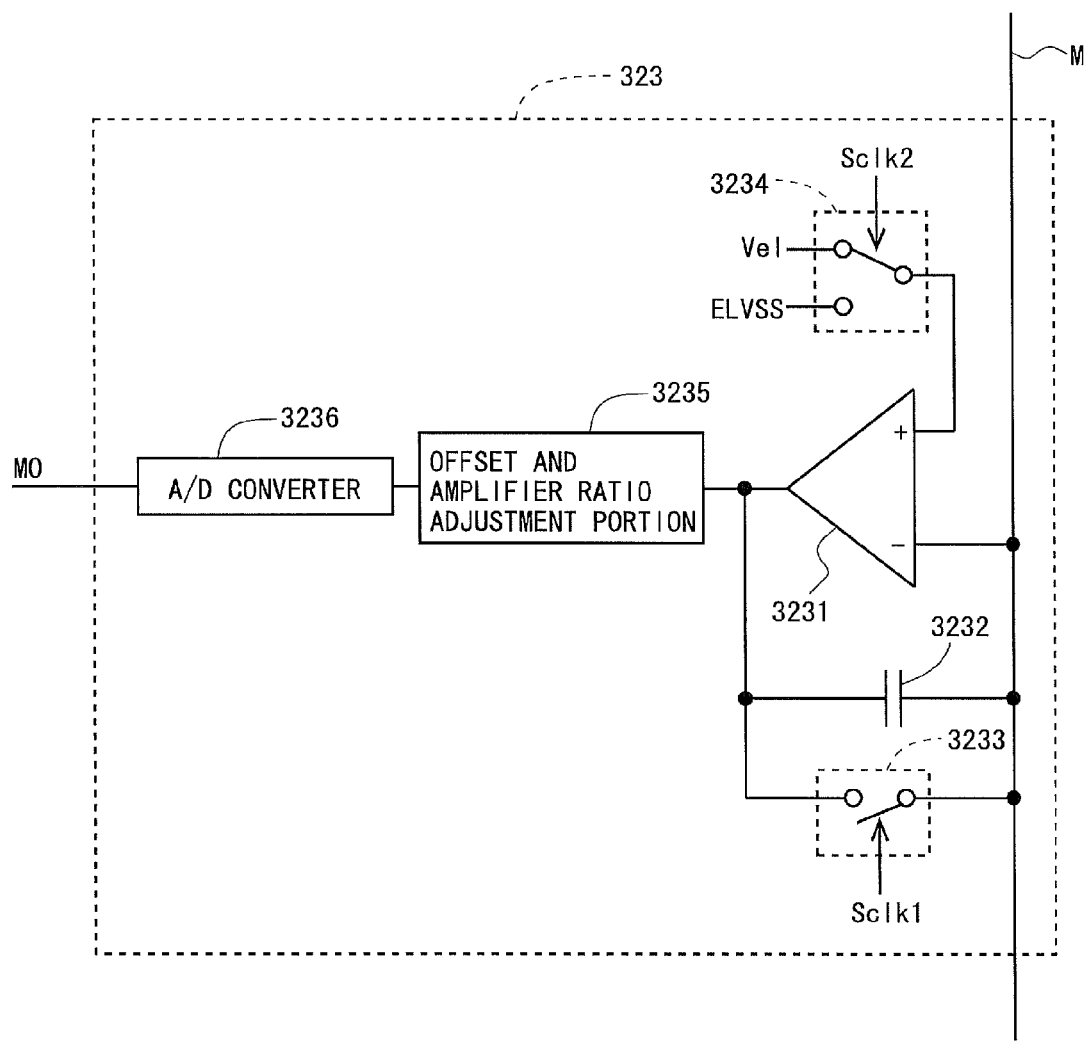
FIG. 30 is a diagram showing a detailed configuration of a monitor circuit in a sixth modified example of the first embodiment.

In the present modified example, both detection of the TFT characteristic and detection of the OLED characteristic are performed by measuring a current. Therefore, there is no need to provide a constitutional element for measuring a voltage in the monitor circuit. Accordingly, in the present modified example, the configuration of the monitor circuit is different from that in the first embodiment. FIG. 30 is a diagram showing a detailed configuration of a monitor circuit 323 in the present modified example. This monitor circuit 323 includes an operation amplifier 3231, a capacitor 3232, a first switch 3233, a second switch 3234, an offset and amplifier ratio adjustment portion 3235, and an A/D converter 3236. As for the operation amplifier 3231, a non-inverting input terminal is connected to the second switch 3234, and an inverting input terminal is connected to the monitor line M. The capacitor 3232 and the first switch 3233 are provided between an output terminal of the operation amplifier 3231 and the monitor line M. The offset and amplifier ratio adjustment portion 3235 is provided between the output terminal of the operation amplifier 3231 and the A/D converter 3236. The second switch 3234 functions as a switch for switching a potential of the non-inverting input terminal of the operation amplifier 3231 between the potential of the low-level power supply line ELVSS and an OLED characteristic detection potential Vel. As thus described, this monitor circuit 323 is formed of an integration circuit. It is to be noted that the OLED characteristic detection potential Vel is a potential corresponding to the sum of "a difference between the offset value stored in the offset memory 51 and the offset value obtained in the TFT characteristic detection period Ta" (first value) and "a voltage corresponding to a light emission voltage calculated from the gain value stored in the gain memory 52 and the gain value obtained in the TFT characteristic detection period Ta" (second value).

In such a configuration as above, at the time of measuring a current for detecting the TFT characteristic, a similar operation to that in the first embodiment is performed in a state where the potential of the non-inverting input terminal of the operation amplifier 3231 is set to the potential of the low-level power supply line ELVSS by a second control clock signal Sclk2. At the time of measuring a current for detecting the OLED characteristic, first, the first switch 3233 is brought into the on-state by a first control clock signal Sclk1, while the potential of the non-inverting input terminal of the operation amplifier 3231 is set to the OLED characteristic detection potential Vel by the second control clock signal Sclk2. This brings the state between the output terminal and the inverting input terminal of the operation amplifier 3231 into the short-circuited state, and the potential of the monitor line M becomes equal to the OLED characteristic detection potential Vel. Then, the first switch 3233 is brought into the off-state by the first control clock signal Sclk1. Accordingly, due to the existence of the capacitor 3232, the potential of the output terminal of the operation amplifier 3231 changes in accordance with magnitude of a current flowing in the monitor line M (a source current that is supplied to the organic EL element OLED). That change in potential is reflected to a digital signal that is outputted from the A/D converter 3236. The digital signal is then outputted as the monitor data MO from the monitor circuit 323. It is to be noted that the offset and amplifier ratio adjustment portion 3235 has the function of making the level of input into the A/D converter 3236 the same between the time of detecting the TFT characteristic and the time of detecting the OLED characteristic.

In the present modified example, in such a manner as above, detection of the OLED characteristic is performed by measuring a current flowing in the organic EL element OLED in the state of a constant voltage being given to the organic EL element OLED. This allows reduction in measurement time.

It is to be noted that the magnitude of the constant voltage that is given to the organic EL element OLED may be obtained based on a degradation correction coefficient obtained from a difference between the gain value stored in the gain memory 52 and the gain value obtained in the TFT characteristic detection period Ta. Further, in a case where the TFT offset memory 51a, the OLED offset memory 51b, the TFT gain memory 52a, and the OLED gain memory 52b are provided in place of the offset memory 51 and the gain memory 52 (see the first modified example), the magnitude of the constant voltage that is given to the organic EL element OLED may be obtained based on the degradation correction coefficient stored in the OLED gain memory 52b.

Further, at the time of detecting the OLED characteristic, the length of the time for giving the constant voltage to the organic EL element OLED is preferably adjusted in accordance with a target luminance. Further, when the integrated value of the light emission current in one frame period becomes the value corresponding to a desired gradation, a voltage value may be changed during the light emission period Tc, to measure the characteristic (current-voltage characteristic) at a plurality of operation points.

2.1 Second Embodiment

<2.1 Whole Configuration>

Figure 31:
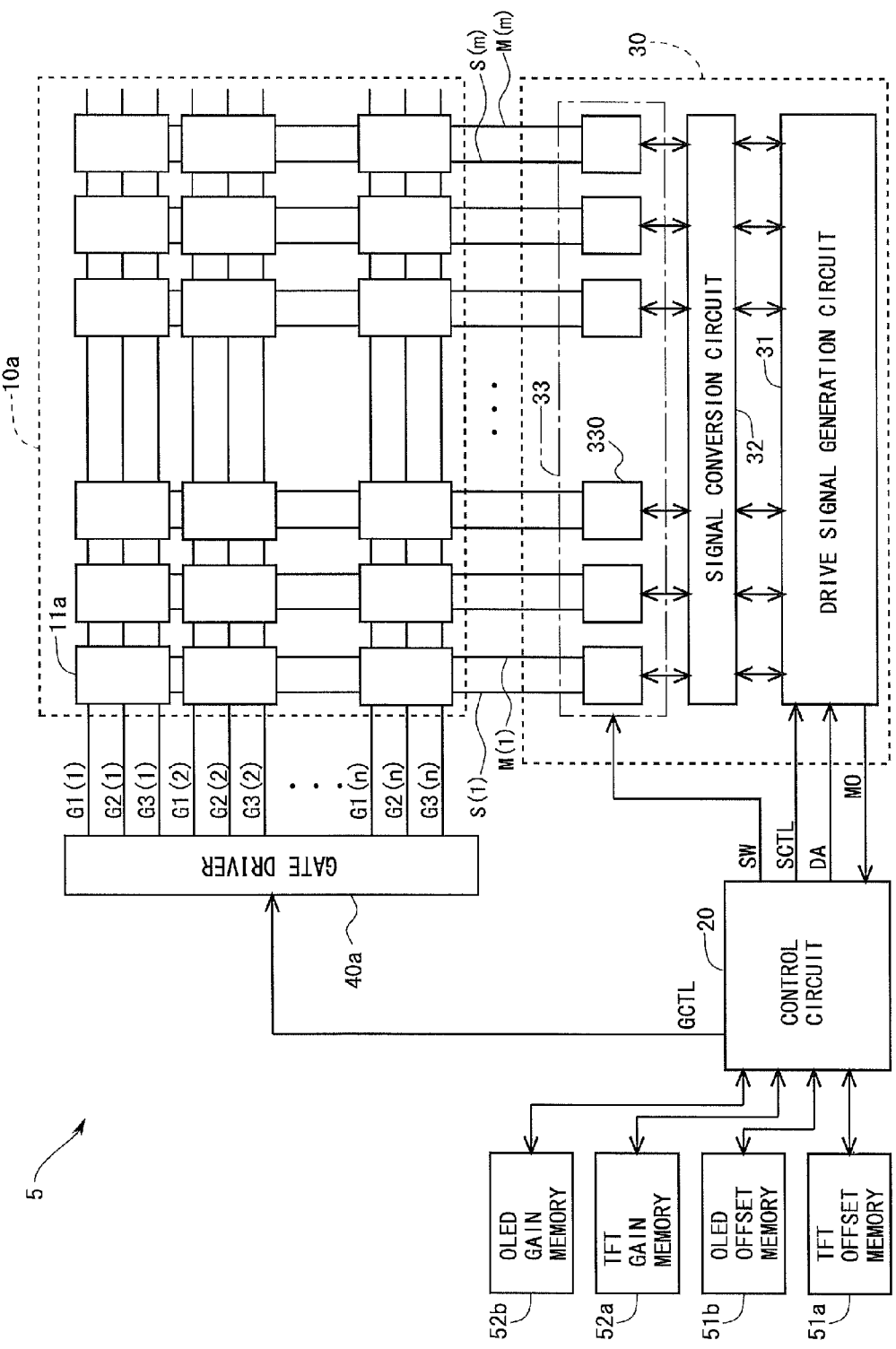
FIG. 31 is a block diagram showing a whole configuration of an active matrix-type organic EL display device according to a second embodiment of the present invention.

FIG. 31 is a block diagram showing a whole configuration of an active matrix-type organic EL display device 5 according to a second embodiment of the present invention. In the present embodiment, a display portion 10a is provided with n high-level power supply control lines G3(1) to G3(n) in addition to the m data lines S(1) to S(m), the m monitor lines M(1) to M(m), the n scanning lines G1(1) to G1(n), and the n monitor control lines G2(1) to G2(n), as shown in FIG. 31. The scanning lines G1(1) to G1(n), the monitor control lines G2(1) to G2(n), and the high-level power supply control lines G3(1) to G3(n) are parallel to each other. It is to be noted that, in the following, the high-level power supply control line is simply denoted by symbol G3 when the n high-level power supply control lines G3(1) to G3(n) are not required to be distinguished from each other. The control circuit 20 and the source driver 30 are similar to those in the first embodiment, and hence descriptions thereof will be omitted.

A gate driver 40a in the present embodiment is connected to the n scanning lines G1(1) to G1(n), the n monitor control lines G2(1) to G2(n), and the n high-level power supply control lines G3(1) to G3(n). The gate driver 40a is formed of a shift register, a logic circuit, and the like. Incidentally, in the present embodiment, differently from the first embodiment, either detection of the TFT characteristic for one row or detection of the OLED characteristic for one row is performed in each frame. It is to be noted that, concerning the present embodiment, a row on which the TFT characteristic is detected or the OLED characteristic is detected is referred to as a "monitor row". Further, in the following, a frame in which detection of the TFT characteristic is performed is referred to as a "TFT characteristic detection frame", and a frame in which detection of the OLED characteristic is performed is referred to as an "OLED characteristic detection frame".

In the present embodiment, when detection of the OLED characteristic for the first row is performed in one frame, detection of the OLED characteristic for the second row is performed in the next frame, and further, detection of the OLED characteristic for the third row is performed in the further next frame. Thereafter, the OLED characteristics for the fourth to nth rows are sequentially detected. After detection of the OLED characteristic for the nth row has been performed, detection of the TFT characteristic for the first row is performed. Thereafter, the TFT characteristics for the second to nth rows are sequentially detected. In this manner, detection of the TFT characteristic and detection of the OLED characteristic are performed in different frames. However, in the TFT characteristic detection frame and the OLED characteristic detection frame, the gate driver 40*a* drives the scanning line G1, the monitor control line G2, and the high-level power supply control line G3 in the same manner.

Figure 32:
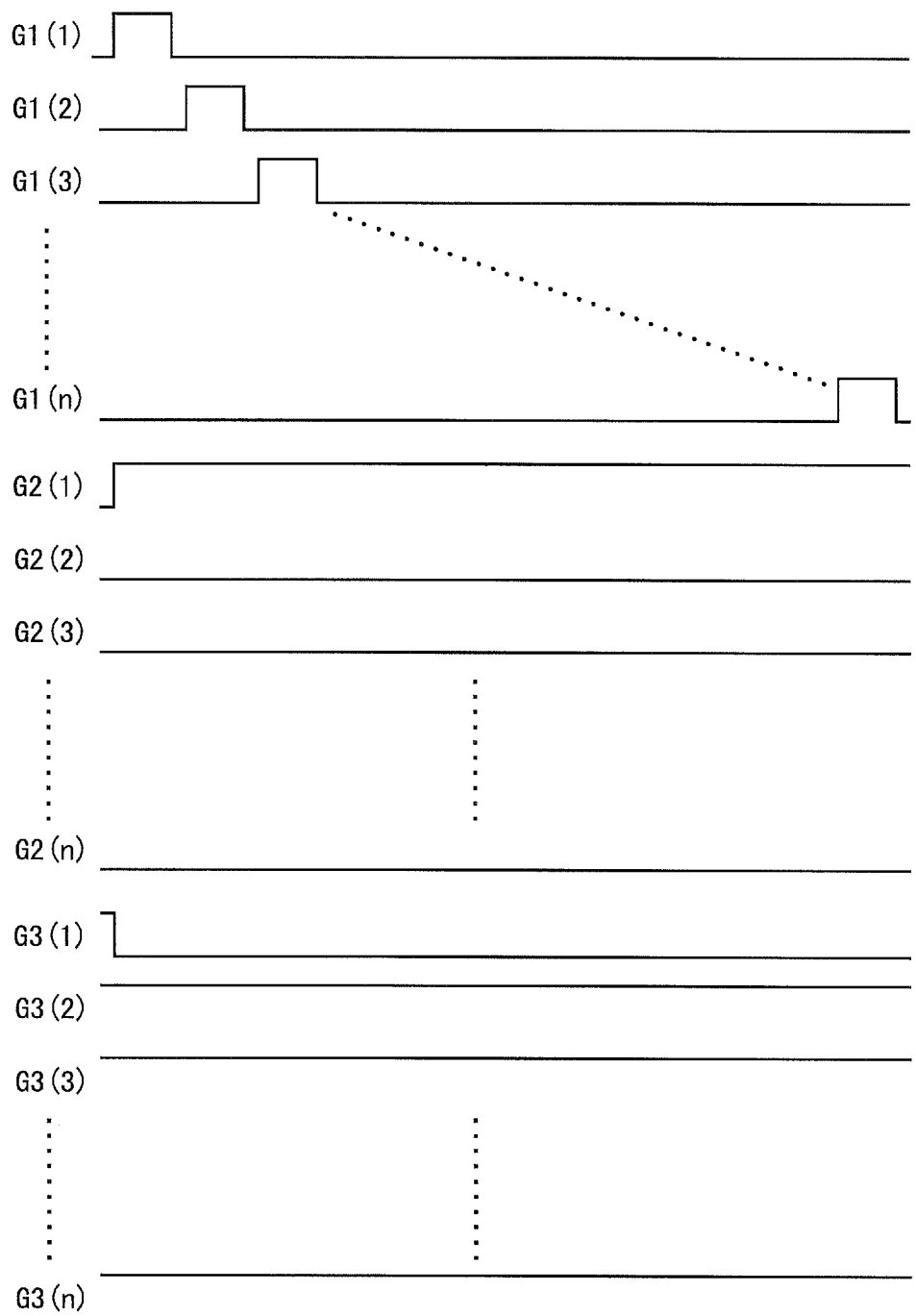
FIG. 32 is a timing chart for explaining an operation of a gate driver in the second embodiment.
Figure 33:
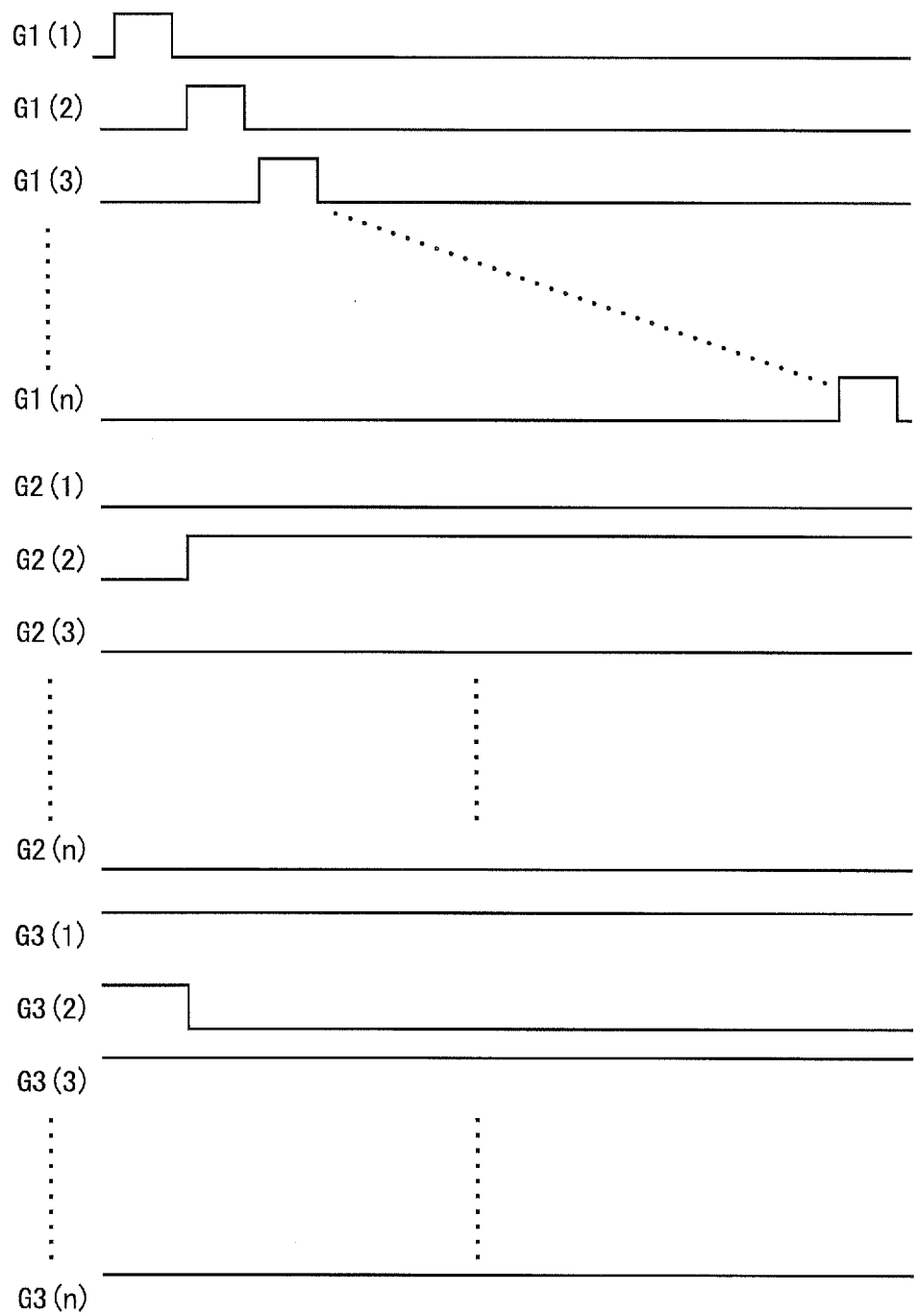
FIG. 33 is a timing chart for explaining the operation of the crate driver in the second embodiment.
Figure 34:
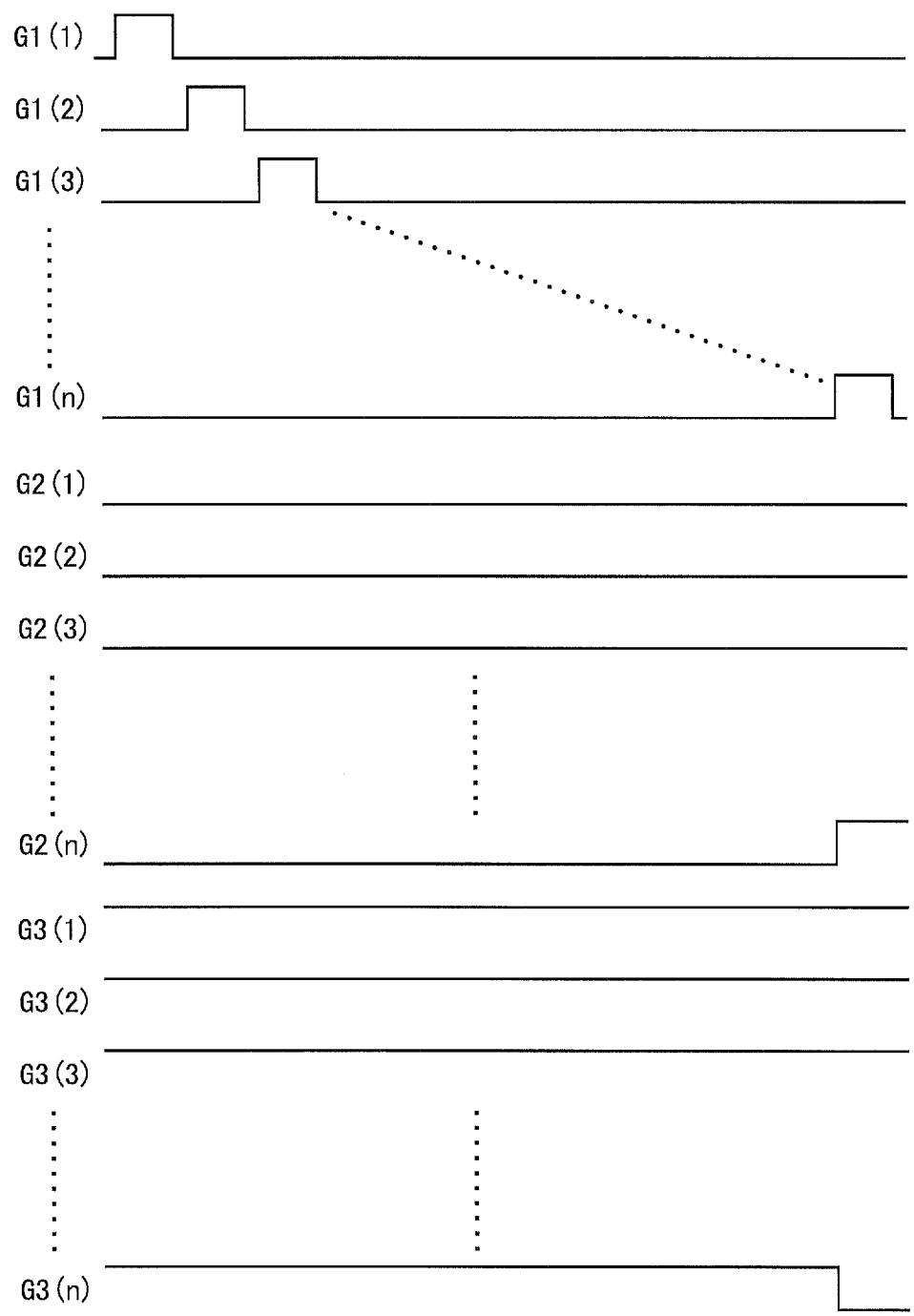
FIG. 34 is a timing chart for explaining the operation of the gate driver in the second embodiment.

Here, when the frame in which detection of the OLED characteristic for the first row is performed is defined as a (k+1) th frame, the n scanning lines G1(1) to G1(*n*), the n monitor control lines G2(1) to G2(*n*), and the n high-level power supply control lines G3(1) to G3(*n*) are driven as shown in FIG. 32 in the (k+1) th frame. They are driven as shown in FIG. 33 in the (k+2) th frame, and they are driven as shown in FIG. 34 in the (k+n)th frame. This also applies to the frames in which the TFT characteristic is detected. As grasped from FIGS. 32 to 34, the length of the selection period (period in which the scanning line G1 is in the active state) is made the same on every row, in each frame. That is, in the present embodiment, the length of the selection period is constant regardless of whether or not the row is the monitor row. Further, the monitor control line G2 corresponding to the non-monitor row is held in the non-active state, in each frame. The monitor control line G2 corresponding to the monitor row is put in the active state from the start point of the selection period until the point after the lapse of the one frame period. Moreover, the high-level power supply control line G3 corresponding to the non-monitor row is held in the active state, in each frame. The high-level power supply control line G3 corresponding to the monitor row is put in the non-active state from the start point of the selection period until the point after the lapse of the one frame period. In the present embodiment, the gate driver 40*a* is configured such that the n scanning lines G1(1) to G1(*n*), the n monitor control lines G2(1) to G2(*n*), and the n high-level power supply control lines G3(1) to G3(*n*) are driven as described above.

Moreover, in the present embodiment, similarly to the first modified example of the first embodiment, each of the offset memory and the gain memory is divided into the memory used for compensating for the degradation of the drive transistor and the memory used for compensating for the degradation of the organic EL element OLED. That is, this organic EL display device 5 is provided with the TFT offset memory 51*a*, the OLED offset memory 51*b*, the TFT gain memory 52*a* and the OLED gain memory 52*b* as the constitutional elements for storing correction data to be used for correcting the video signal transmitted from the outside.

<2.2 Configuration of Pixel Circuit and Monitor Circuit>

Figure 35:
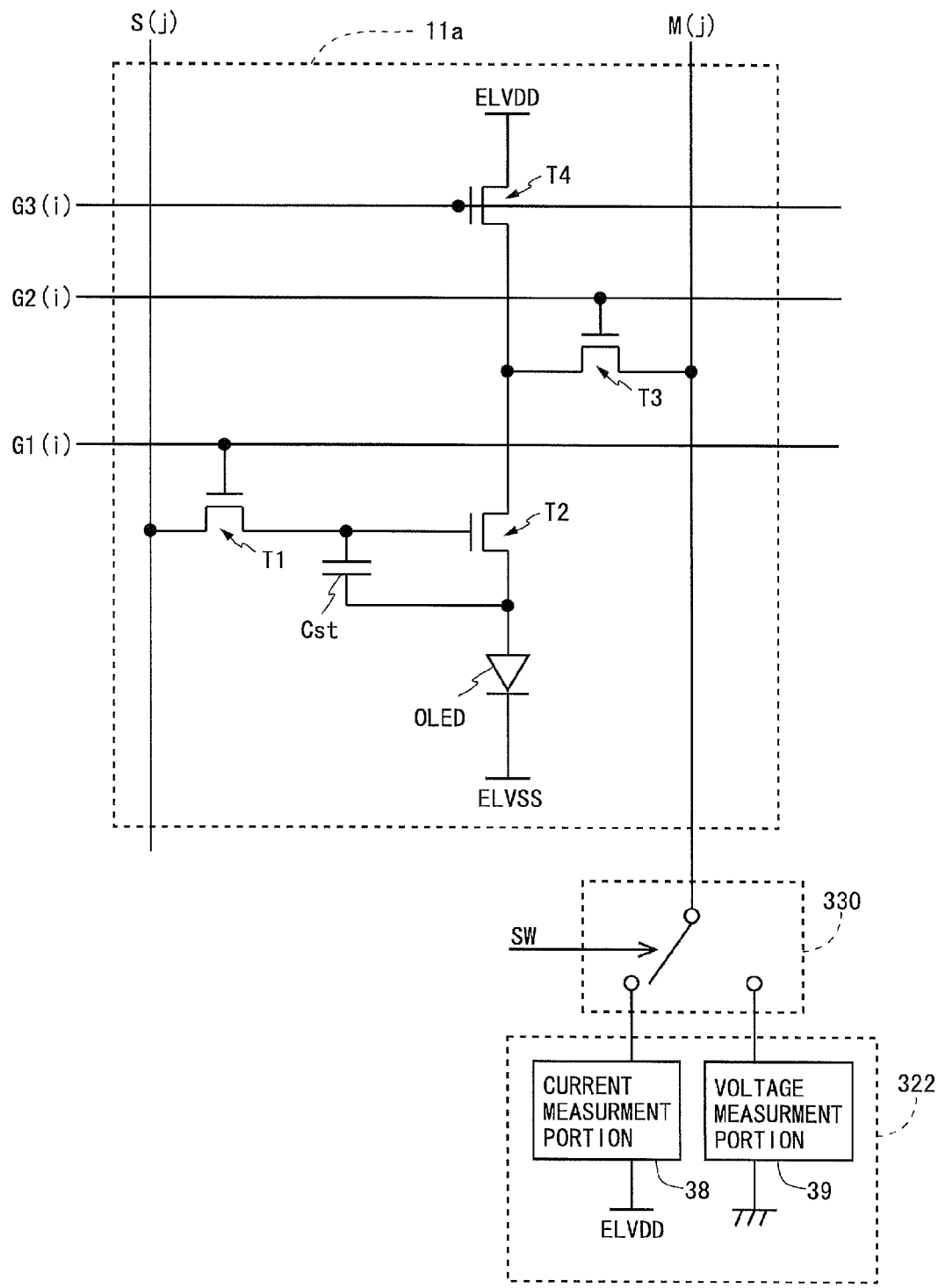
FIG. 35 is a diagram showing a configuration of a pixel circuit and a monitor circuit in the second embodiment.

FIG. 35 is a diagram showing configurations of a pixel circuit 11*a* and the monitor circuit 322 in the present embodiment. It is to be noted that the pixel circuit 11*a* shown in FIG. 35 is the pixel circuit 11 on the ith row and the jth column. The configuration of the monitor circuit 322 is similar to that in the first embodiment, and hence descriptions thereof will be omitted. However, in the present embodiment, the configuration is such that the high-level power supply voltage ELVDD is supplied to the monitor line M when the monitor line M is connected to the current measurement portion 38.

This pixel circuit 11*a* is provided with one organic EL element OLED, four transistors T1 to T4, and one capacitor Cst. The transistor T1 functions as an input transistor for selecting a pixel, the transistor T2 functions as a drive transistor for controlling supply of a current to the organic EL element OLED, the transistor T3 functions as a monitor control transistor for controlling whether or not to detect the TFT characteristic and the OLED characteristic, and the transistor T4 functions as a high-level power supply control transistor for controlling supply of the drive current from the high-level power supply line ELVDD.

The transistor T1 is provided between the data line S(j) and a gate terminal of the transistor T2. As for the transistor T1, a gate terminal is connected to the scanning line G1(*i*), and a source terminal is connected to the data line S). The transistor T2 is provided in series with the organic EL element OLED. As for the transistor T2, a gate terminal is connected to the drain terminal of the transistor T1, a drain terminal is connected to a source terminal of the transistor T4, and a source terminal is connected to an anode terminal of the organic EL element OLED. As for the transistor T3, a gate terminal is connected to the monitor control line G2(*i*), a drain terminal is connected to the drain terminal of the transistor T2, and a source terminal is connected to the monitor line M(j). The transistor T4 is provided in series with the organic EL element OLED. As for the transistor T4, a gate terminal is connected to the high-level power supply control line G3(*i*), a drain terminal is connected to the high-level power supply line ELVDD, and a source terminal is connected to the drain terminal of the transistor T2. As for the capacitor Cst, one end is connected to the gate terminal of the transistor T2, and the other end is connected to the source terminal of the transistor T2. A cathode terminal of the organic EL element OLED is connected to the low-level power supply line ELVSS. For example, an oxide TFT (thin film transistor using an oxide semiconductor for a channel layer) such as the IGZO-TFT is employed for each of the transistors T1 to T4. However, the present invention does not exclude the use of a transistor other than the oxide TFT.

<2.3 Drive Method>

Next, a driving method in the present embodiment will be described. As described above, in the present embodiment, either detection of the TFT characteristic for one row or detection of the OLED characteristic for one row is performed in each frame. In each frame, either an operation for detecting the TFT characteristic (hereinafter referred to as a "TFT characteristic detecting operation") or an operation for detecting the OLED characteristic (hereinafter referred to as an "OLED characteristic detecting operation") is performed on the monitor row, and a normal operation is performed on the non-monitor row. That is, when a frame in which detection of the OLED characteristic for the first row is performed is defined as a (k+1)th frame, an operation on each row is shifted as shown in FIG. 36. It is to be noted that the TFT characteristic detecting operation is not performed on any row from the (k+1)th frame to the (k+n)th frame. Further, the OLED characteristic detecting operation is not performed on any row from the (k+n+1)th frame to the (k+2n)th frame.

<2.3.1 Operation of Pixel Circuit>
<2.3.1.1 Normal Operation>

Figure 37:
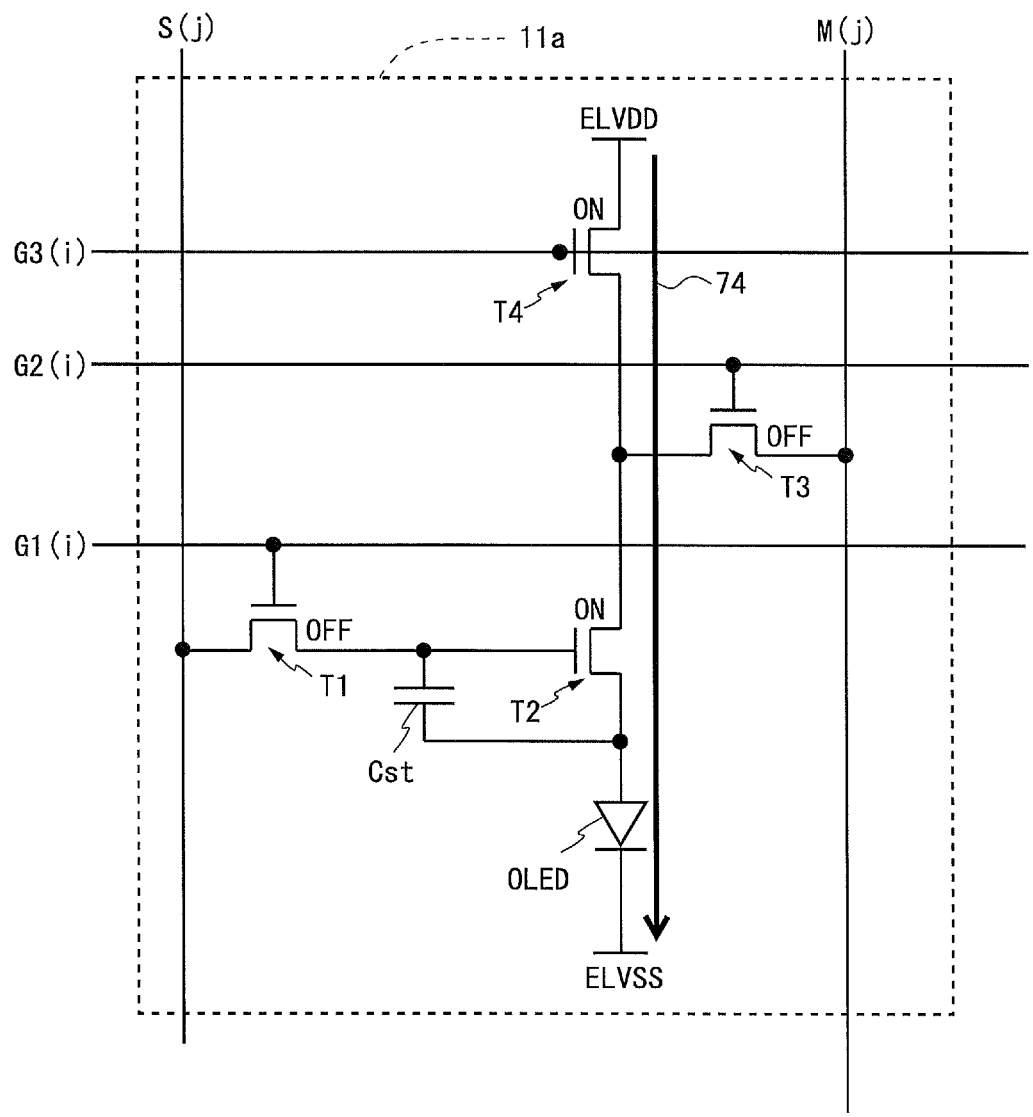
FIG. 37 is a diagram for explaining a flow of a current at the time of a normal operation being performed in the second embodiment.

In each frame, the normal operation is performed on the non-monitor row. In the pixel circuit 11a included in the non-monitor row, after writing based on a data voltage corresponding to a target luminance is performed in the selection period, the transistor T1 is held in the off-state. The transistor T2 comes into the on-state by the writing based on the data voltage. The transistor T3 is held in the off-state, and the transistor T4 is held in the on-state. Thus, a drive current is supplied to the organic EL element OLED via the transistor T4 and the transistor T2 as indicated by an arrow denoted by reference numeral 74 in FIG. 37. Thereby, the organic EL element OLED emits light with a luminance in accordance with the drive current.

<2.3.1.2 OLED Characteristic Detecting Operation>

Figure 38:
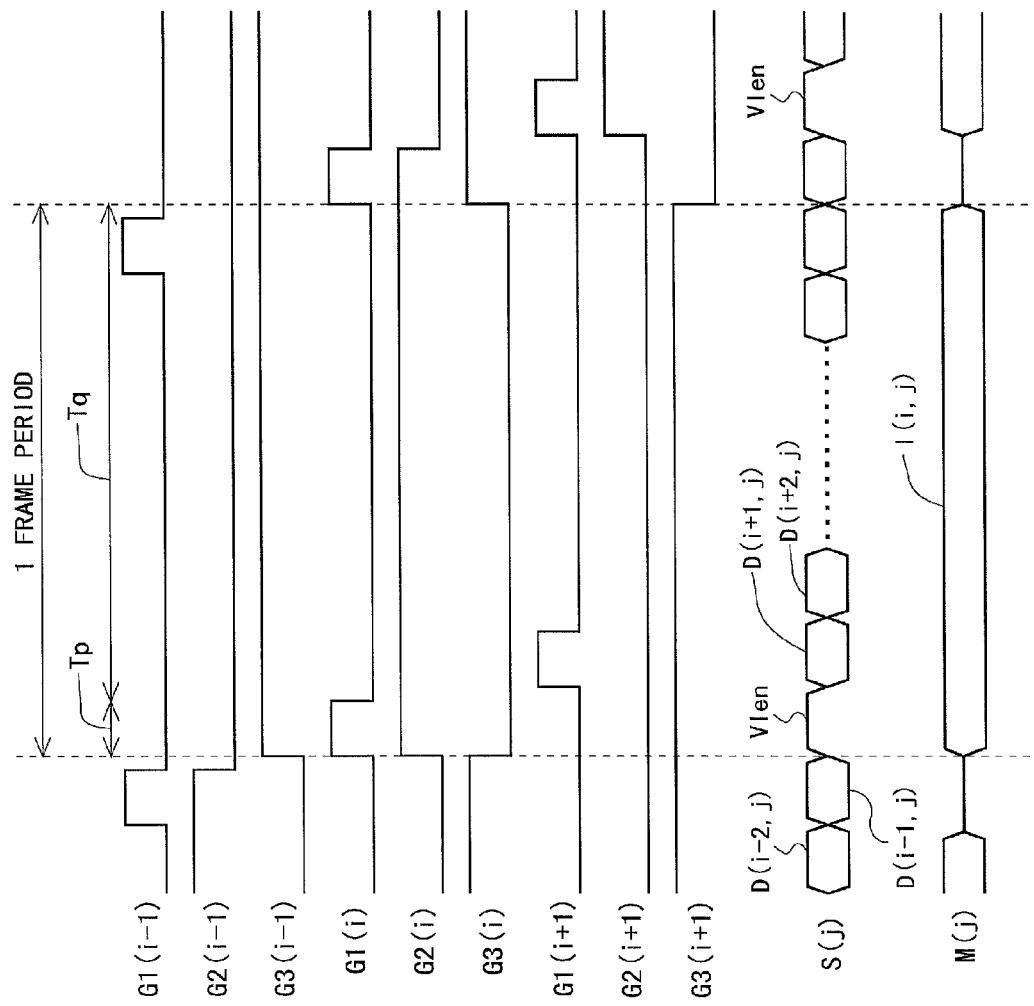
FIG. 38 is a timing chart for explaining an OLED characteristic detecting operation in a pixel circuit (a pixel circuit on the ith row and the jth column) included in a monitor row in the second embodiment.

Next, the OLED characteristic detecting operation will be described. FIG. 38 is a timing chart for explaining the OLED characteristic detecting operation in the pixel circuit 11a (assumed to be the pixel circuit 11a on the ith row and the jth column) included in the monitor row. It should be noted that FIG. 38 shows "one frame period", taking as a reference the start point of the selection period of the ith row in the frame in which the ith row is the monitor row. As shown in FIG. 38, one frame period includes a selection period Tp and a light emission period Tq.

In the selection period Tp, the scanning line G1(i) and the monitor control line G2(i) are put in the active state. This brings the transistor T1 and the transistor T3 into the on-state. Further, in the selection period Tp, the high-level power supply control line G3(i) is put in the non-active state. This brings the transistor T4 into the off-state. Further, a high voltage Vlen for making the transistor T2 perform a linear operation is applied to the data line S(j) in the selection period Tp. Thereby, writing based on the high voltage Vlen is performed, and the transistor T2 comes into the on-state.

Figure 39:
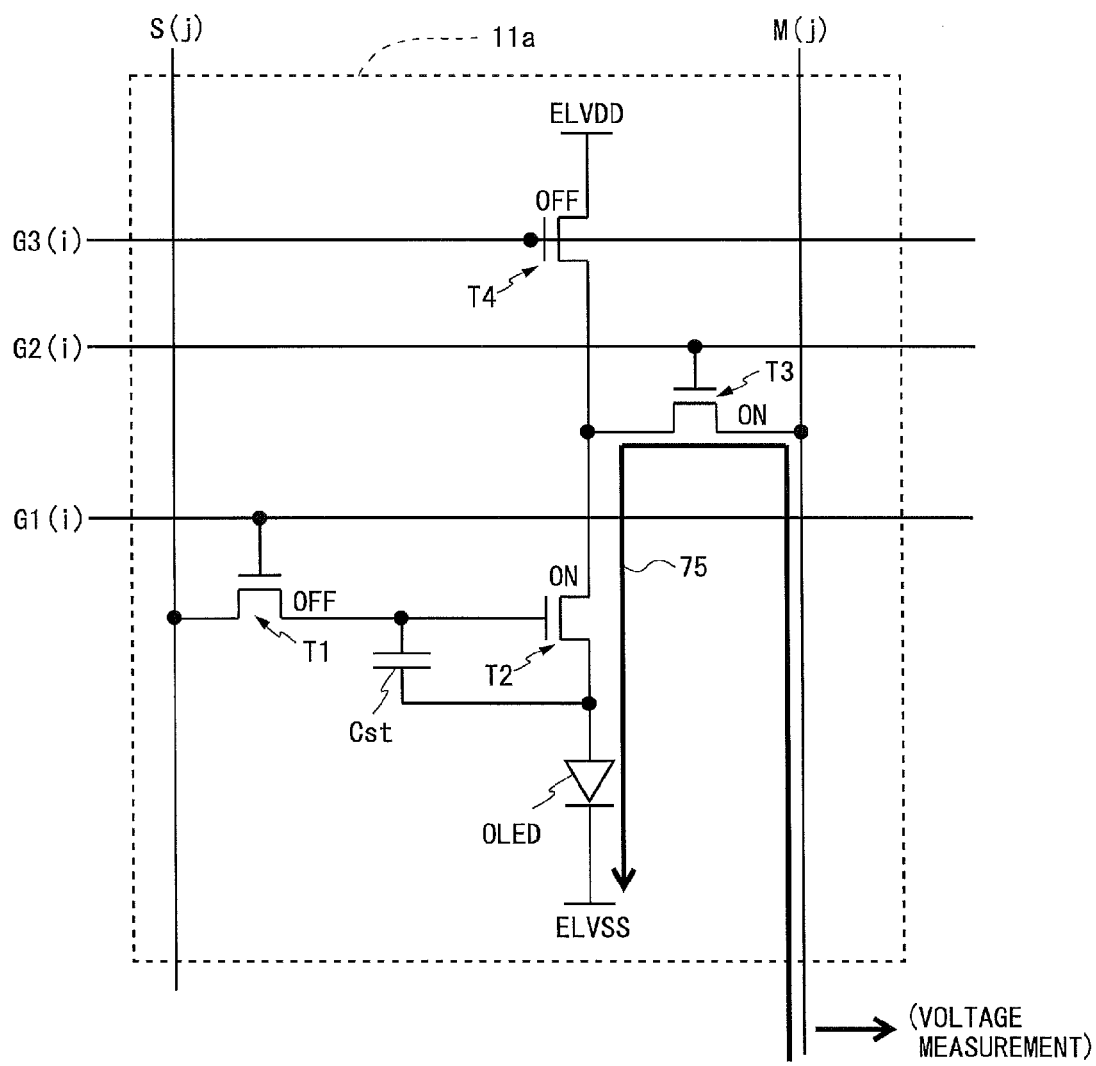
FIG. 39 is a diagram for explaining a flow of a current at the time of the OLED characteristic detecting operation being performed in the second embodiment.

At the light emission period Tq, the scanning line G1(i) is brought into the non-active state. This brings the transistor T1 into the off-state. Further, in the light emission period Tq, the monitor control line G2(i) is held in the active state, and the high-level power supply control line G3(i) is held in the non-active state. Accordingly, the transistor T3 is held in the on-state and the transistor T4 is held in the off-state. Further, since the writing based on the high voltage Vlen has been performed in the selection period Tp before the light emission period Tq, the transistor T2 is in the on-state. Moreover, in the period for detecting the OLED characteristic out of the light emission period Tq, the monitor line M(j) is connected to the voltage measurement portion 39, and the constant current is supplied to the monitor line M(j). Thereby, a data current as the constant current is supplied from the monitor line M(1) to the organic EL element OLED as indicated by an arrow denoted by reference numeral 75 in FIG. 39. In this state, a light emission voltage of the organic EL element OLED is measured by the voltage measurement portion 39. In such a manner as above, detection of the OLED characteristic is performed. It should be noted that, in order to make a display with a desired gradation, the processing of adjusting the length of the light emission time of the organic EL element OLED and the processing of changing a current value in accordance with a gradation are performed similarly to the first embodiment.

<2.3.1.3 TFT Characteristic Detecting Operation>

Figure 40:
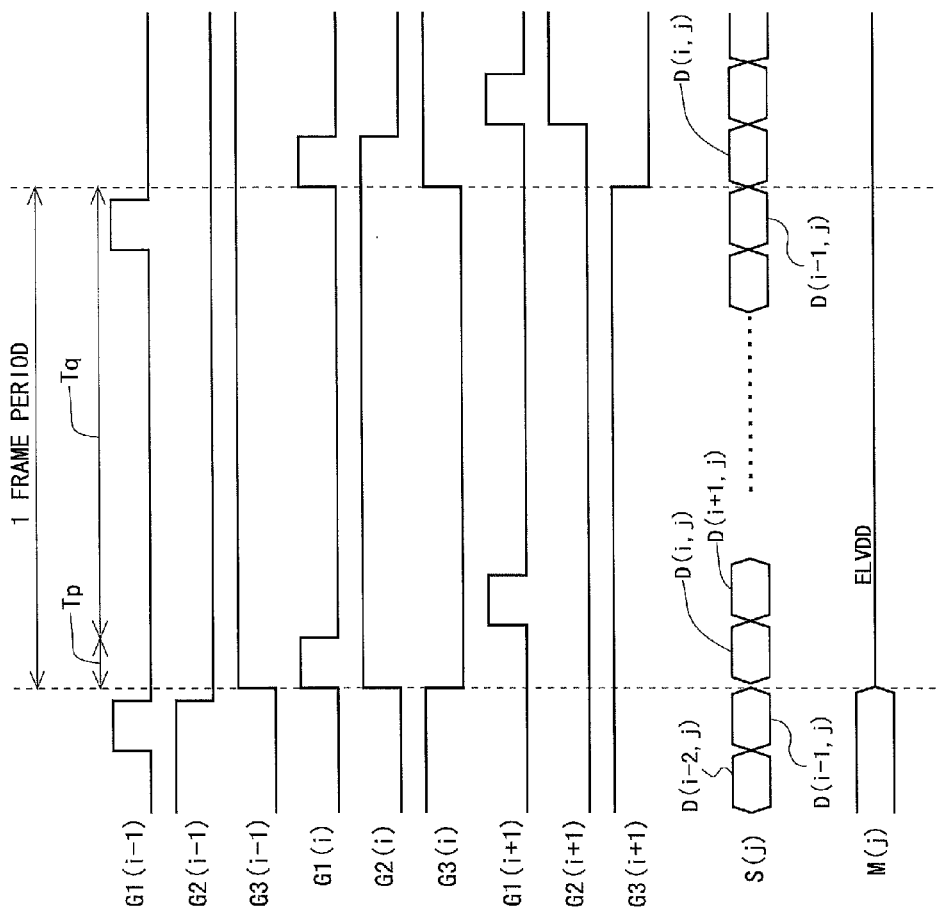
FIG. 40 is a timing chart for explaining a TFT characteristic detecting operation in a pixel circuit (a pixel circuit on the ith row and the jth column) included in the monitor row in the second embodiment.

Next, the TFT characteristic detecting operation will be described. FIG. 40 is a timing chart for explaining the TFT characteristic detecting operation in the pixel circuit 11a (assumed to be the pixel circuit 11a on the ith row and the jth column) included in the monitor row.

In the selection period Tp, the scanning line G1(i) and the monitor control line G2(i) are put in the active state. This brings the transistor T1 and the transistor T3 into the on-state. Further, in the selection period Tp, the high-level power supply control line G3(i) is put in the non-active state. This brings the transistor T4 into the off-state. Moreover, in the selection period Tp, a similar data voltage to that at the time of the normal operation is applied to the data line S(j). The transistor T2 comes into the on-state by the writing based on the data voltage.

Figure 41:
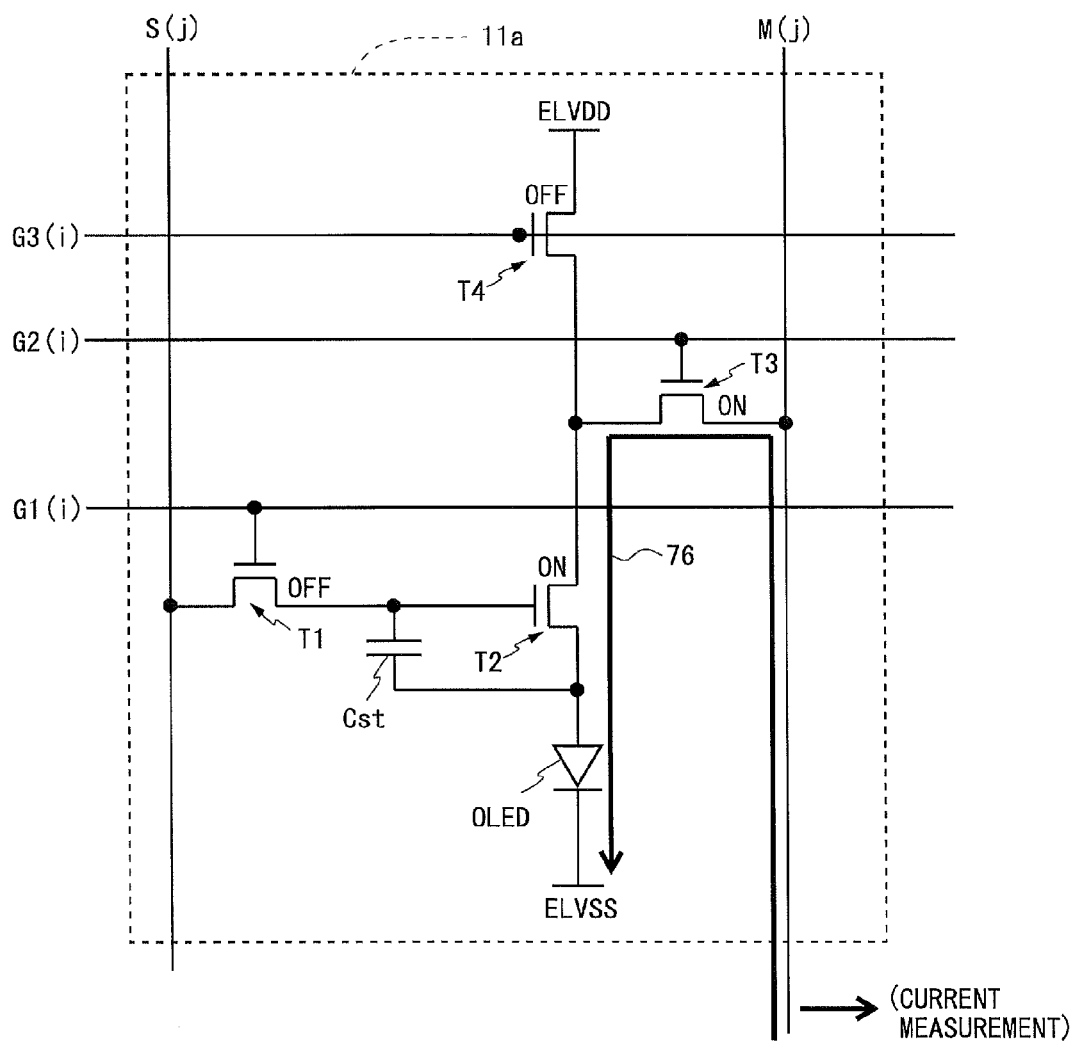
FIG. 41 is a diagram for explaining a flow of a current at the time of the TFT characteristic detecting operation being performed in the second embodiment.
Figure 44:
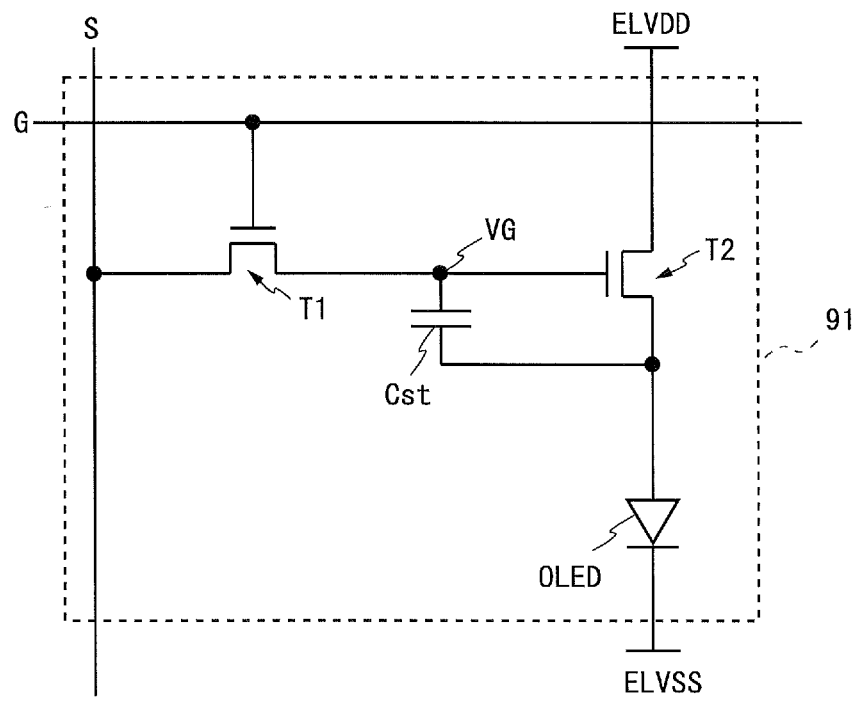
FIG. 44 is a circuit diagram showing a configuration of a conventional general pixel circuit.
Figure 45:
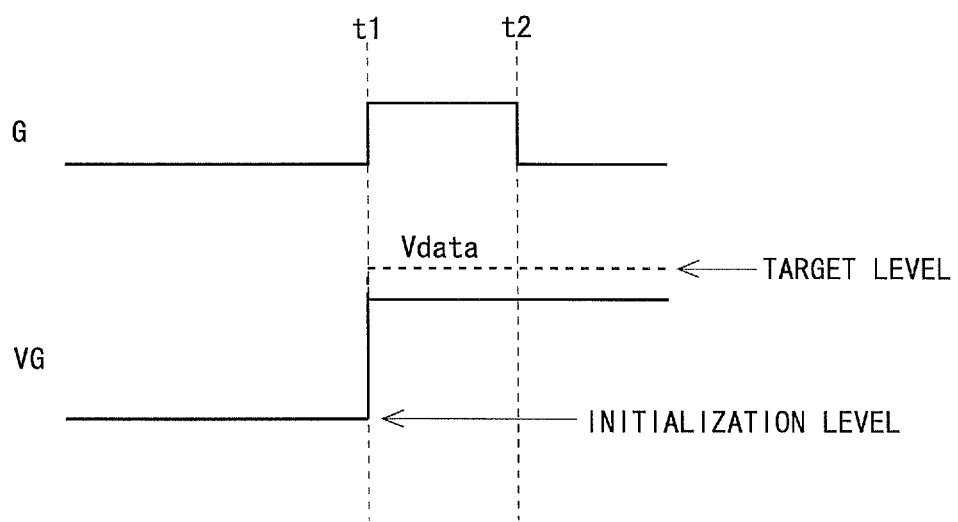
FIG. 45 is a timing chart for explaining an operation of the pixel circuit shown in FIG. 44.
Figure 46:
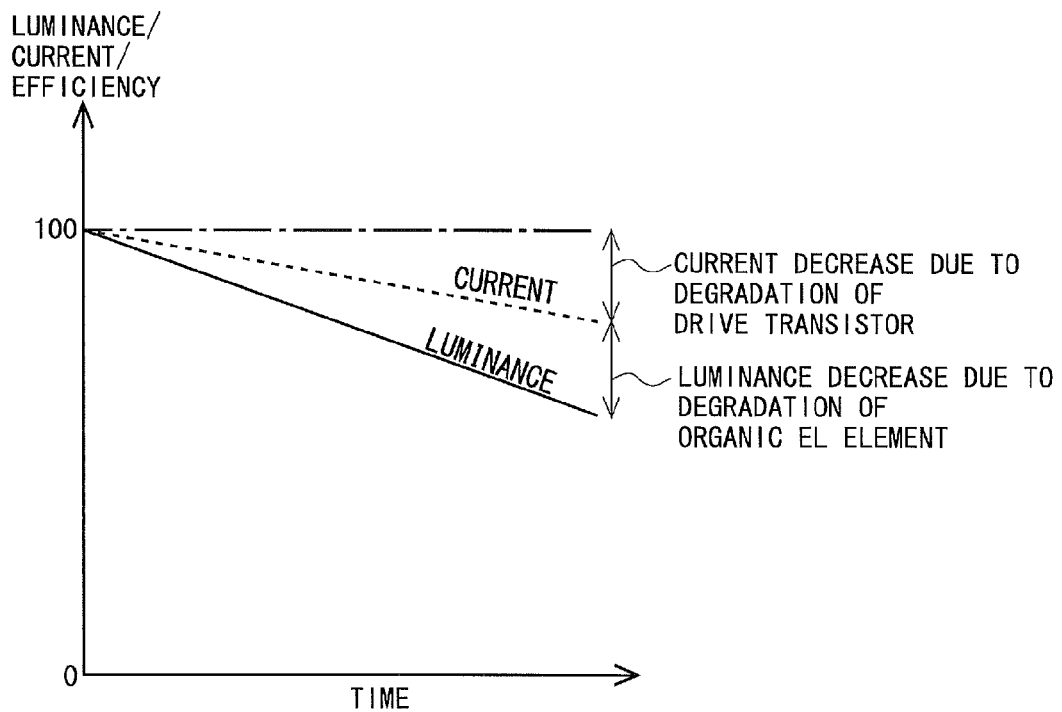
FIG. 46 is a diagram for explaining a case where no compensation is performed on degradation of the drive transistor and degradation of the organic EL element.
Figure 47:
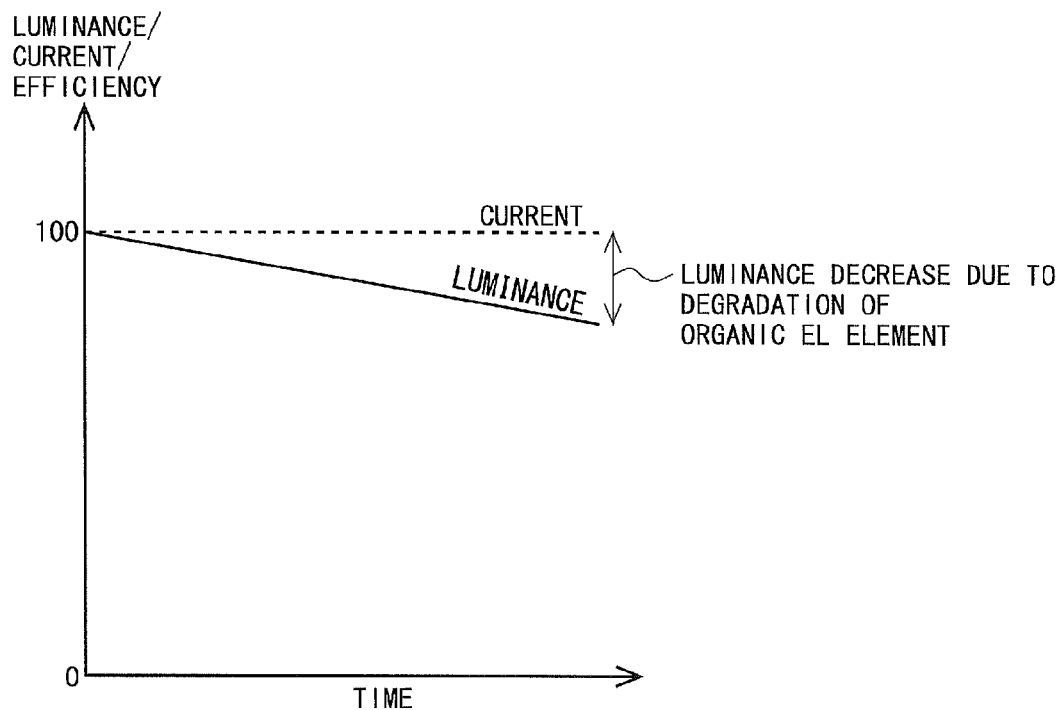
FIG. 47 is a diagram for explaining a case where compensation is performed only on the degradation of the drive transistor.

At the light emission period Tq, the scanning line G1(i) is brought into the non-active state. This brings the transistor T1 into the off-state. Further, in the light emission period Tq, the monitor control line G2(i) is held in the active state, and the high-level power supply control line G3(i) is held in the non-active state. Accordingly, the transistor T3 is held in the on-state and the transistor T4 is held in the off-state. Further, since the writing based on the data voltage has been performed in the selection period Tp before the light emission period Tq, the transistor T2 is in the on-state. Moreover, in the light emission period Tq, the monitor line M(j) is connected to the current measurement portion 38 by the switching control signal SW. Since a potential of the monitor line M(j) is equal to a potential of the high-level power supply line ELVDD at this time, a drive current in accordance with the data voltage is supplied from the monitor line M(j) to the organic EL element OLED as indicated by an arrow denoted by reference numeral 76 in FIG. 41. At that time, the current supplied from the monitor line M(j) to the organic EL element OLED is measured by the current measurement portion 38. In such a manner as above, detection of the TFT characteristic is performed.

<2.3.2 Updating of Offset Memory and Gain Memory>

Next, updating of the offset memory and the gain memory in the present embodiment will be described. FIG. 42 is a flowchart for explaining a procedure for updating the TFT offset memory 51a, the OLED offset memory 51b, the TFT gain memory 52a and the OLED gain memory 52b. It is to be noted that here, attention is focused on an offset value and a gain value each corresponding to one pixel. Incidentally, as grasped from FIG. 36, when attention is focused on any one pixel, detection of the TFT characteristic is performed after n frames from the frame in which detection of the OLED characteristic has been performed, in the present embodiment. Then, it is assumed here that detection of the OLED characteristic is performed on the Kth frame and detection of the TFT characteristic is performed in the (K+n) th frame.

First, in the Kth frame, the OLED characteristic is detected in the light emission period Tq (step S410). By this step S410, a degradation correction coefficient and an offset value for correcting the video signal are obtained. Then, the offset value obtained in step S410 is stored as a new offset value into the OLED offset memory 51b (step S420). Further, the degradation correction coefficient obtained in step S410 is stored as a new degradation correction coefficient into the OLED gain memory 52b (step S430). Thereafter, in the (K+n) th frame, the TFT characteristic is detected in the light emission period Tq (step S440). By this step S440, a gain value and an offset value for correcting the video signal are obtained. Then, the offset value obtained in step S440 is stored as a new offset value into the TFT offset memory 51a (step S450). Further, the gain value obtained in step S440 is stored as a new gain value into the TFT gain memory 52a (step S460).

In such a manner as above, the offset value and the gain value each corresponding to one pixel are updated. In the present embodiment, either detection of the OLED characteristic for one row or detection of the TFT characteristic for one row is performed in each frame. Therefore, m offset values in the OLED offset memory 51b and m degradation correction coefficients in the OLED gain memory 52b are updated in each one frame at the frames in which detection of the OLED characteristic is performed, and m offset values in the TFT offset memory 51a and m gain values in the TFT gain memory 52a are updated in each one frame at the frames in which detection of the TFT characteristic is performed.

<2.3.3 Correction of Video Signal>

As for correction of the video signal transmitted from the outside, the gain value B that is given to the multiplication portion 212 shown in FIG. 19 and the offset value Vt that is given to the addition portion 213 shown in FIG. 19 are different from those in the first embodiment. In the present embodiment, the product of a value read from the TFT gain memory 52a and a value read from the OLED gain memory 52b is given as the gain value B to the multiplication portion 212, and the sum of a value read from the TFT offset memory 51a and a value read from the OLED offset memory 51b is given as the offset value Vt to the addition portion 213. On such a premise, the gradation P indicated by the video signal is corrected to "Vc·B+Vt". It is to be noted that Vc is a value of the control voltage after gamma correction on the gradation P.

<2.4 Effect>

According to the present embodiment, at each pixel, detection of the OLED characteristic and detection of the TFT characteristic are alternately performed with respect to each n frames (n is the number of rows constituting the pixel matrix). Then, similarly to the first embodiment, the video signal transmitted from the outside is corrected by use of correction data (offset value and gain value) obtained in consideration of both a detection result of the OLED characteristic and a detection result of the TFT characteristic. Therefore, at the time of making the organic EL element OLED in each pixel circuit 11a emit light, a drive current with such magnitude as to compensate for both the degradation of the drive transistor and the degradation of the organic EL element OLED is supplied to the organic EL element OLED. Here, in the present embodiment, both detection of the OLED characteristic and detection of the TFT characteristic are performed during the light emission period. Therefore, differently from the configuration where detection of the characteristics is performed during the selection period, the selection period of the monitor row is not required to be made long. This ensures the light emission period with a sufficient length. Further, variations in length of the selection period depending on the row are prevented from occurring. As described above, according to the present embodiment, it is possible to simultaneously compensate for both the degradation of the drive transistor and the degradation of the organic EL element OLED without causing special light emission at the time of detecting characteristics, while sufficiently ensuring the light emission period without occurrence of variations in length of the selection period, in the organic EL display device.

<2.5 Modified Example>

In the second embodiment, first, detection of the OLED characteristics for the first to nth rows is performed sequentially one frame by one frame, and thereafter, detection of the TFT characteristics for the first to nth rows is performed sequentially one frame by one frame, as shown in FIG. 36. However, the present invention is not restricted to this. The configuration may be such that detection of the OLED characteristic for the first row and detection of the TFT characteristic for the first row each is performed one frame by one frame in two consecutive frames, and a similar operation is repeated for the second to nth rows, as shown in FIG. 43.

According to the present modified example, detection of the OLED characteristic and detection of the TFT characteristic are performed for each pixel in two consecutive frame periods, and hence it is possible to employ a configuration where the offset memory and the gain memory are updated by use of the buffers (offset value buffer and gain value buffer) as in the first embodiment. That is, although the TFT offset memory 51a, the OLED offset memory 51b, the TFT gain memory 52a, and the OLED gain memory 52b are provided for storing correction data to be used for correcting the video signal in the second embodiment, one offset memory and one gain memory may be provided in place of those memories in the present modified example.

3. Others

The organic EL display device, to which the present invention is applicable, is not restricted to one provided with the pixel circuit 11 or 11a illustrated in each of the embodiments and each of the modified examples. The pixel circuit may have a configuration other than the configuration illustrated in each of the embodiments and each of the modified examples, so long as being provided with the electro-optic element (organic EL element OLED) that is controlled by a current, the transistors T1 to T3, and the capacitor Cst.

DESCRIPTION OF REFERENCE CHARACTERS 1 to 5: ORGANIC EL DISPLAY DEVICE
10, 10a: DISPLAY PORTION
11, 11a: PIXEL CIRCUIT
20: CONTROL CIRCUIT
30: SOURCE DRIVER
31: DRIVE SIGNAL GENERATION CIRCUIT
32: SIGNAL CONVERSION CIRCUIT
33: OUTPUT PORTION
38: CURRENT MEASUREMENT PORTION
39: VOLTAGE MEASUREMENT PORTION
40, 40a: GATE DRIVER
51: OFFSET MEMORY
51a: TFT OFFSET MEMORY
51b: OLED OFFSET MEMORY
52: GAIN MEMORY
52a: TFT GAIN MEMORY
52b: OLED GAIN MEMORY
60: TEMPERATURE SENSOR
201: MONITOR ROW STORAGE PORTION
202: TEMPERATURE CHANGE COMPENSATION PORTION
321: GRADATION SIGNAL GENERATION CIRCUIT
322, 323: MONITOR CIRCUIT
330: OUTPUT CIRCUIT
T1 to T4: TRANSISTOR
Cst: CAPACITOR
G1(1) to G1($n$): SCANNING LINE
G2(1) to G2($n$): MONITOR CONTROL LINE
G3(1) to G3($n$): HIGH-LEVEL POWER SUPPLY CONTROL LINE
S(1) to S($m$): DATA LINE
M(1) to M(m): MONITOR LINE

The invention claimed is:

1. A method for driving a display device having an n-row×m-column, n and m being integers not smaller than 2, pixel matrix including n×m pixel circuits, each including an electro-optic element whose luminance is controllable by a current and a drive transistor configured to control a current to be supplied to the electro-optic element, the method comprising:
   detecting a characteristic of the drive transistor;
   detecting a characteristic of the electro-optic element;
   storing, into a previously prepared correction data storage portion, first characteristic data, obtained based on a result of the detecting of the characteristic of the drive transistor and second characteristic data, obtained based on a result of the detecting of the characteristic of the electro-optic element, as correction data for correcting a video signal; and
   correcting the video signal based on the first and second correction data stored in the correction data storage portion, to generate a data signal to be supplied to the n×m pixel circuits, wherein one frame period includes a selection period in which light emission of the electro-optic element is prepared and a light emission period in which light emission of the electro-optic element is performed,
   pieces of processing of both the detecting of the characteristic of the drive transistor and detecting of the characteristic of the electro-optic element are performed only on one row of the pixel matrix in each one frame period,
   a row on which the pieces of processing of both the detecting of the characteristic of the drive transistor and detecting of the characteristic of the electro-optic element are performed in each frame is defined as a monitor row and a row other than the monitor row is defined as a non-monitor row, a length of the selection period of the monitor row being relatively longer than a length of the selection period of the non-monitor row, and
   the processing of the detecting of the characteristic of the drive transistor is performed in the selection period.

2. The driving method according to claim 1, wherein in the detecting of the characteristic of the electro-optic element, a voltage of a positive electrode of the electro-optic element is measured in a state of a constant current being given to the electro-optic element, to detect the characteristic of the electro-optic element, and
   in the detecting of the characteristic of the electro-optic element, a length of the time for giving the constant current to the electro-optic element is adjusted in accordance with a target luminance.

3. The driving method according to claim 1, wherein in the detecting of the characteristic of the electro-optic element, a voltage of a positive electrode of the electro-optic element is measured in a state of a constant current being given to the electro-optic element, to detect the characteristic of the electro-optic element, and
   in the detecting of the characteristic of the electro-optic element, the constant current at a plurality of levels are given to the electro-optic element within a range where an integrated value of a light emission current in one frame period becomes a value corresponding to a target gradation, to detect a plurality of characteristics as the characteristics of the electro-optic element.

4. The driving method according to claim 1, wherein in the detecting of the characteristic of the electro-optic element, a current flowing in the electro-optic element is measured in a state of a constant voltage being given to the electro-optic element, to detect the characteristic of the electro-optic element, and
   in the detecting of the characteristic of the electro-optic element, a length of the time for giving the constant voltage to the electro-optic element is adjusted in accordance with a target luminance.

5. The driving method according to claim 1, wherein in the detecting of the characteristic of the electro-optic element, a current flowing in the electro-optic element is measured in a state of a constant voltage being given to the electro-optic element, to detect the characteristic of the electro-optic element, and
   in the detecting of the characteristic of the electro-optic element, the constant voltage at a plurality of levels are given to the electro-optic element within a range where an integrated value of a light emission current in one frame period becomes a value corresponding to a target gradation, to detect a plurality of characteristics as the characteristics of the electro-optic element.

6. The driving method according to claim 1, wherein in the detecting of the characteristic of the drive transistor, a current flowing between a drain and a source of the drive transistor is measured in a state of setting a gate-source voltage of the drive transistor to determined magnitude, to detect the characteristic of the drive transistor.

7. The driving method according to claim 1, wherein
   the display device further includes
      a characteristic detection portion, including at least a current measurement portion configured to measure a current, to detect the characteristic of the drive transistor and the characteristic of the electro-optic element, and
      m monitor lines, provided to correspond to respective columns of the pixel matrix and configured to be made electrically connectable with the characteristic detection portion and the pixel circuits on the corresponding column, and
   in the detecting of the characteristic of the drive transistor, a current flowing between a drain and a source of the drive transistor is measured by the current measurement portion in a state of setting a gate-source voltage of the drive transistor to determined magnitude, in a state where the m monitor lines are electrically connected to the corresponding pixel circuits and the current measurement portion.

8. The driving method according to claim 1, wherein the processing of the detecting of the characteristic of the electro-optic element is not performed for a pixel at which a black display is performed out of the n-row×m-column pixel matrix.

9. The driving method according to claim 1, further comprising:
   detecting a temperature; and
   correcting the first and second characteristic data based on the detected temperature, wherein,
   in the storing, corrected first and second data, obtained by the correcting of the first and second data based on the detected temperature, is stored as the first and second correction data into the correction data storage portion.

10. A display device configured to perform the driving method according to claim 1.

11. A method for driving a display device having an n-row×m-column, n and m being integers not smaller than 2, pixel matrix including n×m pixel circuits, each including an electro-optic element whose luminance is controllable by a current and a drive transistor configured to control a current to be supplied to the electro-optic element, the method comprising:
  detecting a characteristic of the drive transistor;
  detecting a characteristic of the electro-optic element;
  storing, into a previously prepared correction data storage portion, first characteristic data, obtained based on a result of the detecting of the characteristic of the drive transistor and second characteristic data, obtained based on a result of the detecting of the characteristic of the electro-optic element, as correction data for correcting a video signal; and
  correcting the video signal based on the first and second correction data stored in the correction data storage portion, to generate a data signal to be supplied to the n×m pixel circuits,
  wherein
  one frame period includes a selection period in which light emission of the electro-optic element is prepared and a light emission period in which light emission of the electro-optic element is performed,
  pieces of processing of one or both of the detecting of the characteristic of the drive transistor and detecting of the characteristic of the electro-optic element are performed only on one row of the pixel matrix in each one frame period,
  the processing of the detecting of the characteristic of the electro-optic element is performed in the light emission period,
  with regard to the one row of the pixel matrix of the respective frame period, the processing of the detecting of the characteristic of the drive transistor and detecting of the characteristic of the electro-optic element are alternately performed, and
  the processing of the detecting of the characteristic of the drive transistor is performed in the light emission period.

12. The driving method according to claim 11, wherein in the detecting of the characteristic of the electro-optic element, a voltage of a positive electrode of the electro-optic element is measured in a state of a constant current being given to the electro-optic element, to detect the characteristic of the electro-optic element, and
  in the detecting of the characteristic of the electro-optic element, a length of the time for giving the constant current to the electro-optic element is adjusted in accordance with a target luminance.

13. The driving method according to claim 11, wherein in the detecting of the characteristic of the electro-optic element, a current flowing in the electro-optic element is measured in a state of a constant voltage being given to the electro-optic element, to detect the characteristic of the electro-optic element, and
  in the detecting of the characteristic of the electro-optic element, a length of the time for giving the constant voltage to the electro-optic element is adjusted in accordance with a target luminance.

14. The driving method according to claim 11, wherein in the detecting of the characteristic of the drive transistor, a current flowing between a drain and a source of the drive transistor is measured in a state of setting a gate-source voltage of the drive transistor to determined magnitude, to detect the characteristic of the drive transistor.

15. The driving method according to claim 11, wherein the display device further includes
  a characteristic detection portion, including at least a current measurement portion configured to measure a current, to detect the characteristic of the drive transistor and the characteristic of the electro-optic element, and
  m monitor lines, provided to correspond to respective columns of the pixel matrix and configured to be made electrically connectable with the characteristic detection portion and the pixel circuits on the corresponding column, and
  in the detecting of the characteristic of the drive transistor, a current flowing between a drain and a source of the drive transistor is measured by the current measurement portion in a state of setting a gate-source voltage of the drive transistor to predetermined magnitude, in a state where the m monitor lines are electrically connected to the corresponding pixel circuits and the current measurement portion.

16. The driving method according to claim 11, wherein the processing of the detecting of the characteristic of the electro-optic element is not performed as to a pixel at which a black display is performed out of the n-row×m-column pixel matrix.

17. The driving method according to claim 11, further comprising:
  detecting a temperature; and
  correcting the first and second characteristic data based on the detected temperature, wherein,
  in the storing, corrected first and second data, obtained by the correcting of the first and second characteristic data based on the detected temperature, is stored as the first and second correction data into the correction data storage portion.

18. A display device, configured to perform the driving method according to claim 11.

19. A method for driving a display device having an n-row×m-column, n and m being integers not smaller than 2, pixel matrix including n×m pixel circuits, each including an electro-optic element whose luminance is controllable by a current and a drive transistor configured to control a current to be supplied to the electro-optic element, the method comprising:
  detecting a characteristic of the drive transistor;
  detecting a characteristic of the electro-optic element;
  storing, into a previously prepared correction data storage portion, first characteristic data, obtained based on a result of the detecting of the characteristic of the drive transistor and second characteristic data, obtained based on a result of the detecting of the characteristic of the electro-optic element, as correction data for correcting a video signal; and
  correcting the video signal based on the first and second correction data stored in the correction data storage portion, to generate a data signal to be supplied to the n×m pixel circuits,
  wherein
  one frame period includes a selection period in which light emission of the electro-optic element is prepared and a light emission period in which light emission of the electro-optic element is performed,
  pieces of processing of one or both of the detecting of the characteristic of the drive transistor and detecting of the characteristic of the electro-optic element are performed only on one row of the pixel matrix in each one frame period,
  the processing of the detecting of the characteristic of the electro-optic element is performed in the light emission period, the correction data storage portion includes
an offset value storage portion configured to store an offset value as at least one of the first and second correction data, and
a gain value storage portion configured to store a gain value as at least one of the first and second correction data,
the storing includes,
the sum of an offset value obtained based on the detection result in the detecting of the characteristic of the drive transistor and an offset value obtained based on the detection result in the detecting of the characteristic of the electro-optic element is stored as a new offset value into the offset value storage portion, and
the product of a gain value obtained based on the detection result in the detecting of the characteristic of the drive transistor and a correction coefficient obtained based on the detection result in the detecting of the characteristic of the electro-optic element is stored as a new gain value into the gain value storage portion,
the display device further includes
a characteristic detection portion configured to detect the characteristic of the drive transistor and the characteristic of the electro-optic element, and
m monitor lines, provided to correspond to respective columns of the pixel matrix and configured to be made electrically connectable with the characteristic detection portion and the pixel circuits on the corresponding column,
the selection period includes a first period in which the processing of the detecting of the characteristic of the drive transistor is performed and a second period subsequent to the first period, and
wherein a value of a difference between the offset value stored in the offset value storage portion and the offset value obtained based on the detection result in the detecting of the characteristic of the drive transistor is defined as a first value and a value obtained based on the gain value stored in the gain value storage portion and the gain value obtained based on the detection result in the detecting of the characteristic of the drive transistor is defined as a second value, a voltage corresponding to the sum of the first value and the second value is applied to each monitor line in the second period.

20. The driving method according to claim 19, wherein in the detecting of the characteristic of the electro-optic element, a voltage of a positive electrode of the electro-optic element is measured in a state of a constant current being given to the electro-optic element, to detect the characteristic of the electro-optic element.

21. The driving method according to claim 19, wherein in the detecting of the characteristic of the electro-optic element, a current flowing in the electro-optic element is measured in a state of a constant voltage being given to the electro-optic element, to detect the characteristic of the electro-optic element.

22. The driving method according to claim 19, wherein in the detecting of the characteristic of the drive transistor, a current flowing between a drain and a source of the drive transistor is measured in a state of setting a gate-source voltage of the drive transistor to determined magnitude, to detect the characteristic of the drive transistor.

23. The driving method according to claim 19, wherein the display device further includes
a characteristic detection portion, including at least a current measurement portion configured to measure a current and detect the characteristic of the drive transistor and the characteristic of the electro-optic element, and
m monitor lines, provided to correspond to respective columns of the pixel matrix and configured to be made electrically connectable with the characteristic detection portion and the pixel circuits on the corresponding column, and
in the detecting of the characteristic of the drive transistor, a current flowing between a drain and a source of the drive transistor is measured by the current measurement portion in a state of setting a gate-source voltage of the drive transistor to determined magnitude, in a state where the m monitor lines are electrically connected to the corresponding pixel circuits and the current measurement portion.

24. The driving method according to claim 19, further comprising:
detecting a temperature; and
correcting the first and second characteristic data based on the detected temperature, wherein,
in the storing, corrected first and second data, obtained by the correcting of the first and second characteristic data based on the detected temperature, is stored as the first and second correction data into the correction data storage portion.

25. The driving method according to claim 19, wherein the drive transistor is a thin-film transistor with a channel layer formed of an oxide semiconductor.

26. A display device, configured to perform the driving method according to claim 19 is employed.

* * * * *